(12) United States Patent
Estes

(10) Patent No.: US 9,312,724 B2
(45) Date of Patent: Apr. 12, 2016

(54) SOLAR POWER GENERATION, DISTRIBUTION, AND COMMUNICATION SYSTEM

(71) Applicant: Christopher A. Estes, Mountain View, CA (US)

(72) Inventor: Christopher A. Estes, Mountain View, CA (US)

(73) Assignee: SunCulture Solar Inc., Mountain View, CA (US)

(*) Notice: Subject to any disclaimer, the term of this patent is extended or adjusted under 35 U.S.C. 154(b) by 0 days.

(21) Appl. No.: 14/484,488

(22) Filed: Sep. 12, 2014

(65) Prior Publication Data

US 2015/0001945 A1    Jan. 1, 2015

Related U.S. Application Data

(63) Continuation-in-part of application No. 14/264,891, filed on Apr. 29, 2014, and a continuation-in-part of application No. PCT/US2014/028723, filed on Mar. 14, 2014, and a continuation-in-part of application No. 13/843,573, filed on Mar. 15, 2013.

(60) Provisional application No. 61/946,338, filed on Feb. 28, 2014, provisional application No. 61/719,140, filed on Oct. 26, 2012.

(51) Int. Cl.
| | | |
|---|---|---|
| H02J 7/35 | (2006.01) | |
| H02J 9/06 | (2006.01) | |
| H02S 40/32 | (2014.01) | |
| H02S 40/36 | (2014.01) | |
| H02J 13/00 | (2006.01) | |

(52) U.S. Cl.
CPC . *H02J 7/35* (2013.01); *H02J 9/062* (2013.01); *H02S 40/32* (2014.12); *H02S 40/36* (2014.12); *H02J 13/0075* (2013.01); *H02J 13/0079* (2013.01); *Y10T 307/625* (2015.04)

(58) Field of Classification Search
CPC .................................................. Y04S 10/123
USPC ............................................................ 307/43
See application file for complete search history.

(56) References Cited

U.S. PATENT DOCUMENTS

2008/0084117 A1*  4/2008  Sander et al. ............... 307/46
2013/0241485 A1*  9/2013  Snyder ....................... 320/109

* cited by examiner

*Primary Examiner* — Robert Deberadinis
(74) *Attorney, Agent, or Firm* — Wood, Herron & Evans, LLP

(57) ABSTRACT

A solar panel is disclosed that can be daisy-chained with other solar panels. The solar panel automatically generates output alternative current (AC) power that is in parallel with input AC power coming into the solar panel when the solar panel senses the input AC power so that the solar panel operates as a slave in this state. The solar panel automatically generates standalone AC output power when the solar panel fails to detect input AC power coming into the solar panel where the solar panel operates as a master in this state. The solar panel generates the standalone output AC power without any reliance on input AC power generated by a utility grid and/or other AC power sources external to the solar panel.

19 Claims, 24 Drawing Sheets

SOLAR POWER GENERATION, DISTRIBUTION, AND COMMUNICATION SYSTEM

CROSS-REFERENCE TO RELATED APPLICATIONS

The present application is a continuation-in-part ("C-I-P") of and claims the benefits of U.S. patent application Ser. No. 14/264,891, filed Apr. 29, 2014, which was a C-I-P of and claimed the benefits of International Application No. PCT/US14/28723, filed Mar. 14, 2014, which claimed the benefits of U.S. patent application Ser. No. 13/843,573, filed Mar. 15, 2013, which claimed the benefits of U.S. Patent Application No. 61/719,140, filed Oct. 26, 2012. The present application is also a C-I-P of and claims the benefits of International Application No. PCT/US14/28723. The present application is also a C-I-P of and claims the benefits of U.S. patent application Ser. No. 13/843,573. The present application also claims priority to and the benefits of U.S. Patent Application No. 61/946,338, filed Feb. 28, 2014, and U.S. Patent Application No. 61/719,140.

BACKGROUND

1. Field of Disclosure

The present disclosure relates generally to solar power energy generation, delivery, allocation and communication devices and to related computer software.

2. Related Art

Conventional solar panel systems have evolved from dependency on the collective conversion of solar energy to direct current ("DC") power to reliance on other power sources when conditions limit the collection of solar energy required to adequately support the conventional systems. For example, conventional solar panel may now provide alternative current ("AC") power when conditions warrant from a connection to an electric utility grid. Conventional solar panel systems that are grid tied use the AC power provided by the utility grid to power when conditions limit the collection of solar energy. Thus, modern conventional solar panel systems are no longer exclusively dependent on the DC power collected from the conversion of solar energy to adequately sustain the power needed.

Conventional solar panel systems can also increase their output power by daisy chaining additional conventional solar panels together. Conventional daisy chaining of conventional solar panels increases the overall AC output power when connected to the grid and receiving the AC power from the grid. Conventional daisy chaining of conventional solar panels also increases the overall DC output power when the conventional system is isolated from the grid and not receiving the AC power from the grid. Each of the principle components of the conventional solar panel systems are separate entities and not included within a single housing. For example, a conventional solar panel system for a house will include conventional solar panels located on the roof of the house while the conventional battery system is located in the basement of the house, and the conventional inverter is located on the side of the house.

Conventional solar panel systems are limited to generating AC output power when the conventional system is connected to the grid and receiving the AC power generated by the grid. Conventional solar panel systems cannot generate AC power when isolated from the grid or cut off from the AC power generated by the grid. Conventional solar panel systems are limited to generating DC output power when isolated from the grid or cut off from the AC power generated by the grid. The DC output power is limited to DC power stored in batteries or DC power converted from solar energy. Further, the DC output power is inaccessible DC power in that the DC output power cannot be accessed from the conventional solar panel systems. For example, the conventional solar panel systems fail to include a DC output power outlet in which the DC output can be accessed.

BRIEF DESCRIPTION OF THE DRAWINGS/FIGURES

Embodiments of the present disclosure are described with reference to the accompanying drawings. In the drawings, like reference numerals indicate identical or functionally similar elements. Additionally, the left most digit(s) of a reference number typically identifies the drawing in which the reference number first appears.

Figure 1:
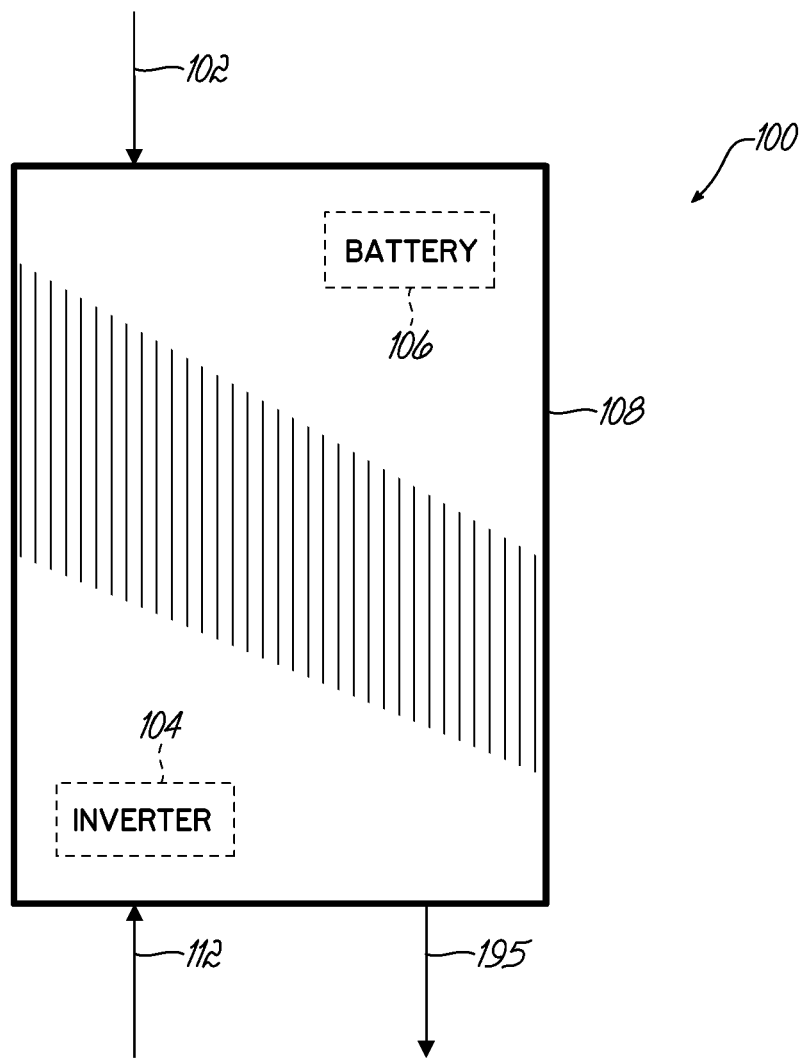
FIG. 1 is a top-elevational view of an exemplary solar panel according to an exemplary embodiment of the present disclosure.

The present disclosure will now be described with reference to the accompanying drawings. In the drawings, like reference numbers generally indicate identical, functionally similar, and/or structurally similar elements. The drawings in which an element first appears is indicated by the leftmost digit(s) in the reference number.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment," "an exemplary embodiment," an "example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic may be described in connection with an exemplary embodiment, it is within the knowledge of those skilled in the art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions supplied by a machine-readable medium, which may be read and executed by one or more processors. A machine-readable medium may include any mechanism for storing or transmitting information in a form readable by a machine (e.g., a computing device). For example, a machine-readable medium may include read only memory ("ROM"), random access memory ("RAM"), magnetic disk storage media, optical storage media, flash memory devices, electrical optical, acoustical or other forms of propagated signals (e.g., carrier waves, infrared signals, digital signals, etc.), and others. Further firmware, software routines, and instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

FIG. 1 illustrates a top-elevational view of an exemplary solar panel according to an exemplary embodiment of the present disclosure. The solar panel 100 is configured to collect energy 102 from a light source, such as the sun, and convert that energy with an inverter 104 into DC power and if desired, store that power in a battery 106 or other power storage device. A solar panel 100 may additionally be a standalone AC power generating device by converting or inverting the DC power to AC power. However, the solar panel 100 is not limited to generating output AC power 195 by passing through input AC power 112 received from a utility grid into the output AC power 195 when the solar panel 100 is coupled to the utility grid. Rather, the solar panel 100 may still generate standalone output AC power 195 when isolated from the utility grid, i.e., not grid tied.

The solar panel 100 may also receive input AC power 112 that is generated by an electric utility grid when the solar panel 100 is coupled to the grid, i.e. when it is grid tied. In such cases, the solar panel 100 may parallel the AC output power 195 generated from the inverted DC power provided by a DC battery 106 with the input AC power 112 when the output AC power 195 is synchronized with the input AC power 112. The input AC power 112 may also be generated by a second solar panel 100 when it is coupled to a first solar panel 100, by an AC power generator, an AC power inverter, a sinusoidal AC power inverter, and/or any other type of AC power source independent from the solar panel 100 that will be apparent to those skilled in the relevant art(s) without departing from the spirit and scope of the disclosure.

The solar panel 100 may generate the output AC power 195 that is in parallel with the input AC power 112 when the output AC power 195 is synchronized with the input AC power 112. The solar panel 100 may sense the input AC power 112 when the solar panel 100 is coupled to a power source. The solar panel 100 may also sense the input AC power 112 when the solar panel 100 is coupled to the second solar panel and the second solar panel is providing the input AC power 112 to the solar panel 100.

The solar panel 100 may determine whether the input AC power 112 is synchronized with the output AC power 195 based on the power signal characteristics of the input AC power 112 and the output AC power 195. The power signal characteristics are characteristics associated with the sinusoidal waveform included in the input AC power 112 and the output AC power 195. The solar panel 100 may generate the output AC power 195 that is in parallel with the input AC power 112 when the power signal characteristics of the input AC power 112 are within a threshold of the power signal characteristics of the output AC power 195 so that the input AC power 112 and the output AC power 195 are synchronized. The solar panel 100 may refrain from generating the output AC power 195 that is in parallel with the input AC power 112 when the power signal characteristics of the input AC power 112 are outside the threshold of the power signal characteristics of the output AC power 195 where the input AC power 112 and the output AC power 195 are not synchronized.

For example, the solar panel 100 determines whether the input AC power 112 and the output AC power 195 are synchronized based on the frequency and the voltage of the sinusoidal waveform included in the input AC power 112 and the frequency and the voltage of the sinusoidal waveform included in the output AC power 195. The solar panel 100 generates the output AC power 195 that is in parallel with the input AC power 112 when the frequency and the voltage of the input AC power 112 are within the threshold of 10% from the frequency and the voltage of the output AC power 195 so that the input AC power 112 and the output AC power 195 are synchronized. The solar panel 100 refrains from generating the output AC power 195 that is in parallel with the input AC power 112 when the frequency and the voltage of the input AC power 112 are outside the threshold of 10% from the frequency and the voltage of the output AC power 195 where the input AC power 112 and the output AC power 195 are not synchronized. Rather, the solar panel 100 generates the output AC power 195 that is generated from the DC source and refrains from combining the output AC power 195 with the input AC power 112.

The power signal characteristics may include but are not limited to frequency, phase, amplitude, current, voltage and/or any other characteristic of a power signal that will be apparent to those skilled in the relevant art(s) without departing from the spirit and scope of the disclosure. The solar panel 100 may store the power signal characteristics of the input AC power 112. The threshold of the power signal characteristics associated with the input power as compared to the output power may be any threshold that prevents damage from occurring to the power converter 100 by combining the input AC power 112 and the output AC power 195 when the power signal characteristics of each significantly differ resulting in damage that will be apparent to those skilled in the relevant art(s) without departing from the spirit and scope of the disclosure.

In short, the output AC power 195 generated by the solar panel 100 may be used to power electronic devices external to the solar panel 100, such as a hairdryer, for example. The output AC power 195 may also be provided to another solar panel. The solar panel 100 may also convert the input AC power 112 to DC power and store the DC power within to the solar panel 100. The solar panel 100 may continue to provide standalone output AC power 195 even after it is no longer receiving AC input power 112. Thus the solar panel 100 is not reliant on external sources to generate output AC power 195. For example, the solar panel 100 may continue to provide standalone output AC power 195 after it is no longer grid tied, or after it is no longer receiving AC input power 112 from another solar panel. For example, the solar panel 100 continues to provide output AC power 195 that is not in parallel with the input AC power 112 after the power converter 100 is no longer coupled to a power source such that the solar panel 100 is no longer receiving the input AC power 112 from the power source. In another example, the solar panel 100 continues to provide output AC power 195 that is not in parallel with the input AC power 112 after the solar panel 100 is no longer receiving the input AC power 112 from the second solar panel.

The solar panel 100 will also sense when it is no longer receiving AC input power 112. The solar panel 100 may then internally generate the standalone output AC power 195 from the previously stored DC power. For example, the solar panel 100 may have previously stored DC power that was converted from the input AC power 112 or that was converted from the solar energy 102.

The solar panel 100 may internally generate the output AC power 195 by converting the previously stored DC power into the output AC power 195. In one embodiment, the solar panel 100 may synchronize the power signal characteristics of the output AC power 195 that was converted from the previously stored DC power to be within the threshold of the power signal characteristics of the input AC power 112 despite no longer receiving the input AC power 112. For example, the solar panel 100 synchronizes the output AC power 195 that was converted from the previously stored DC power to have frequency and voltage that is within a threshold of 10% from the input AC power 112 when the solar panel 100 was receiving the input AC power 112. The solar panel 100 then provides the output AC power 195 when the solar panel 100 is no longer receiving the input AC power 112 while providing such output AC power 195 with frequency and voltage that is within the threshold of 10% from the previously received input AC power 112.

The solar panel 100 may be scalable in size and may be able to provide various levels of output power. For example, the solar panel 100 may be a portable model that may output approximately 250 W. In another example, the solar panel 100 may be a permanent rooftop model that may output 2.5 kW.

The solar panel 100 is also efficient in that it includes all of the components required to generate output AC power 195 within a single housing 108. For example, as will be discussed in more detail below, a solar power collector, a battery bank, a DC to AC converter, a controller, and other necessary components required to generate output AC power 195 are located within a single housing. This minimizes the amount of cabling required for the solar panel 100 so that transmission loss is minimized.

The solar panel 100 is also user friendly in that an individual may find that operating it requires relatively minimal effort. For example, as will be discussed in more detail below, the individual simply plugs in an external electrical device into the outlet provided on the solar panel 100 to power the external electrical device. In another example, the individual simply plugs in an additional solar panel into the outlet provided on the solar panel 100 to daisy chain the additional solar panel together. In yet another example, the solar panel 100 that is daisy chained to additional solar panels automatically establishes a master slave relationship so that the individual is not required to manually designate which is the master and the slave.

Figure 2:
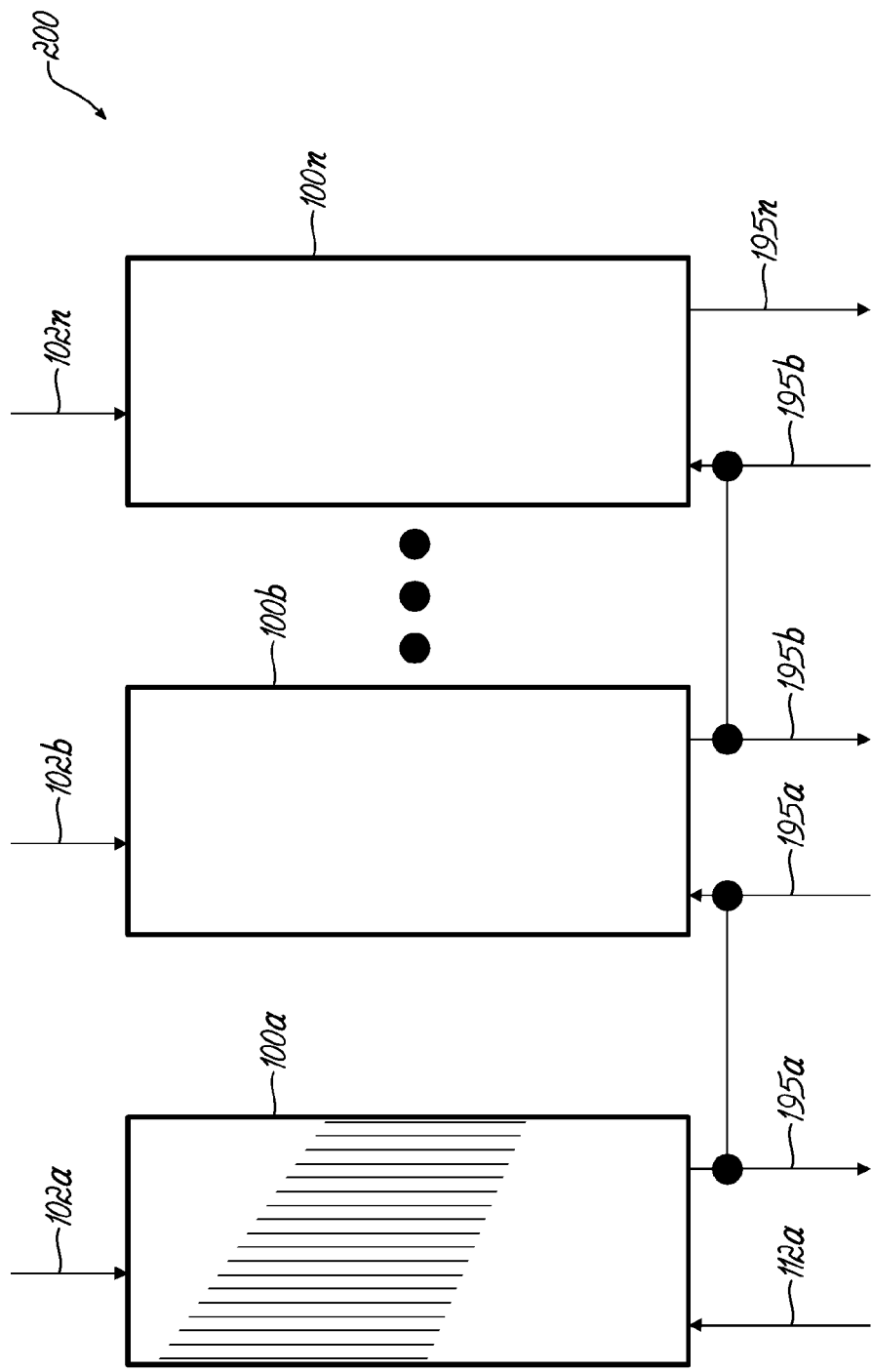
FIG. 2 is a top-elevational view of a solar panel configuration according to an exemplary embodiment of the present disclosure.

FIG. 2 illustrates a top-elevational view of a solar panel configuration according to an exemplary embodiment of the present disclosure. The solar panel configuration 200 represents a solar panel configuration that includes a plurality of solar panels 100*a* through 100*n* that may be daisy chained together to form the solar panel configuration 200, where n is an integer greater than or equal to two. Each solar panel 100*a* through 100*n* that is added to the solar panel configuration 200 may generate output AC power 195*n* that is in parallel with output AC power 195*a*, 195*b*. The solar panel configuration 200 shares many similar features with the solar panel 100 and as such, only the differences between the solar panel configuration 200 and the solar panel 100 will be discussed in further detail.

As noted above, the solar panel 100*a* generates output AC power 195*a*. However, the solar panel 100*a* is limited to a maximum output power level for the output AC power 195*a*. For example, the solar panel 100*a* may be limited to a maximum output power 195*a* level of 500 Watts ("W"). Hence, regardless of the AC input power 112*a* level, the maximum output AC power 195*a* will be 500 W. Thus, if an individual desires, for example, to power a hair dryer that requires 1500 W to operate, the solar panel 100*a* will not be able to power it.

However, a user could daisy chain additional solar panels 100*b* through 100*n* together to parallel the output AC power 195*a* so that the overall output power of the solar panel configuration 200 is increased. In daisy chaining the plurality of solar panels 100*a* through 100*n*, each power input for each solar panel 100*b* through 100*n* is coupled to a power output of a solar panel 100*b* through 100*n* that is ahead of the solar panel 100*b* through 100*n* in the daisy chain configuration. For example, the power input of the solar panel 100*b* is coupled to the power output of the solar panel 100*a* so that the input AC power 195*a* received by the solar panel 100*b* is substantially equivalent to the output AC power 195*a* of the solar panel 100*a*. The power input of the solar panel 100*n* is coupled to the power output of the solar panel 100*b* so that the input AC power 195*b* received by the solar panel 100*n* is substantially equivalent to the output AC power 195*b* of the solar panel 100*b*.

After daisy chaining each of the plurality of solar panels 100(*a-n*), each output AC power 195(*a-n*) may be paralleled with each input AC power 112*a*, 112*b*, and/or 112*n* to increase the overall output AC power of the solar panel configuration 200. Each output AC power 195(*a-n*) may be paralleled with each input AC power 112*a*, 112*b*, and 112*n* so that the overall output AC power of the solar panel configuration 200 may be used to power the external electronic device that the individual requests to operate, such as the hair dryer. The individual may access the overall output AC power by coupling the external electronic device that the individual requests to power, such as the hair dryer, into any of the solar panels 100(*a-n*). The individual is not limited to coupling the external electronic device into the final solar panel 100*n* in the solar panel configuration 200 in order to access the overall output AC power. Rather, the individual may access the overall output AC power by coupling the external electronic device to any of the solar panels 100(*a-n*) in the solar panel configuration 200.

For example, if the maximum output AC power 195*a* for the solar panel 100*a* is 500 W, the maximum output power that can be generated by the solar panel 100*b* is also 500 W. The maximum output power that can be generated by the solar panel 100*n* is also 500 W. However, the solar panel 100*b* is daisy chained to the solar panel 100*a* and the solar panel 100*b* is daisy chained to the solar panel 100*n*. As a result, the external input AC power 112*a*, 112*b*, and 112*n* for each of the solar panels 100(*a-n*) is in parallel with the output AC power 195*a*, 195*b*, and 195*n* for each of the solar panels 100(*a-n*).

The output AC power 195*a*, 195*b*, and 195*n* for each of the solar panels 100(*a-n*) is 500 W. The solar panel 100*b* generates the output AC power 195*b* of 500 W in parallel with the input AC power 112*b* of 500 W so that the output AC power 195*b* and/or the output AC power 195*a* is the paralleled AC output power of 1000 W when the solar panel 100*b* is daisy chained to the solar panel 100*a*. The solar panel 100*n* is then daisy chained to the solar panels 100*a* and 100*b* so that the output AC power 195*a*, the output AC power 195*b* and/or the output AC power 195*n* is the paralleled AC output power of 1500 W. Thus, the maximum output AC power for the solar panel configuration 200 is 1500 W. The maximum output AC power of 1500 W is now sufficient to power the hair dryer that requires 1500 W to operate.

The individual may plug the hair dryer into any of the solar panels 100(*a-n*) in order to access the maximum output AC power of 1500 W generated by the solar panel configuration 200 to power the hair dryer. The individual is not limited to plugging the hair dryer into the solar panel 100*n* simply because the solar panel 100*n* is the last solar panel in the daisy chain of the solar panel configuration 200. The daisy chaining of each of the plurality of solar panels 100(*a-n*) when the plurality of solar panels 100(*a-n*) are not coupled to a power source but generating paralleled output AC power may be considered a standalone solar panel micro grid.

Each of the solar panels 100*a* through 100*n* included in the solar panel configuration 200 may operate in a master/slave relationship with each other. The master is the originator of the standalone AC power for the solar panel configuration 200. The master determines the power signal characteristics of the standalone AC power originated by the master in that each of the remaining slaves included in the solar panel configuration 200 are required to accordingly synchronize each of their own respective AC output powers. Each respective AC power output that is synchronized to the master standalone AC is paralleled with the master standalone AC power for the master. For example, the utility grid is the master of the solar panel configuration 200 when the utility grid is the originator of the input AC power 112*a* provided to solar panel 100*a*. The utility grid determines the frequency, phase, amplitude, voltage and current for the input AC power 112*a*. Each solar panel 100*a* through 100*n* then become slaves and synchronize each of their respective output AC power 195*a* through 195*n* to have substantially equivalent frequency, phase, amplitude, and current as the input AC power 112*a*. Each output AC power 195*a* through 195*n* that is synchronized with input AC power 112*a* is paralleled with the input AC power 112*a*.

Each of the solar panels 100*a* through 100*n* operates as a slave for the solar panel configuration 200 when each of the solar panels 100*a* through 100*n* is receiving input AC power. Each of the solar panels 100*a* through 100*n* operates as a master when each of the solar panels 100*a* through 100*n* no longer receives input AC power. For example, each of the solar panels 100*a* through 100*n* operate as the slave when the solar panel configuration 200 is grid tied so that the utility grid operates as the master for the solar panel configuration 200. Each solar panels 100*a* through 100*n* receives input AC power from either the grid or its adjacent panel. Solar panel 100*a* is receiving the input AC power 112*a* from the grid making solar panel 100*a* the slave while solar panel 100*b* receives the input AC power 195a from solar panel 100a making solar panel 100b the slave, etc.

In another example, solar panel 100a operates as the master for the solar panel configuration 200 when the solar panel configuration 200 is no longer grid tied and solar panel 100a is generating standalone output AC power 195a. Each of the solar panels 100b through 100n then receives input AC power via the standalone output AC power 195a internally generated by the master solar panel 100a. Solar panel 100b receives input AC power 195a from solar panel 100a and solar panel 100c receives the input AC power 195b from the solar panel 100b.

The solar panel configuration 200 may automatically transition the master/slave designations between each of the solar panels 100a through 100n without user intervention. As noted above, any solar panel 100a through 100n may be designated as the master of the solar panel configuration 200 when it no longer receives input AC power. And the master solar panel will automatically transition to a slave when it senses input AC power coming into it. At that point, the master solar panel automatically terminate its internal standalone output AC power generation from its own previously stored DC power. That solar panel then automatically synchronizes to the power signal characteristics of the input AC power it now receives to parallel the output AC power provided by the new master solar panel and begin operating as a slave by generating output AC power it now receives.

For example, when solar panel 100b operates as a master, the solar panel 100b is not receiving input AC power but rather is internally generating its own standalone output AC power 195b from its own previously stored DC power. The solar panel 100b continues to operate as the master until the solar panel 100b senses that input AC power 195a is being received by it from the solar panel 100a, which is generating the input AC power 195a. The solar panel 100b then automatically terminates internally generating its own standalone output AC power 195b from its own previously stored DC power, and automatically synchronizes the standalone output AC power 195b to the frequency, phase, amplitude, and current of the input AC power 195a. In other words the solar panel 100b transitions to being a slave when the solar panel 100b generates the output AC power 195b from the input AC power 195a rather than from its own previously stored DC power.

The solar panel configuration 200 may also automatically transition the slave solar panels 100a through 100n to being a master without user intervention. As noted above, solar panels 100a through 100n may be designated as slaves when they are receiving input AC power. However, they may automatically transition to being a master when they no longer sense input AC power coming into them. At that point, they automatically begin internally generating their own standalone output AC power from their own previously stored DC power. The solar panels 100a through 100n may also have stored the power signal characteristics of the input power previously received by them and may automatically synchronize their own standalone output AC power to these characteristics. Again the solar panel 100a through 100b transitions from a slave to a master when they begin to internally generate their own standalone output AC power from their own previously stored DC power.

After the master-slave relationship is established between each of the master solar panels 100(a-n), the paralleled output AC power of the master solar panel configuration 200 may be maintained by the solar panel converter 100a and each of the slave solar panels 100(b-n). The master solar panel 100a may maintain the voltage of the paralleled output AC power while the slave solar panels 100(b-n) provide the current to maintain the voltage of the paralleled output AC power at a reference voltage.

However, the voltage of the paralleled output AC power may decrease when the external electronic device the individual requests to power, such as the hair dryer, is coupled to at least one of the outputs for the solar panels 100(a-n). Each of the slave solar panels 100(b-n) may increase the current of the paralleled output AC power so that the voltage of the paralleled output AC power maintained by the master solar panel 100a is increased back to the reference voltage sufficient to generate the paralleled output AC power. The reference voltage of the paralleled output AC power is the voltage level that is to be maintained to generate the paralleled output AC power that is sufficient to power the external electronic device. The reference voltage may be specified to be any voltage that is sufficient to maintain the paralleled output AC power that will be apparent to those skilled in the relevant art(s) without departing from the spirit and scope of the disclosure.

Each of the slave solar panels 100(b-n) may continue to generate current sufficient to maintain the voltage of the paralleled output AC power at the reference voltage so that the external electronic device is powered by the paralleled output AC power. However, eventually each of the slave solar panels 100(b-n) may have their DC sources depleted to the point where each of the slave solar panels 100(b-n) no longer have current that is sufficient to maintain the voltage of the paralleled output AC power at the reference voltage sufficient to generate the paralleled output AC power. At that point, the master solar panel 100a may begin to provide current to maintain the voltage of the paralleled output AC power at the reference voltage sufficient to generate the paralleled output AC power.

The solar panel configuration 200 may continue to generate output AC power even when a particular slave solar panel 100a through 100n may no longer be functional. In such cases, the dysfunctional slave solar panel 100a through 100n continues to pass through the standalone output AC power generated by the master solar panel 100a through 100n to each of the other slave solar panels 100a through 100n. For example, when the master solar panel 100a acts as the master and the solar panels 100b and 100n act as the slaves, if the slave solar panel 100b fails and is no longer functional, it will continue to pass through the output standalone AC power 195a generated by the master solar panel 100a to the functional slave solar panel 100n so that the other functional slave solar panel 100n may continue to generate output AC power 195n from the standalone output AC power 195a.

Figure 3:
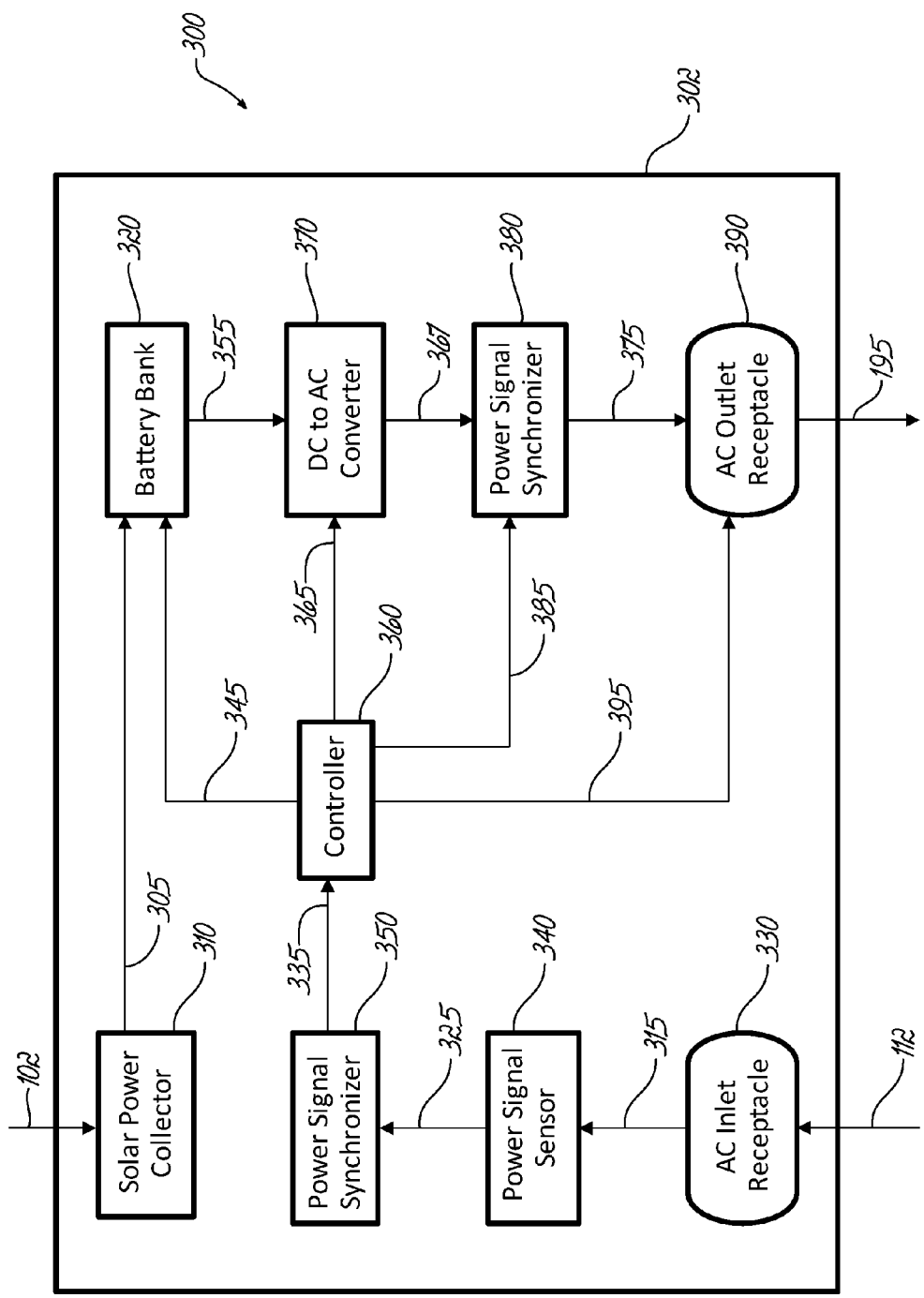
FIG. 3 is a block diagram of an exemplary solar panel that may be used in the solar panel configuration according to an exemplary embodiment of the present disclosure.

FIG. 3 is a block diagram of another exemplary solar panel 300 that may be used in the solar panel configuration 200 according to an exemplary embodiment of the present disclosure. Although FIG. 3 depicts a block diagram of the solar panel 300, FIG. 3 may also depict a block diagram of one of the plurality of solar panels 100a through 100n used in the solar panel configuration 200 depicted in FIG. 2 as well as the single solar panel 100 depicted in FIG. 1. Solar panel 300 will also automatically transition to internally generating standalone output AC power 195 based on the stored DC power 355 provided by the battery bank 320 when the power signal sensor 340 no longer senses the received input AC power 315. The solar panel 300 will also automatically transition to operating as a master when the power signal sensor 340 no longer senses the received input AC power 315. Solar panel 300 will also automatically transition to operating as a slave when the power signal sensor 340 begins to sense the received input AC power 315.

Enclosed within a single housing 302 for solar panel 300 is a solar power collector 310, a battery bank 320, an AC inlet receptacle 330, a power signal sensor 340, a power signal synchronizer 350, a controller 360, a DC to AC converter 370, a power signal synchronizer 380, and an AC outlet receptacle 390.

The solar panel collector 310 captures the solar or other light energy 102 from a solar or light source, e.g., the sun. The solar panel collector 310 may include a single and/or multiple photovoltaic ("PV") solar panels or arrays that convert the solar energy 102 into the captured DC power 305. The solar panel collector 310 captures solar energy 102 when the solar source is available and is radiating solar energy 102 in a sufficient manner for the solar panel collector 310 to capture. The solar panel collector 310 converts the solar energy 102 into DC captured power 305 in a wide range of voltages and/or current capacities. The solar panel collector 310 may include photovoltaic solar panels categorized as, but not limited to, mono-crystalline silicon, poly-crystalline silicon, amorphous silicon, cadmium telluride, copper indium selenide, thin-film layers, organic dyes, organic polymers, nanocrystals and/or any other type of photovoltaic solar panels that will be apparent to those skilled in the relevant art(s) without departing from the spirit and scope of the disclosure. The solar panel collector 310 may also be any shape or size that is sufficient to capture the solar energy 102 that will be apparent to those skilled in the relevant art(s) without departing from the spirit and scope of the disclosure.

The battery bank 320 receives and stores the captured DC power 305. The battery bank 320 accumulates the captured DC power 305 as the captured DC power 305 is generated. The battery bank 320 may accumulate the captured DC power 305 until the battery bank 320 is at capacity and can no longer store any more of the captured DC power 305. The battery bank 320 may also store the AC input power 112 that is converted to the captured DC power 305 when the AC output receptacle 390 is not generating the output AC power 195. The battery bank 320 stores the captured DC power 305 until requested to provide the stored DC power 355. The stored DC power 355 provided by the battery bank 320 may include low-voltage but high energy DC power. The battery bank 320 may include one or more lithium ion phosphate (LiFePO$_4$) and/or one or more lead acid cells. However, this example is not limiting, those skilled in the relevant art(s) may implement the battery bank 320 using other battery chemistries without departing from the scope and spirit of the present disclosure. One or more cells of the battery bank 320 convert chemical energy into electrical energy via an electromechanical reaction.

As noted above, the solar panel 300 may automatically transition between the master and/or slave designations without user intervention. The solar panel 300 will operate as a slave when the AC inlet receptacle 330 is receiving AC input power 112, such as, AC power that is generated by the grid. The AC inlet receptacle 330 may also receive input AC power 112 when the AC inlet receptacle 330 is grid tied, such as AC power generated by a second solar panel when two panels are coupled together. The input AC power 112 may also be AC power generated by an AC power generator, an AC power inverter, or any other type of AC power source independent from the solar panel 300 that will be apparent to those skilled in the relevant art(s) without departing from the spirit and scope of the disclosure.

The AC inlet receptacle 330 may be in the form of a male configuration or a female configuration. A male AC inlet receptacle 330 prevents an individual from mistakenly plugging an electronic device into it with the intent to power the electronic device, as electronic devices typically have male plugs. The AC inlet receptacle 330 may also be fused protected. The AC inlet receptacle 330 may also be configured to receive the input AC power 112 in American, European, and/or any other power format that will be apparent to those skilled in the relevant art(s) without departing from the spirit and scope of the disclosure. The AC inlet receptacle 330 may further include an Edison plug, any of the several International Electrotechnical Commission ("IEC") plugs, or any other type of plug that will be apparent to those skilled in the relevant art(s) without departing from the spirit and scope of the disclosure.

The AC inlet receptacle 330 provides received input AC power 315 to a power signal sensor 340. The power signal sensor 340 senses whether the solar panel 300 is receiving input AC power 112 through the AC inlet receptacle 330 based on whether it receives input AC power 315 from the AC inlet receptacle 330. Once the power signal sensor 340 senses the received input AC power 315, the power signal sensor 340 generates an incoming AC power signal 325. The incoming AC power signal 325 provides information regarding power signal characteristics of the input AC power 112 that the solar panel 300 is receiving through the AC inlet receptacle 330. These power signal characteristics may include, but are not limited to, frequency, phase, amplitude, current, voltage, and other like characteristics of power signals that will be apparent to those skilled in the relevant art(s) without departing from the spirit and scope of the disclosure.

The power signal sensor 340 provides the incoming AC power signal 325 to a power signal synchronizer 350. The power signal synchronizer 350 determines the power signal characteristics of the input AC power 112 that are provided by the incoming AC power signal 325. For example, the power signal synchronizer 350 determines the frequency, phase, amplitude, voltage, and current of the input AC power 112. The power signal synchronizer 350 generates a synchronized input power signal 335 that provides the power signal characteristics of the input AC power 112 to a controller 360.

The power signal synchronizer 350 also synchronizes the converted AC power 367 that is generated by the DC to AC converter 370 with the power signal characteristics of the input AC power 112. The power signal synchronizer 350 determines whether the power signal characteristics of the input AC power 112 are within the threshold of the power signal characteristics of the converted AC power 367. The power signal synchronizer 350 synchronizes the input AC power 112 with the converted AC power 367 when the power signal characteristics of the input AC power 112 are within the threshold of the power signal characteristics of the converted AC power 367. The power signal synchronizer 350 refrains from synchronizing the input AC power 112 with the converted AC power 367 when the power signal characteristics of input AC power 112 are outside the threshold of the power signal characteristics of the converted AC power 367.

For example, the power signal synchronizer 350 determines whether the frequency and the voltage of the sinusoidal waveform included in the input AC power 112 are within a threshold of 10% from the frequency and the voltage of the sinusoidal waveform included in the converted AC power 367. The power signal synchronizer 350 synchronizes the input AC power 112 with the converted AC power 367 when the frequency and the voltage of the input AC power 112 are within the threshold of 10% from the frequency and the voltage of the converted AC power 367. The power signal synchronizer 350 refrains from synchronizing the input AC power 112 with the converted AC power 367 when the frequency and the voltage of the input AC power 112 are outside the threshold of 10% from the frequency and the voltage of the converted AC power 367.

The output AC power 195 includes the input AC power 112 in parallel with the converted AC power 367 when the converted AC power 367 is synchronized with the input AC power 112. For example, the power signal synchronizer 350 synchronizes the converted AC power 367 to operate at within the threshold of 10% from the frequency and voltage of the input AC power 112. In one embodiment, the input AC power 112 embodies a substantially pure sinusoidal waveform. The substantially pure sinusoidal waveform may represent an analog audio waveform which is substantially smooth and curved rather than a digital audio waveform that includes squared off edges. In such an embodiment, the power signal synchronizer 350 synchronizes the converted AC power 367 to be within a threshold of the pure sinusoidal waveform embodied by the input AC power 112. After the power signal synchronizer 350 synchronizes the converted AC power 367 to the power signal characteristics of the input AC power 112, the power signal synchronizer 350 notifies the controller 360 of the synchronization via the synchronized input power signal 335.

The controller 360 receives the synchronized input power signal 335. The controller 360 determines the power signal characteristics of the input AC power 112 and then stores the power signal characteristics in a memory included in the controller 360. For example, the controller 360 stores the frequency, phase, amplitude, voltage, and/or current of the input AC power 112. After receiving the synchronized input power signal 335, the controller 360 is aware that the input AC power 112 is coupled to the AC inlet receptacle 330. In response to the input AC power 112 coupled to the AC inlet receptacle 330, the controller 360 stops generating a reference clock for the solar panel 300.

Also, in response to the input AC power 112 coupled to the AC inlet receptacle 330, the controller 360 also generates a battery bank signal 345. The controller 360 instructs the battery bank 320 via the battery bank signal 345 to no longer provide stored DC power 355 to the DC to AC inverter 370. The instruction by the controller 360 to the battery bank 320 to no longer provide stored DC power 355 to the DC to AC inverter 370 also terminates the standalone output AC power 195 that is generated from the stored DC power 355.

Further, in response to the input AC power 112 coupled to the AC inlet receptacle 330, the controller 360 confirms that the power signal synchronizer 350 has synchronized the converted AC power 367 to the power signal characteristics of the input AC power 112. After confirming that the power signal synchronizer 350 has synchronized the converted AC power 367 to the power signal characteristics of the input AC power 112, the controller 360 links in parallel the input AC power 112 being received by the AC inlet receptacle 330 with the converted AC power 367 to the AC outlet receptacle 390 to generate parallel AC power 395. The AC outlet receptacle 390 then outputs the output AC power 195 that includes the input AC power 112 in parallel with the converted AC power 367 with power signal characteristics that are substantially equivalent to the power signal characteristics of the input AC power 112. For example, the frequency, phase, amplitude, voltage, and/or current of the output AC power 195 may be substantially equivalent to the frequency, phase, amplitude, voltage, and/or current of the input AC power 112.

The AC outlet receptacle 390 may be in the form of a male or a female configuration. A female AC outlet receptacle 390 allows an individual to directly plug an electronic device into it as electronic devices typically have male plugs.

The AC outlet receptacle 390 may also be fused protected. The AC outlet receptacle 390 may be configured to provide the output AC power 195 in American, European, or any other power format that will be apparent to those skilled in the relevant art(s) without departing from the spirit and scope of the disclosure. The AC outlet receptacle 390 may also include an Edison plug, any of the IEC plugs, or any other type of plug that will be apparent to those skilled in the relevant art(s) without departing from the spirit and scope of the disclosure.

As noted above, the solar panel 300 will automatically transition between the master and/or slave designations without user intervention. The solar panel 300 will automatically transition from operating as a slave to operating as a master when the AC input power signal 112 diminishes and is no longer received by the AC inlet receptacle 330 such that the controller 360 no longer receives the synchronized input power signal 335. At that point, the controller 360 generates the battery bank signal 345 to instruct the battery bank 320 to begin generating stored DC power 355. The controller 360 generates a power conversion signal 365 to instruct the DC to AC converter 370 to convert the stored DC power 355 to converted AC power 367. The converted AC power 367 is high-voltage AC output power. The DC to AC converter 370 may use high frequency modulation in converting the stored DC power 355 to the converted AC power 367.

The controller 360 then provides a synchronized output power signal 385 to the power signal synchronizer 380. The synchronized output power signal 385 provides the power signal characteristics of the input AC power 112 when the input power signal 112 is coupled to the AC inlet receptacle 330 to the power signal synchronizer 380. For example, the synchronized output power signal 385 provides the frequency, phase, amplitude, voltage, and current of the input power signal 112 to the power signal synchronizer 380. The synchronized output power signal 385 also provides the reference clock to the power signal synchronizer 380.

The power signal synchronizer 380 then generates synchronized output AC power 375 by synchronizing the converted AC power 367 to the power signal characteristics of the input AC power 112 and the reference clock provided by the synchronized output power signal 385. In one embodiment, the input AC power 112 embodies a substantially pure sinusoidal waveform. In such an embodiment, the power signal synchronizer 380 synchronizes the converted AC power 367 to be within the threshold of the pure sinusoidal waveform embodied by the input AC power 112. The synchronized output AC power 375 includes power signal characteristics that are within the threshold of the power signal characteristics of the input AC power 112. For example, the synchronized output AC power 375 includes a frequency and voltage that is within the threshold of the frequency and voltage of the input AC power 112. The AC outlet receptacle 390 then generates the output AC power 195 based on the synchronized output power 375. Thus, the power converter 300 generates the output AC power 195 that is substantially similar to the input AC power 112 despite not receiving the input AC power 112 from other sources.

Figure 4A:
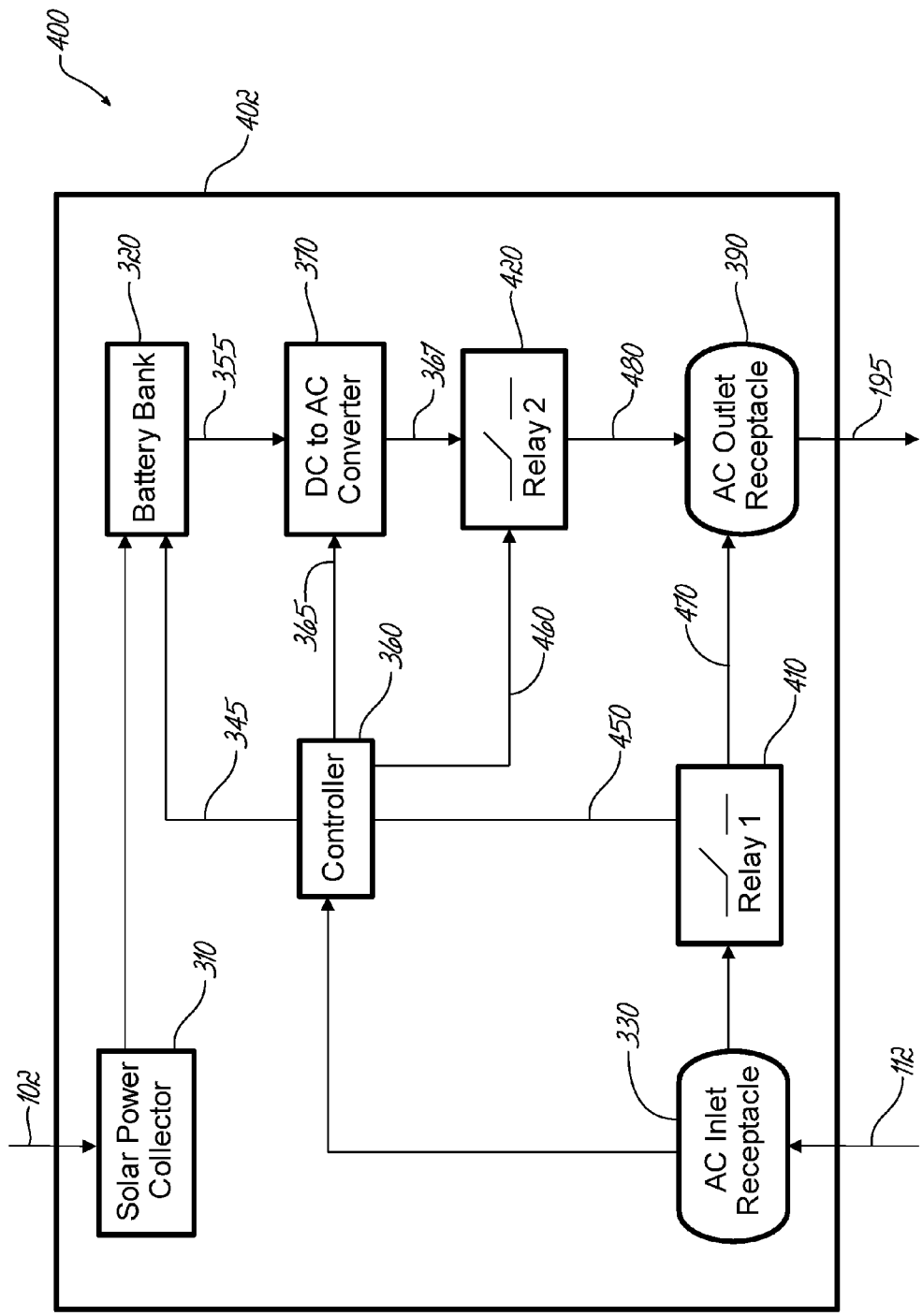
FIG. 4A is a block diagram of an exemplary solar panel that may be used in the solar panel configuration according to an exemplary embodiment of the present disclosure.

FIG. 4A is a block diagram of another exemplary solar panel 400 that may be used in the solar panel configuration 200 according to an exemplary embodiment of the present disclosure. Although, FIG. 4A depicts a block diagram of the solar panel 400, FIG. 4A may also depict a block diagram of one of the plurality of panels 100a through 100n used in the solar panel configuration 200 depicted in FIG. 2 and also the single solar panel 100 depicted in FIG. 1. The features depicted in the block diagram of the solar panel 300 may also be included in the solar panel 400 but have been omitted for simplicity.

The solar panel 400 may automatically transition from operating as a master and operating as a slave without user intervention based on a relay configuration. The solar panel 400 may be implemented using the solar power collector 310, the battery bank 320, the AC inlet receptacle 330, the controller 360, the DC to AC converter 370, the AC outlet receptacle 390, a first relay 410 and a second relay 420 each of which are enclosed within a housing 402 for the solar panel 400.

As noted above, the solar panel 400 operates as a slave when the controller 360 senses that the input AC power 112 is coupled to the AC inlet receptacle 330. The controller then terminates the generation of the standalone output AC power 195. The solar panel 400 operates as a master when the controller 360 no longer senses that the input AC power 112 is coupled to the AC inlet receptacle 330. The controller 360 then instructs the battery bank 320 and the DC to AC inverter 370 to begin generating the standalone output AC power 195. The relay configuration that includes a first relay 410 and a second relay 420 transitions the solar panel 400 between the master and slave modes based on the logic provided in Table 1.

TABLE 1

| Master Mode | Relay 1 Open | Relay 2 Closed |
| Slave Mode | Relay 1 Closed | Relay 2 Closed |
| Unit Power Off (Bypassed) | Relay 1 Closed | Relay 2 Open |

When automatically transitioning from the slave mode to the master mode, the controller 360 no longer senses the input AC power 112 coupled to the AC inlet receptacle 330. At this point, the controller 360 generates a first relay signal 450 that instructs the first relay 410 transition to the open state (logic 0). The controller 360 also generates a second relay signal 460 that instructs the second relay 420 to transition to the closed state (logic 1). The controller 360 also generates battery bank signal 345 that instructs the battery bank 320 to begin providing the stored DC power 355 to the DC to AC converter 370 to generate the converted AC power 367. Because the second relay 420 is in the closed position (logic 1), the converted AC power 367 passes through the second relay 420, and as shown by arrow 480, onto the AC outlet receptacle 390 so that the solar panel 400 provides the AC output power 195 generated from the stored DC power 355 rather than the input AC power 112. The open state (logic 0) of the first relay 410 prevents any remaining input AC power 112 from reaching the AC output receptacle 390 when the solar panel 400 is generating the standalone AC output power 195 as operating as the master.

Once the controller 360 senses the input AC power 112 coupled to the AC inlet receptacle 330, the controller 360 automatically generates the power conversion signal 365 to instruct the DC to AC converter 370 to no longer provide converted AC power 367 so that the solar panel 400 no longer generates the standalone AC output power 195. The controller 360 also automatically generates the second relay signal 460 to instruct the second relay 420 to transition to the open state (logic 0). The controller 360 also generates the first relay signal 450 to instruct the first relay 410 to transition to the closed state (logic 1). After the second relay 420 transitions to the open state (logic 0) and the first relay 410 transitions to the closed state (logic 1), any input AC power 112 coupled to the AC inlet receptacle 330 passes through the first relay 410, and as shown by arrow 470, onto the AC outlet receptacle 390 so that the solar panel 400 generates the output AC power 195.

The second relay 420 remains in the open state (logic 0), until the controller 360 has successfully synchronized the solar panel 400 to the input AC power 112 coupled to the AC inlet receptacle 330. After the controller 360 properly synchronizes solar panel 400 to the input AC power the controller 360 then generates the second relay signal 460 to instruct the second relay 420 to transition from the open state (logic 0) to the closed state (logic 1). After the second relay 420 transitions from the open state (logic 0) to the closed state (logic 1), the solar panel 400 will generate output AC power 195 that includes the converted AC power 367 that is in parallel to the input AC power 112.

The solar panel 400 also operates in a bypass mode. In the bypass mode, the solar panel 400 is powered off and is no longer functioning. In embodiment, the controller 360 generates the first relay signal 450 and instructs the first relay 410 to transition into the closed state (logic 1). The controller 360 also generates the second relay signal 460 and instructs the second relay 420 to transition into the open state (logic 0). In another embodiment, the first relay 410 and the second relay 420 are spring loaded relay switches. When the solar panel 400 powers off, the electromagnetic coil of the first relay 410 is no longer energized so the spring pulls the contacts in the first relay 410 into the up position. The closing of the first relay 410 and the opening of the second relay 420 causes the solar panel 400 to be a pass through where the input AC power 112 passes through the solar panel 400 and onto a second solar panel daisy chained to the solar panel 400 and/or to an electronic device being powered by the input AC power 112. Thus, additional solar panels and/or electronic devices down the line from the dysfunctional solar panel 400 continue to operate off of the input AC power 112. The first relay 410 and the second relay 420 may be implemented in hardware, firmware, software, or any combination thereof that will be apparent to those skilled in the relevant art(s) without departing from the spirit and scope of the disclosure.

Figure 4B:
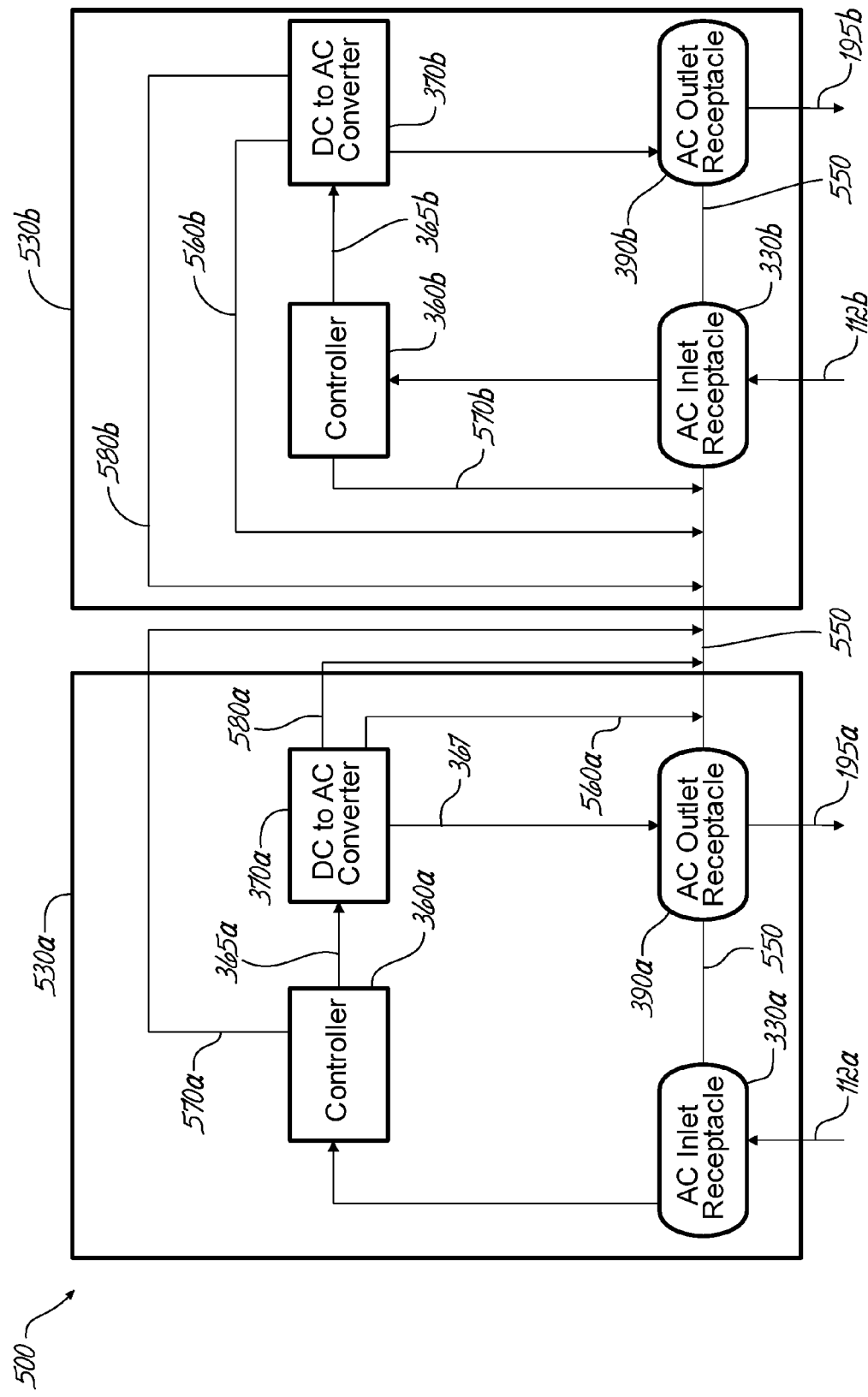
FIG. 4B is a block diagram of an exemplary solar panel that may be used in the solar panel configuration according to one exemplary embodiment of the present disclosure.

FIG. 4B is a block diagram of another exemplary solar panel configuration 500 according to an exemplary embodiment of the present disclosure. Although, FIG. 4B depicts a block diagram of the solar panel configuration 500, FIG. 4B may also depict a block diagram of the plurality of solar panels 100(a-n) used in the solar panel configuration 200 depicted in FIG. 2.

The solar panel configuration 500 may be implemented using the master solar panel 530a and the slave solar panel 530b. The master solar panel 530a includes a master AC inlet receptacle 330a, a master AC outlet receptacle 390a, a master controller 360a, and a master DC to AC converter 370a. The slave solar panel 530b includes a slave AC inlet receptacle 330b, a slave AC outlet receptacle 390b, a slave controller 360b, and a slave DC to AC converter 370b. The master solar panel 530a and the slave solar panel 530b are coupled together by the AC bus 550. The master solar panel 530a and the slave solar panel 530b share many similar features with the solar panel 100, the plurality of solar panels 100(a-n), the solar panel 300, and the solar panel 400; therefore, only the differences between the solar panel configuration 500 and the solar panel 100, the plurality of solar panels 100(a-n), the solar panel 300, and the solar panel 400 will be discussed in further detail.

As mentioned, the solar panel 530a operates as the master and the solar panel 530b operates as the slave. However, as discussed in detail above, the solar panel 530a and 530b may operate as either the master or slave depending on whether input AC power is applied to the respective AC inlet receptacle of each. The master solar panel 530a may apply a constant voltage to an AC bus 550 that is coupling the AC inlet receptacle 330a and the AC outlet receptacle 390a of the master solar panel 530a to the AC inlet receptacle 330b and the AC outlet receptacle 390b of the slave solar panel 530b to maintain the paralleled output AC power generated by the solar panel configuration 500. The slave solar panel 530b may increase the current applied to the AC bus 550 when the voltage of the AC bus 550 decreases below the reference voltage due to an external electronic device being coupled to the solar panel configuration 500. The slave solar panel 530b may increase the current applied to the AC bus 550 so that the voltage of the AC bus 550 is increased back to the reference voltage so that the paralleled output AC power is maintained to adequately power the external electronic device.

After the master solar panel 530a has synchronized with the slave solar panel 530b, the external input AC power 112a is in parallel with the output AC power 195a and the output AC power 195b generating the paralleled output AC power. The paralleled output AC power may be accessed by coupling the external electronic device to the master AC outlet receptacle 390a and/or the slave AC outlet receptacle 390b. The AC bus 550 may provide an access point to the paralleled output AC power for the master controller 360a and the slave controller 360b to monitor.

The master controller 360a may initially instruct the master DC to AC converter 370a with a master power conversion signal 365a to provide a constant master voltage 560a to the AC bus 550 to maintain the paralleled output AC power at a specified level. The specified level may be the maximum output AC power that may be generated by the power converter configuration 500 with the external input AC power 112a in parallel with the output AC power 195a and the output AC power 195b. However, the specified level may be lowered based on the constant master voltage 560a supplied by the master DC to AC converter 370a to the AC bus 550. The specified level may be associated with the reference voltage of the paralleled output AC power. As noted above, the reference voltage of the paralleled output AC power is the voltage level that is to be maintained to generate the paralleled output AC power that is sufficient to power the external electronic device.

After an external electronic device is coupled to the master AC outlet receptacle 390a and/or the slave AC outlet receptacle 390b, the paralleled output AC power may temporarily decrease due to the load applied to the AC bus 550 by the external electronic device. The slave controller 360b may monitor the AC bus 550 with a slave AC bus monitoring signal 570b to monitor the voltage of the AC bus 550 to determine whether the voltage has decreased below the reference voltage of the AC bus 550 which in turn indicates that the paralleled output AC power has decreased below the specified level. The slave controller 360b may then instruct the slave DC to AC converter 370b with a slave power conversion signal 365b to increase the slave current 580b that is provided to the AC bus 550 when the slave controller 360b determines that the voltage of the AC bus 550 decreases after the external electronic device is coupled to the master AC outlet receptacle 390a and/or the slave AC outlet receptacle 390b. The slave current 580b may be increased to a level sufficient to increase the voltage of the AC bus 550 back to the reference voltage. Increasing the voltage of the AC bus 550 back to the reference voltage also increases the paralleled output AC power so that the paralleled output AC power is reinstated to the specified level with a minimal lapse in time. The maintaining of the paralleled output AC power at the specified level prevents a delay in the powering of the external electronic device.

The slave controller 360b may continue to monitor voltage of the AC bus 550 with the slave AC bus monitoring signal 570b to ensure that the voltage of the AC bus 550 does not decrease below the reference voltage. The slave controller 360b may continue to instruct the slave DC to AC converter 370b with the slave power conversion signal 365b to increase or decrease the slave current 580b accordingly based on the voltage of the AC bus 550 to maintain the paralleled output AC power at the specified level.

The slave DC to AC converter 370b may continue to provide the slave current 580b to the AC bus 550 until the slave DC to AC converter 370b no longer has the capability to provide the slave current 580b at the level necessary to maintain the voltage of the AC bus 550 at the reference voltage. For example, the slave DC to AC converter 370b may continue to provide the slave current 580b to the AC bus 550 until the DC source of the slave power converter 530b is drained to the point where the slave DC to AC converter 370b can no longer provide the slave current 580b at the level sufficient to maintain the voltage of the AC bus 550 at the reference voltage.

The master controller 360a also monitors the AC bus 550 with a master AC bus monitoring signal 570a. The master controller 360b monitors the AC bus 550 to determine when the voltage of the AC bus 550 decreases below the reference voltage for a period of time and is not increased back to the reference voltage. At that point, the master controller 360a may recognize that the slave DC to AC converter 370b is no longer generating slave current 580b at the level sufficient to maintain the voltage of the AC bus 550 at the reference voltage. The master controller 360a may then instruct the master DC to AC converter 370a with the master power conversion signal 365a to increase the master current 580a to a level sufficient to increase the voltage of the AC bus 550 back to the reference voltage so that the paralleled output AC power may be maintained at the specified level. As a result, a delay in the powering of the external electronic device may be minimized despite the draining of the DC source of the slave power converter 530b.

Figure 5:
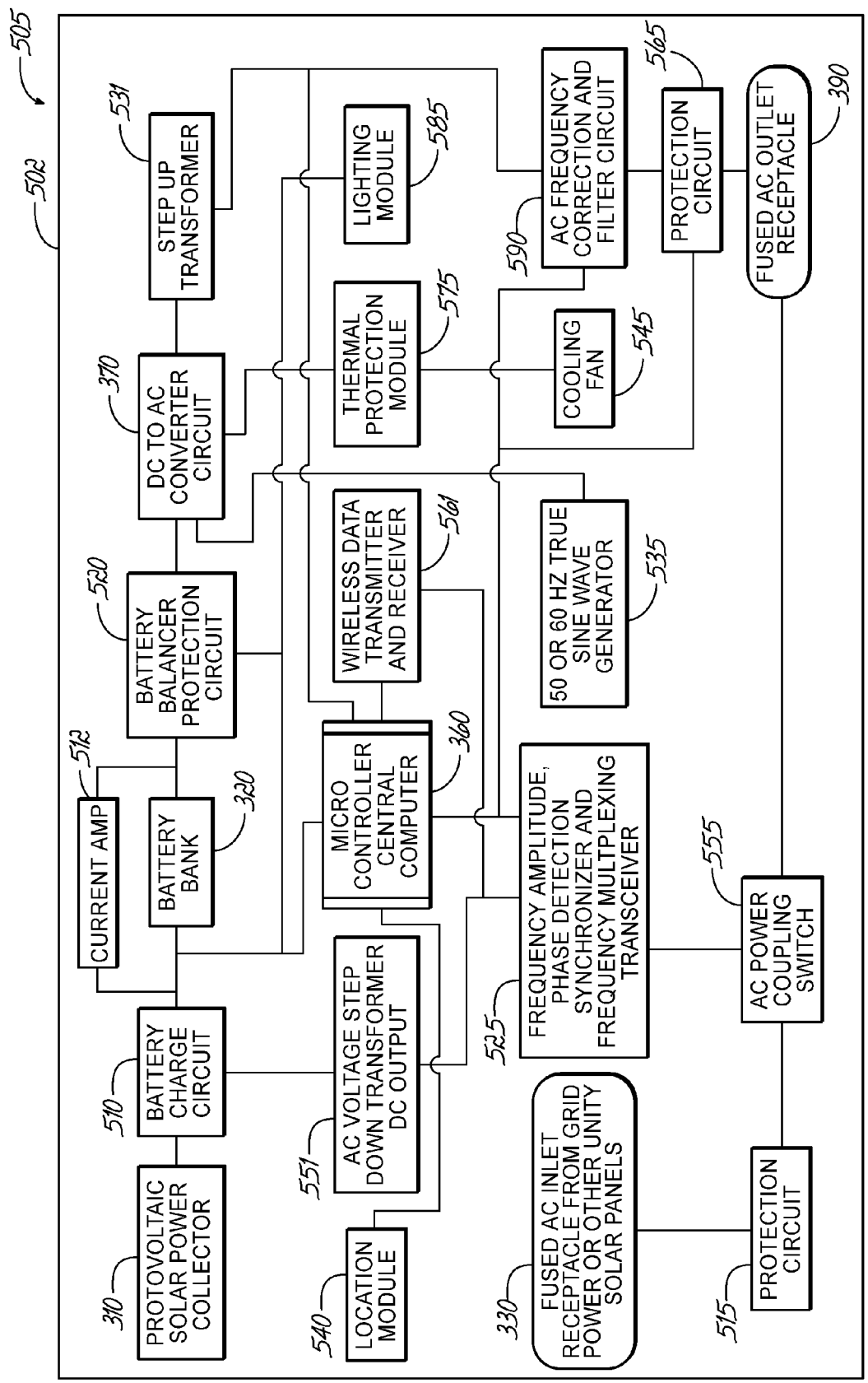
FIG. 5 is a block diagram of an exemplary solar panel that may be used in the solar panel configuration according to an exemplary embodiment of the present disclosure.

FIG. 5 is a block diagram of another exemplary solar panel 505 that may be used in the solar panel configuration 200 according to an exemplary embodiment of the present disclosure. Although, FIG. 5 depicts a block diagram of the solar panel 505, one of ordinary skill in the art will recognize that FIG. 5 may also depict a block diagram of one of the plurality of panels 100a through 100n used in the solar panel configuration 200 depicted in FIG. 2 as well as the solar panel 100 depicted in FIG. 1. The features depicted in the block diagram of the solar panel 300 and 400 may also be included in the solar panel 505 but have been omitted for simplicity.

The solar panel 505 may be implemented using the solar power collector 310, a battery charge circuit 510, a current amplifier 512, the battery bank 320, a battery balancer protection circuit 520, a step up transformer 531, a location module 540, an AC voltage step down transformer DC output 551, a wireless data transmitter and receiver 561, a thermal protection module 575, an integrated light source module 585, an AC frequency correction and filter circuit 590, a protection circuit 515, a fused AC inlet receptacle from grid power or other unity solar panels 330, a micro controller central computer 360, the DC to AC converter circuit 370, a frequency, amplitude, phase detection synchronizer and frequency multiplexing transceiver 525, a 50 or 60 Hertz ("Hz") true sine wave generator 535, a cooling fan 545, a protection circuit 565, an AC power coupling switch 555, and a fused AC outlet receptacle 390, each of which are enclosed within a housing for the solar panel 505.

The battery charge circuit 510 may include passive and/or active circuitry as well as integrated circuits to control and/or regulate the charging of the battery bank 320 included within the solar panel 505. The battery charge circuit 510 may have bidirectional communication with a computing device, such as controller 360. The controller 360 may also control the battery charge circuit 510. The current amplifier 512 may increase the output current of the solar panel and assist in charging the battery bank 320.

The battery balancer protection circuit 520 is disposed within the housing 502 of the solar panel 505. The battery balancer protection circuit 520 may include passive and/or active circuitry as well as integrated circuits that may be controlled by the controller 360. The battery balancer protection circuit 520 may be used to ensure safe discharge and recharge of the individual cells within the battery bank 320.

The solar panel 505 may further include a location module 540. The location module 540 may include one or several location sensors such as but not limited to a global positioning system ("GPS"), a compass, a gyroscope, an altitude, and/or any other location sensor digital media file that will be apparent to those skilled in the relevant art(s) without departing from the spirit and scope of the disclosure. The location module 540 may be used to send data to the controller 360 through the wireless data transmitter and receiver 561 to an external personal computing device.

The AC voltage step down transformer 551 is included in the solar panel 505. The step down transformer 551 may be used to charge the battery bank 320 from the AC inlet receptacle 330 through the battery charge circuit 510. The step down transformer 551 may include iron, steel, ferrite, or any other materials and fashioned specifically to satisfy power requirements for charging the battery bank 320. The step down transformer 551 may also have a filtered DC output.

As discussed above, the solar panel 505 includes a computing device such as the controller 360. The controller 360 may be used to control and/or monitor the solar panel 505. The controller 360 may be a single or multiple processor based and may be able to receive software and/or firmware updates wirelessly through the associated wireless data transmitter and receiver 561 or through a hardware connection such as the frequency multiplexing transceiver 525. The controller 360 may be connected to any part of the solar panel 505 for central control, remote control, general monitoring, and/or data collection purposes. The wireless data transmitter and receiver 561 may use Bluetooth, Wi-Fi, cellular, and/or any other acceptable radio frequency data transmissions and reception techniques that will be apparent to those skilled in the relevant art(s) without departing from the spirit and scope of the disclosure. The transmitter and receiver 561 may be used to transmit data from the solar panel 505 to one or more external personal computing devices.

The solar panel 505 includes a thermal protection module 575. The thermal protection module 575 includes one or more sensors positioned in one or more locations throughout any part of the solar panel 505 for the purpose of temperature monitoring. The thermal protection module 575 is connected to the controller 360 and may be used to transmit data from the solar panel 505 to external personal computing devices.

As shown, the solar panel 505 may include the integrated light source 585. The integrated light source 585 may include one or more integrated lights inside or disposed on an exterior surface of the housing of the solar panel 505 and may be used as a light source. The integrated lights may vary in color, intensity, color temperature size, frequency, and/or brightness. The integrated light source 585 may be coupled to the controller 360. The integrated light source 585 may be used to transmit data from the solar panel 505 to external personal computing devices.

The solar panel 505 further includes a grid frequency, amplitude, power phase detection synchronizer and frequency multiplexing transceiver 525, which may synchronize multiple AC power sources and transmit data between one or more solar panels 505 via a standard AC power line.

The solar panel 505 further includes a frequency generator, such as a 50 Hz or 60 Hz true sine wave generator 535. The frequency generator may also be other types of generators configured to output a signal at a particular reference frequency. The sine wave generator 535 may provide a sine wave reference to the DC to AC converter 370. The sine wave generator 535 may be coupled to the controller 360 as well as the grid frequency, amplitude, power phase detection synchronizer and frequency multiplexing transceiver 525. Moreover, the sine wave generator 535 may include analog and/or digital circuitry.

The solar panel 505 may further include a cooling fan 545 disposed within the housing of the solar panel 505. The cooling fan 545 may include one or more cooling fans arranged in a way that best ventilates an interior at least partially formed by the housing of the solar panel 505 in which one or more components are disposed. The cooling fan 545 may be coupled to the thermal protection module 575 and/or the controller 360.

Furthermore, the solar panel 505 includes an AC frequency correction and filter circuit 590. The frequency correction and filter circuit 590 may be controlled by the controller 360 through the 50 Hz or 60 Hz true sine wave generator 535. In addition, the frequency correction and filter circuit 590 may receive AC power from the step up transformer 531 and may output corrected and filtered AC power to a protection circuit 515 of the solar panel 505. The protection circuit 515 provides surge and fuse protection and may be controlled and monitored by the controller 360.

Moreover, the solar panel 505 has an AC coupling switch 555 that is configured to couple the AC power from the AC inlet receptacle 330 with AC grid equivalent power generated by the solar panel 505 such that synchronized AC power from the AC inlet receptacle 330 and the solar panel 505 are coupled together for output from the AC outlet receptacle 390. The AC coupling switch 555 may be controlled by the controller 360 in conjunction with the grid frequency, amplitude, power phase detection synchronizer and frequency multiplexing transceiver 525.

Figure 6:
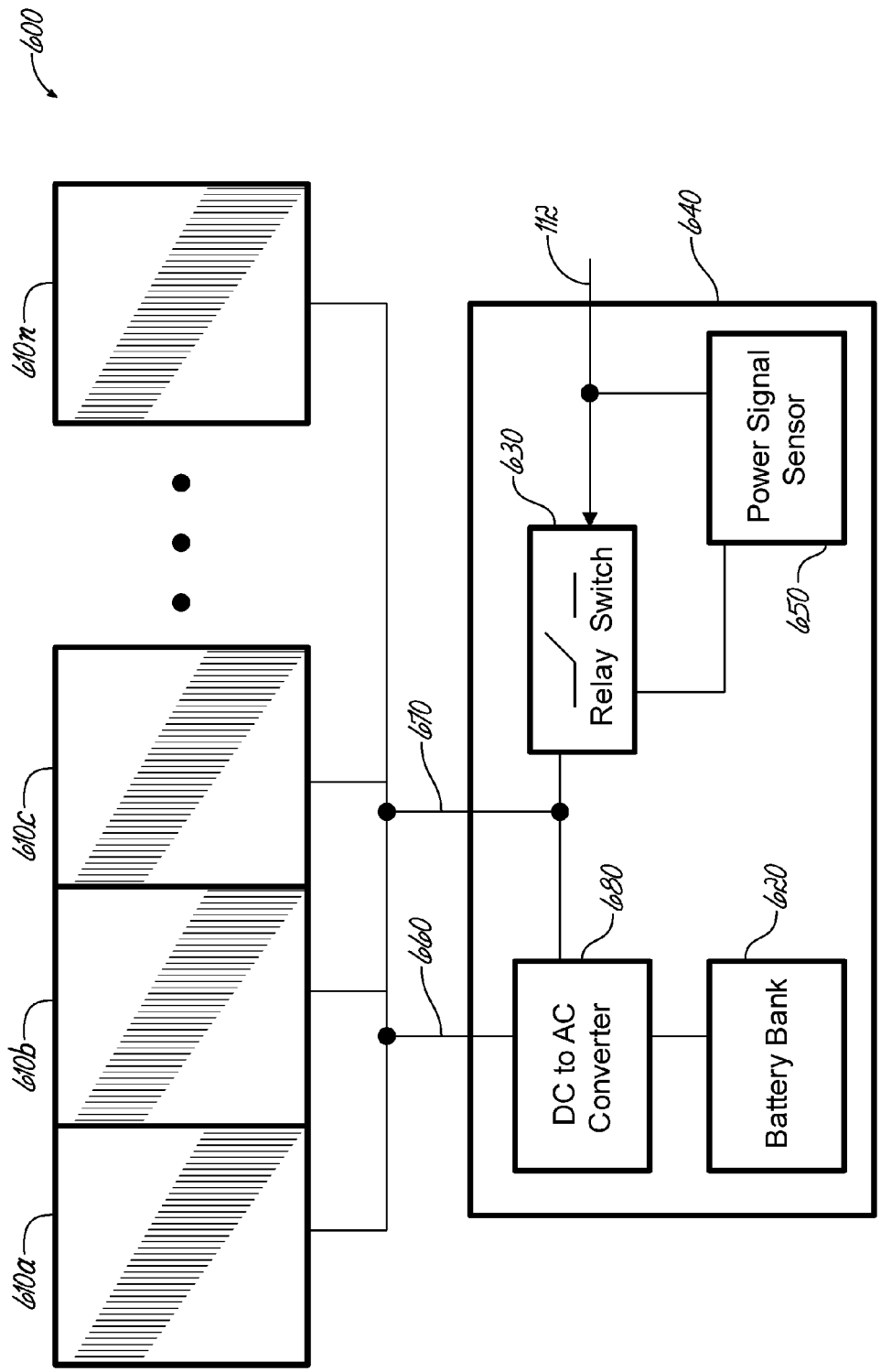
FIG. 6 is a block diagram of an exemplary solar panel configuration according to an exemplary embodiment of the present disclosure.

FIG. 6 illustrates a block diagram of another exemplary solar panel configuration according to an exemplary embodiment of the present disclosure. The solar panel configuration 600 includes a plurality of solar panels 610a through 610n that may be daisy chained together and coupled to a grid-tie system 640 to form the solar panel configuration 600, where n is an integer greater than or equal to one. The grid-tie system 640 monitors the input AC power 112 that is generated by the grid to determine whether the power grid remains stable to generate the input AC power 112. The grid-tie system 640 instructs the battery bank 620 to provide converted AC power 660 to the plurality of solar panels 610a through 610n when the grid tie system 640 determines that the power grid has failed. Thus, the grid-tie system 640 provides back up power to the plurality of solar panels 610a through 610n when the grid fails.

The grid-tie system 640 includes the battery bank 620, a relay switch 630, a DC to AC converter 680, and a power signal sensor 650. The solar panel configuration 600 shares many similar features with the solar panel 100, the plurality of solar panels 100a through 100n, the solar panel 300, the solar panel 400, the solar panel 500, and the solar panel configuration 200, and as such, only the differences between the solar panel configuration 600 and the solar panel 100, the plurality of solar panels 100a through 100n, the solar panel 300, the solar panel 400, the solar panel 500, and the solar panel configuration 200 are to be discussed in further detail.

The plurality of solar panels 610a through 610n may include larger solar panels with larger capacities to capture solar energy and convert the captured solar energy into DC power that may be stored in the battery bank 620. The grid-tie system 640 may automatically link the plurality of solar panels 610a through 610n to the input AC power 112 when the grid-tie system 640 is grid tied. The grid-tie system 640 may also automatically provide the converted AC power 660 to the plurality of solar panels 610a through 610n when the grid-tie system 640 is no longer grid tied such that the input AC power 112 is no longer available to the plurality of solar panels 610a through 610n.

Each of the plurality of solar panels 610a through 610n may be updated as to the status of the grid. For example, the plurality of solar panels 610a through 610n may be updated when the grid fails via a signal that is transmitted through the AC power line of the grid.

In another embodiment, the grid-tie system 640 may control the converted AC power 660 so that the DC power stored in the battery bank 620 is not depleted from the use of the converted AC power 660. For example, the grid-tie system 640 may dial back the use of the converted AC power 660 from maximum capacity to conserve the DC power stored in the battery bank 620.

The grid-tie system 640 includes a relay switch 630. The relay switch 630 transitions into an open state (logic 0) when the grid fails and is no longer providing the input AC power 112 to the grid-tie system 640 so that the grid-tie system 640 may be substantially disconnected from the grid. The grid-tie system 640 immediately instructs the DC to AC converter 680 to convert the DC power stored in the battery bank 620 to begin providing the converted AC power 660 to the plurality of solar panels 610a through 610n to replace the input AC power 112 no longer supplied to the grid-tie system 640. The converted AC power 660 may include power signal characteristics that have already been synchronized with the power signal characteristics included in the input AC power 112 before the grid went down. For example, the converted AC power 660 may include a frequency, phase, amplitude, voltage and/or current that is substantially similar to the frequency, phase, amplitude, voltage and/or current of the input AC power 112. As a result, the plurality of solar panels 610a through 610n fail to recognize that the grid has failed and is no longer providing the input AC power 112 to the grid tie system 640.

After the grid fails, the power signal sensor 650 continues to sense the power signal characteristics on the failed side of the relay switch 630. For example, the power signal sensor 650 continues to sense the voltage, current, frequency, and/or phase on the failed side of the relay switch 630. As the grid begins to come back up, the power signal sensor 650 recognizes that the power signal characteristics on the failed side of the relay switch 630 are beginning to show that the grid is coming back up. As the grid stabilizes, the grid tie system 640 begins to adjust the power signal characteristics of the converted AC power 660 to become substantially equivalent to the power signal characteristics of the input AC power 112 being sensed by the power signal sensor 650. For example, the grid tie system 640 synchronizes the converted AC power 660 so that the frequency, phase, amplitude, voltage, and current of the converted AC power 660 becomes substantially equivalent to the frequency, phase, amplitude, voltage, and current of the of the input AC power 112 being sensed by the power signal sensor 650.

After the power signal characteristics of the converted AC power 660 are substantially equivalent to the power signal characteristics of the input AC power 112, the grid tie system 640 transitions the relay switch 630 into a closed position (logic 1). The plurality of solar panels 610a through 610n are then no longer running off of the converted AC power 660 but are rather running off of the input AC power 112 provided by the grid.

Figure 7:
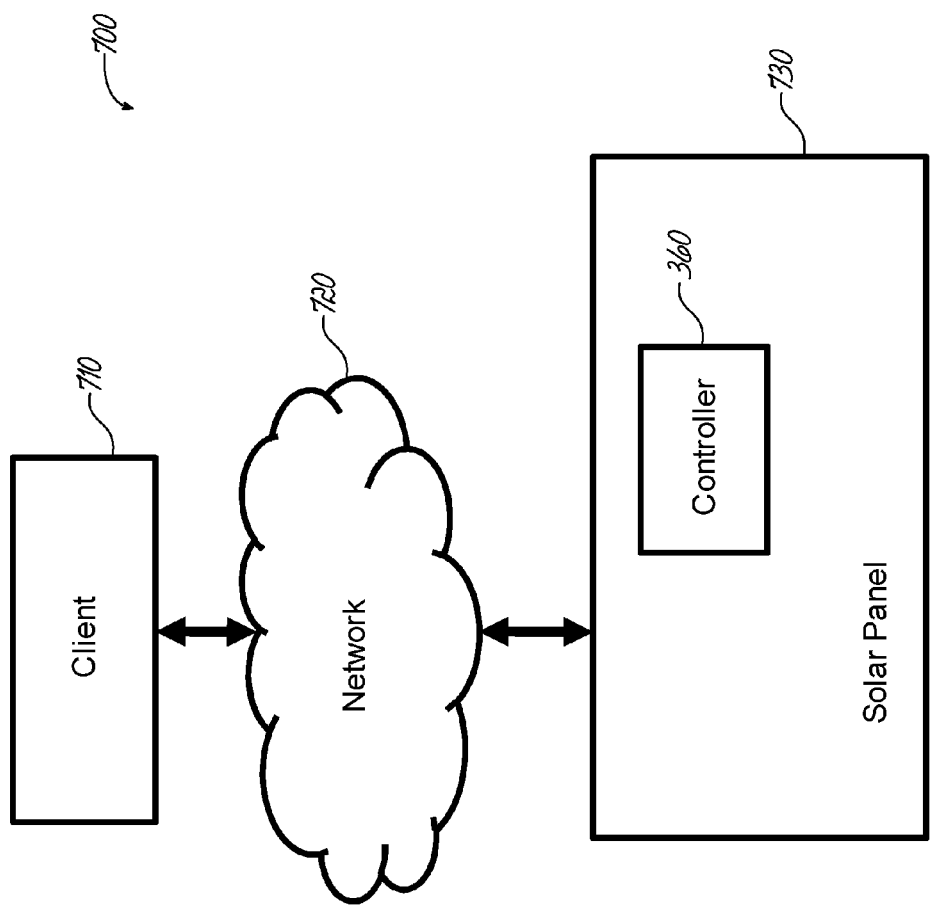
FIG. 7 illustrates a wireless solar panel configuration.

FIG. 7 shows an illustration of a wireless solar panel configuration 700. The wireless solar panel configuration 700 includes a client 710, a network 720, and a solar panel 730.

One or more clients 710 may connect to one or more solar panels 730 via network 720. The client 710 may be a device that includes at least one processor, at least one memory, and at least one network interface. For example, the client may be implemented on a personal computer, a hand held computer, a personal digital assistant ("PDA"), a smart phone, a mobile telephone, a game console, a set-top box, and the like.

The client 710 may communicate with the solar panel 730 via network 720. Network 720 includes one or more networks, such as the Internet. In some embodiments of the present invention, network 720 may include one or more wide area networks ("WAN") or local area networks ("LAN"). Network 720 may utilize one or more network technologies such as Ethernet, Fast Ethernet, Gigabit Ethernet, virtual private network ("VPN"), remote VPN access, a variant of IEEE 802.11 standard such as Wi-Fi, and the like. Communication over network 720 takes place using one or more network communication protocols including reliable streaming protocols such as transmission control protocol ("TCP"). These examples are illustrative and not intended to limit the present invention.

The solar panel 730 includes the controller 360. The controller 360 may be any type of processing (or computing) device as described above. For example, the controller 360 may be a workstation, mobile device, computer, and cluster of computers, set-top box, or other computing device. The multiple modules may also be implemented on the same computing device, which may include software, firmware, hardware, or a combination thereof. Software may include one or more application on an operating system. Hardware can include, but is not limited to, a processor, memory, and a graphical user interface ("GUI") display.

The client 710 may communicate with the solar panel 730 via network 720 to instruct the solar panel 730 as to the appropriate actions to take based on the time of the day, weather conditions, travel arrangements, energy prices, etc. For example, the client 710 may communicate with the solar panel 730 to instruct solar panel 730 to charge its batteries via the input AC power provided by the grid during times of the day in when the sunlight is not acceptable. In another example, the client 710 may communicate with the solar panel 730 via network 720 to instruct the solar panel 730 to operate off of the DC power provided by the internal batteries included in the solar panel 730 during peak utility hours. In such an example, the client 710 may communicate with the solar panel 730 to charge its internal batteries from the solar energy captured by the solar panel 730 during off peak hours while the solar panel 730 relies on the input AC power provided by the grid. The client 710 may then communicate with the solar panel 730 to run off of its charged internal batteries during peak hours when the grid is stressed. In another embodiment, the client 710 may communicate with the solar panel 730 via network 720 to receive status updates of the solar panel 730.

The solar panel 730 may also include a GPS. The client 710 may communicate with the solar panel 730 via network 720 to analyze the GPS coordinates of the solar panel 730 and adjust the solar panel 730 so that the solar panel 730 may face the sun at an angle that maximizes the solar energy captured.

The solar panel 730 may also include a tilt mechanism that is built into its back that has a stepper motor that adjusts the angle of solar panel 730 to maximize its exposure to solar energy.

The client 710 may also remotely control the output AC power of the solar panel 730 via the network 720. Hence, the client 710 may dial back the output AC power of the solar panel 730 so that the DC power stored in the battery bank of the solar panel 730 is not depleted.

In one embodiment, the client 710 may obtain information regarding the solar panel 730 via the network 720 that may include but is not limited to energy produced by the solar panel 730, energy consumed by the solar panel 730, the tilt of the solar panel 730, the angle of the solar panel 730, the GPS coordinates of the solar panel 730, and any other information regarding the solar panel 730 that may be communicated to the client 710 via the network 720 that will be apparent to those skilled in the relevant art(s) without departing from the spirit and scope of the disclosure.

Figure 8:
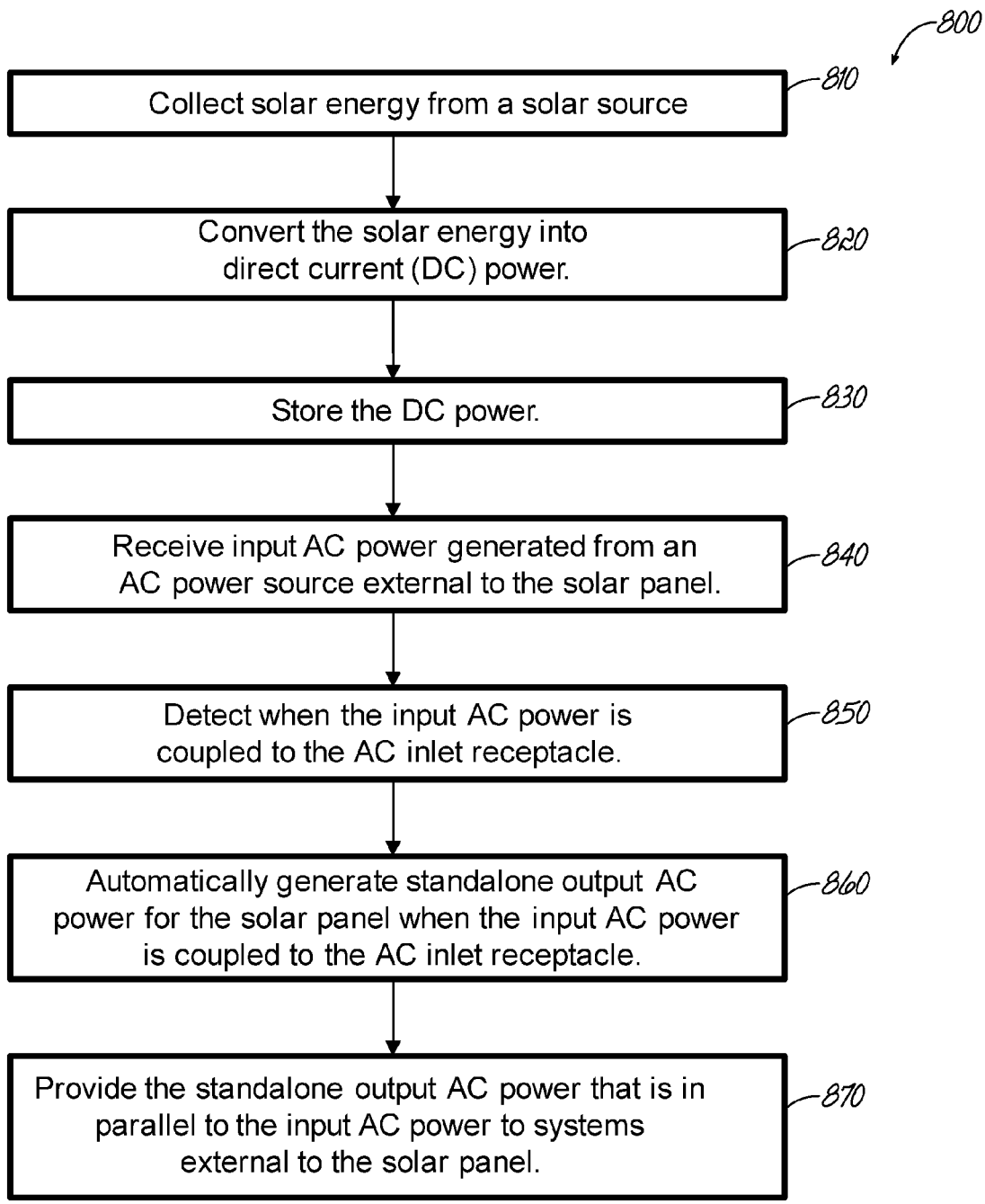
FIG. 8 is a flowchart of exemplary operational steps of the solar panel according to an exemplary embodiment of the present disclosure.

FIG. 8 is a flowchart of exemplary operational steps 800 of the solar panel according to an exemplary embodiment of the present disclosure. The present disclosure is not limited to this operational description. Rather, other operational control flows may also be within the scope and spirit of the present disclosure. The following discussion describes the steps in FIG. 8.

At step 810, the photovoltaic solar power collector 310 collects solar energy from a solar source.

At step 820, the collected solar energy is converted into captured DC power 305.

At step 830, the captured DC power 305 is stored in a battery bank 320.

At step 840, the AC inlet receptacle 330 receives input AC power 112 generated from an AC power source external to the solar panel, for example, by the electric utility grid.

At step 850, the power signal sensor 340 detects when the input AC power 112 is coupled to the AC inlet receptacle 330.

At step 860, if the power signal sensor 340 detects input AC power 112, then standalone output AC power 195 for the solar panel that is in parallel to the input AC power 112 is automatically generated.

At step 870, the standalone output AC power 195 that is in parallel to the input AC power 112 is provided to systems external to the solar panel.

Figure 9:
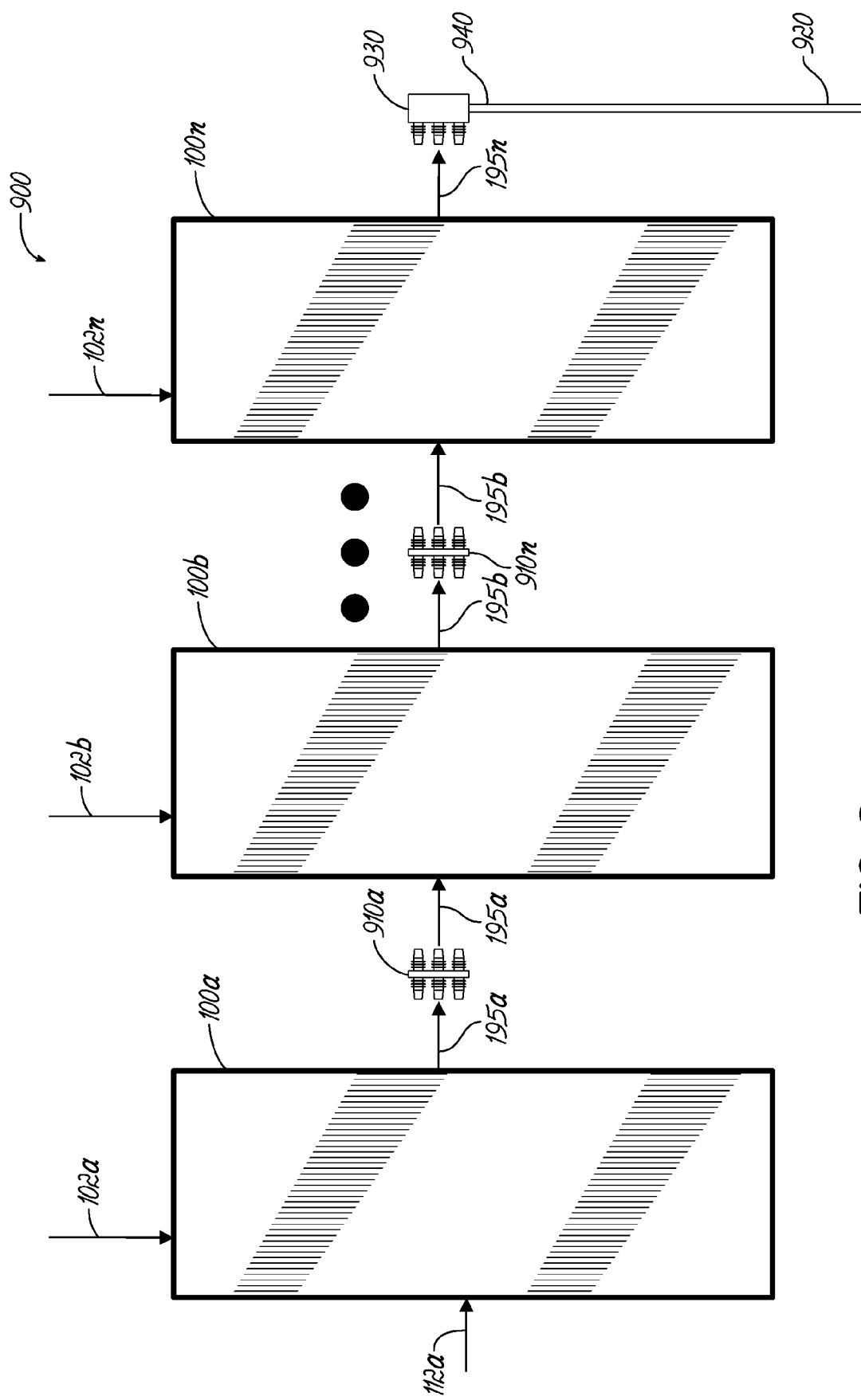
FIG. 9 is a top-elevational view of a solar panel connector configuration according to an exemplary embodiment of the present disclosure.

FIG. 9 illustrates a top-elevational view of a solar panel connector configuration according to an exemplary embodiment of the present disclosure. The solar panel connector configuration 900 represents a solar panel connector configuration that includes a plurality of solar panels 100(*a-n*) that may be daisy chained together to form the solar panel connector configuration 900, where n is an integer greater than or equal to two. Each solar panel 100(*a-n*) that is added to the solar panel connector configuration 900 may generate the output AC power 195*n* that is in parallel with the output AC power 195*a* and the output AC power 195*b* of the solar panel connector configuration 900. Each solar panel 100(*a-n*) may be connected to each other via a plurality of solar panel connectors 910(*a-n*) where n is an integer greater than or equal to one. Each solar panel connector 910(*a-n*) transitions the output AC power 195(*a-n*) from the output of each respective solar panel 100(*a-n*) to the input of each respective solar panel 100(*b-n*). For example, the solar panel connector 910*a* transitions the output AC power 195*a* from the output of solar panel 100*a* to the input of solar panel 100*b* and the solar panel connector 910*n* transitions the output AC power 195*b* from the output of solar panel 100*b* to the input of solar panel 100*n*. An end cable 920 receives the output AC power 195*n* from the final solar panel 100*n* in the solar panel connector configuration 900.

Conventional solar panel configurations include solar panels that are daisy chained together by numerous conventional wires connecting each solar panel. Numerous conventional wires are required to properly daisy chain the power generated by each solar panel to provide output power. Numerous conventional wires are also required for data communication between each solar panel. The numerous conventional wires are typically tie wrapped and are positioned strategically between solar panels.

The amount of wires required to daisy chain solar panels together in conventional solar panel configurations add difficulty in the installation process. The many wires must be properly positioned to minimize the structural stress on the structure supporting the conventional solar panel configuration. Additional time is also required during installation to properly install the solar panels. Installers of the solar panels have to properly position and tie wrap the wires for each solar panel to minimize the risk of any damage that may result. The additional time spent to position the numerous conventional wires is significant and adds to the time required to complete the installation process using the numerous conventional wires.

The amount of wire is also a safety hazard. Structural failures can occur when the wires are not properly positioned. For example, the structure supporting the daisy chain of solar panels may fail causing damage and/or injury when the weight of the wires is not properly distributed. Electrical damage may also occur when the wires are not properly positioned. Structural stress on the wires and/or from improperly positioning the wires may also result in an electrical reaction between two or more wires.

The many wires also hinder the overall efficiency of the conventional daisy chained solar panel configuration. The routing of power through the wires decreases the overall power efficiency because of power loss Many wires may also hinder mobility in moving the conventional daisy chained solar panel configuration. The difficulty that results from properly positioning many wires deters installers from disassembling the solar panels and then reassembling the solar panels in a conventional daisy chain configuration in a different location.

The solar panel connectors 910(*a-n*) eliminates the need for the numerous conventional wiring assembly. The solar panel connectors 910(*a-n*) simplify the connection of the solar panels 100(*a-n*) to a three conductor configuration. The solar panel connectors 910(*a-n*) properly daisy chain the output AC power 195(*a-n*) to properly parallel the output power 195*a* and 195*b* to the output AC power 195*n*. The solar panel connectors 910(*a-n*) may also provide data communication between each of the solar panels 100(*a-n*).

The simplification of the connection of the solar panels 100(*a-n*) from numerous conventional wires to a single three conductor configuration embodied in the solar panel connectors 910(*a-n*) eliminates the burden required in installing the solar panels 100(*a-n*). Rather than having to address the structural issues that result from positioning a lot of wires, a single solar panel connector 910(*a-n*) connects each solar panel 100(*a-n*) eliminating the need for numerous conventional wires. Eliminating these wires eliminates the structural issues associated with the conventional daisy chain configuration. The single solar panel connector 910(*a-n*) does not have a structural burden on the conventional daisy chain configuration. Further, the time required during installation using the three conductor configuration of the solar panel connectors 910(*a-n*) is also minimized. No longer does the installer have to spend significant time properly positioning the wires and tie wrapping them. The simplicity of the single solar panel connector 910(*a*) used to connect two solar panels 100*a* and 100*b* requires the installer to plug in the solar panel connector 910*a* into the output of the solar panel 100*a* and the input, of the solar panel 100*b*.

The three conductor configuration of the solar panel connectors 910(*a-n*) also improves the safety of the solar panel connector configuration 900. With the need for the numerous conventional wires eliminated, the risk associated with electrical damage that may occur with the improper positioning of the numerous conventional wires is reduced. The three conductor configuration of the solar panel connectors 910(*a-n*) eliminates the electrical damage that may have resulted from the structural damage caused by the numerous conventional wires. The three conductor configuration also eliminates the electrical damage that may have resulted from the improper positioning of the numerous conventional wires.

The three conductor configuration of the solar panel connectors 910(*a-n*) also improves the overall efficiency of the solar panel connector configuration 900. The simplification of the numerous conventional wires to the three conductor configuration of the solar panel connectors 910(*a-n*) decreases the amount of wires required to transfer power from solar panel to solar panel which decreases the amount of power that is lost during the transfer. The power efficiency may be optimized with the three conductor configuration of the solar panel connector 910(*a-n*) due to the minimizing of the connection to a three conductor configuration provided by a single connector.

The three conductor configuration of the solar panel connectors 910(*a-n*) also provides mobility to the solar panel connector configuration 900. Due to the ease of simply installing each solar panel connector 910(*a-n*) between each respective solar panel 100(*a-n*), installers may be much more inclined to disassemble the solar panel connector configuration 900 and move the solar panel connector configuration 900 to a different location. Reassembling the solar panel connector configuration 900 in the different location simply requires the installation of the solar panel connectors 910(*a-n*) between each respective solar panel 100(*a-n*) providing ease in mobility.

The three conductor configuration of the solar panel connectors 910(*a-n*) may be compatible in connecting output AC power 195*a* from solar panel 100*a* to solar panel 100*b* and connecting output AC power 195*b* from solar panel 100*b* to solar panel 100*n*. However, the three conductor configuration of the solar panel connectors 910(*a-n*) may also be capable of connecting DC power to DC power without any additional modifications to the solar panel connectors 910(*a-n*). The three conductor configuration of the solar panel connectors 910(*a-n*) may also provide data communication between the solar panels 100(*a-n*). For example, the three conductor configuration may support power line modem technology ("PLM") data communication between the solar panels 100(*a-n*). The three conductor configuration may support various forms of data communication between the solar panels 100(*a-n*) without departing from the spirit and scope of the disclosure. The compatibility of the solar panel connectors 910(*a-n*) with both AC power and DC power and also in supporting data communication provides additional simplicity in connecting solar panels.

As further shown in FIG. 9, the solar panel connectors 910(*a-n*) properly daisy chain the solar panels 100(*a-n*) to parallel the output AC power 195*a* and 195*b* so that the overall output AC power of the solar panel connector configuration 900 is increased. In daisy chaining the solar panels 100(*a-n*), the power input for the solar panel 100*b* is coupled to the power output of the solar panel 100*a* via the solar panel connector 910*a* so that the input AC power 195*a* received by the solar panel 100*b* is substantially equivalent to the output AC power 195*a* of the solar panel 100*a*. Further, the power input for the solar panel 100*n* is coupled to a power output of the solar panel 100*b* via solar panel connector 910*n* so that the input AC power 195*b* received by the solar panel 100*n* is substantially equivalent to the output AC power 195*b* of the solar panel 100*b*.

After the solar panel connectors 910(*a-n*) have been properly inserted to electrically connect the solar panels 100(*a-n*), respectively, the three conductors included in each of the solar panel connectors 910(*a-n*) engage AC characteristics to electrically connect the AC power transferred between each of the solar panels 100(*a-n*). A first conductor becomes a hot connection, a second conductor becomes a ground connection, and a third conductor becomes a neutral connection so that the AC power is properly transferred between each of the solar panels 100(*a-n*). The hot connection, the ground connection, and the neutral connection enable the transfer of the AC power between each of the solar panels 100(*a-n*) so that the AC power is not degraded and/or decreased during the transfer between the solar panels 100(*a-n*).

As noted above, each output AC power 195(*a-n*) may be paralleled to increase the overall output AC power of the solar panel connector configuration 900. The end cable 920 may be positioned at the output of the final solar panel 100*n* in the solar panel connector configuration 900 to transfer the overall output AC power represented by the output AC power 195*n* to a second configuration that requires the overall output AC power. The end cable 920 includes a connector 930 similar to that of the solar panel connectors 910(*a-n*). The connector 930 includes a three conductor configuration that can accept the output AC power 195*n* from the solar panel 100*n*. Cable 940 may be coupled to the connector 930 and also includes a three conductor configuration that can properly transfer the output AC power 195*n* to a second configuration without any degradation and/or power loss in the output AC power 195*n*. For example, cable 940 may be coupled to an electric stove so that the paralleled output AC power 195*n* is properly transferred by the cable 940 to the electric stove. In another example, cable 940 is coupled to a breaker box so that the solar panel connector configuration 900 is grid tied. Although the solar panel connector configuration 900 depicts three solar panels 100(*a-n*) that are connected by the solar panel connectors 910(*a-n*), any quantity of solar panels 100(*a-n*) may be connected by any quantity of solar panel connectors 910(*a-n*) in a similar fashion as discussed in detail above that will be apparent to those skilled in the relevant art(s) without departing from the spirit and scope of the disclosure.

Figure 10:
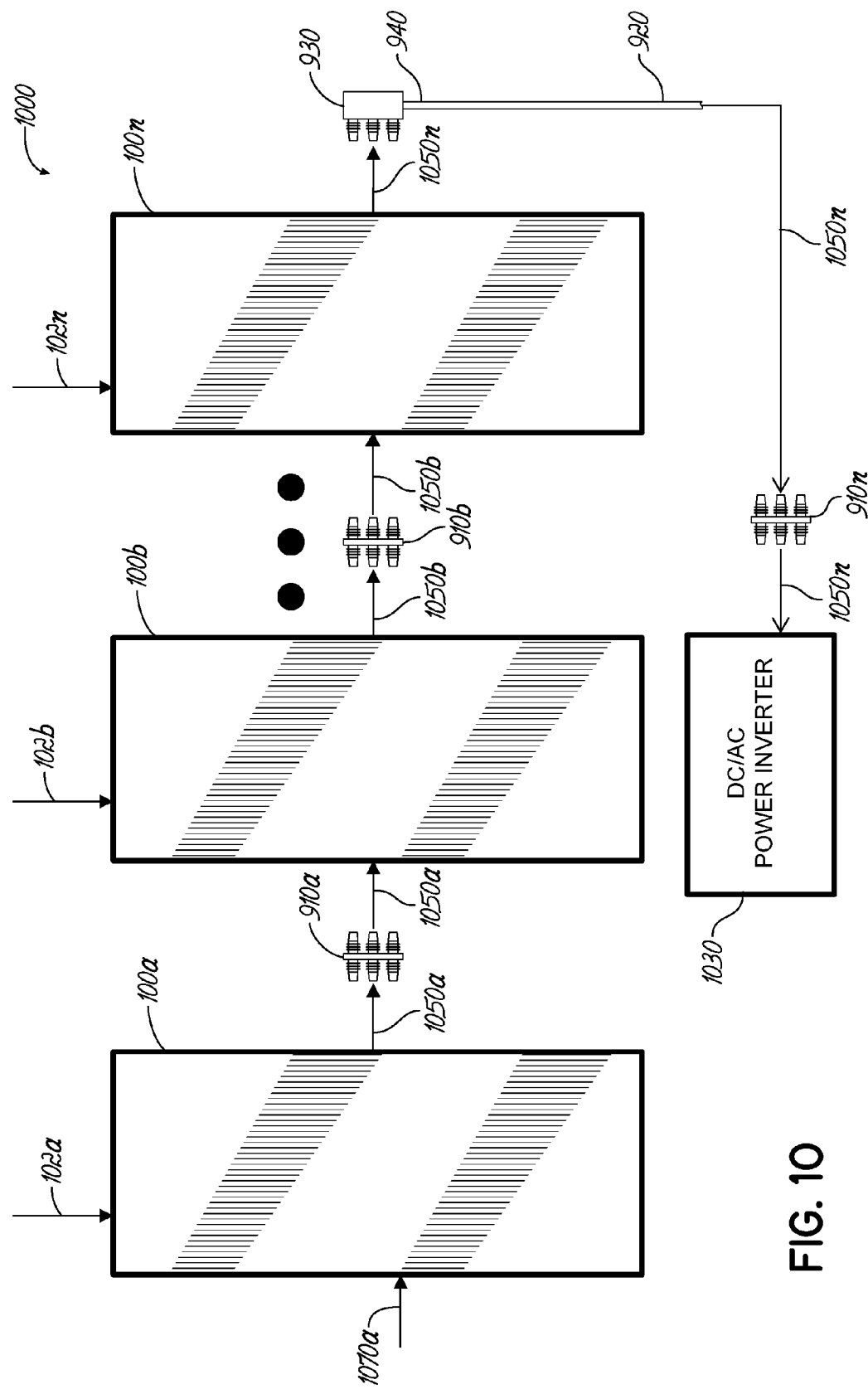
FIG. 10 is a top-elevational view of a solar panel connector configuration according to an exemplary embodiment of the present disclosure.

FIG. 10 illustrates a top-elevational view of a solar panel connector configuration according to an exemplary embodiment of the present disclosure. The solar panel connector configuration 1000 represents a solar panel connector configuration that includes the plurality of solar panels 100(*a-n*) that may be daisy chained together to form the solar panel connector configuration 1000, where n is an integer greater than or equal to two. The solar panel 100*a* receives input DC power 1070a. As a result, each subsequent solar panel 100(b-n) that is added to the solar panel connector configuration 1000 may generate output DC power 1050n that is in parallel with the output DC power 1050a and the output DC power 1050b of the solar panel connector configuration 1000. Each solar panel 100(a-n) may be connected to each other via the plurality of solar panel connectors 910(a-n) where n is an integer greater than or equal to one. Each solar panel connector 910(a-b) transitions the output DC power 1050a and 1050b to the respective input of each respective solar panel 100(b-n). An end cable 920 receives the output DC power 1050n from the final solar panel 100n in the solar panel connector configuration 1000 and transfers the output DC power 1050n to a DC/AC power inverter 1030.

FIG. 10 is an example implementation of using the solar panel connectors 910(a-n) in an application where the solar panel connectors 910(a-n) transfer output DC power 1050(a-n) that is generated by the solar panels 100(a-n). In daisy chaining the solar panels 100(a-n), the power input for the solar panel 100b is coupled to the power output of the solar panel 100a via the solar panel connector 910a so that the input DC power 1050a received by the solar panel 100b is substantially equivalent to the output DC power 1050a of the solar panel 100a. The power input of the solar panel 100n is coupled to the power output of the solar panel 100b via the solar panel connector 910b so that the input DC power 1050b received by the solar panel 100n is substantially equivalent to the output DC power 1050b of the solar panel 100b.

After the solar panel connectors 910(a-b) have been properly inserted to electrically connect the solar panels 100(a-b) and the solar panels 100(b-n), respectively, the three conductors included in each of the solar panel connectors 910(a-b) engage DC characteristics to electrically connect the DC power transferred between each of the solar panels 100(a-n). A first conductor becomes a positive connection, a second conductor becomes a ground connection, and a third conductor becomes a negative connection so that the DC power is properly transferred between each of the solar panels 100(a-n). The positive connection, the ground connection, and the negative connection enable the transfer of the DC power between each of the solar panels 100(a-n) so that the DC power is not degraded and/or decreased during the transfer between the solar panels 100(a-n).

As noted above, each output DC power 1050(a-n) may be paralleled to increase the overall output DC power of the solar panel connector configuration 1000. The end cable 920 may be positioned at the output of the final solar panel 100n in the DC solar panel connector configuration 1000 to transfer the overall output DC power represented by the output DC power 1050n to the DC/AC power inverter 1030 that converts the overall output DC power to AC power. The cable 940 may be coupled to the solar panel connector 910n that transfers the output DC power 1050n to the DC/AC power inverter 1030. The end cable 920 and the solar panel connector 910n can properly transfer the output DC power 1050n to the DC/AC power inverter 1030 without any degradation and/or power loss in the output DC power 1050n.

Figure 11:
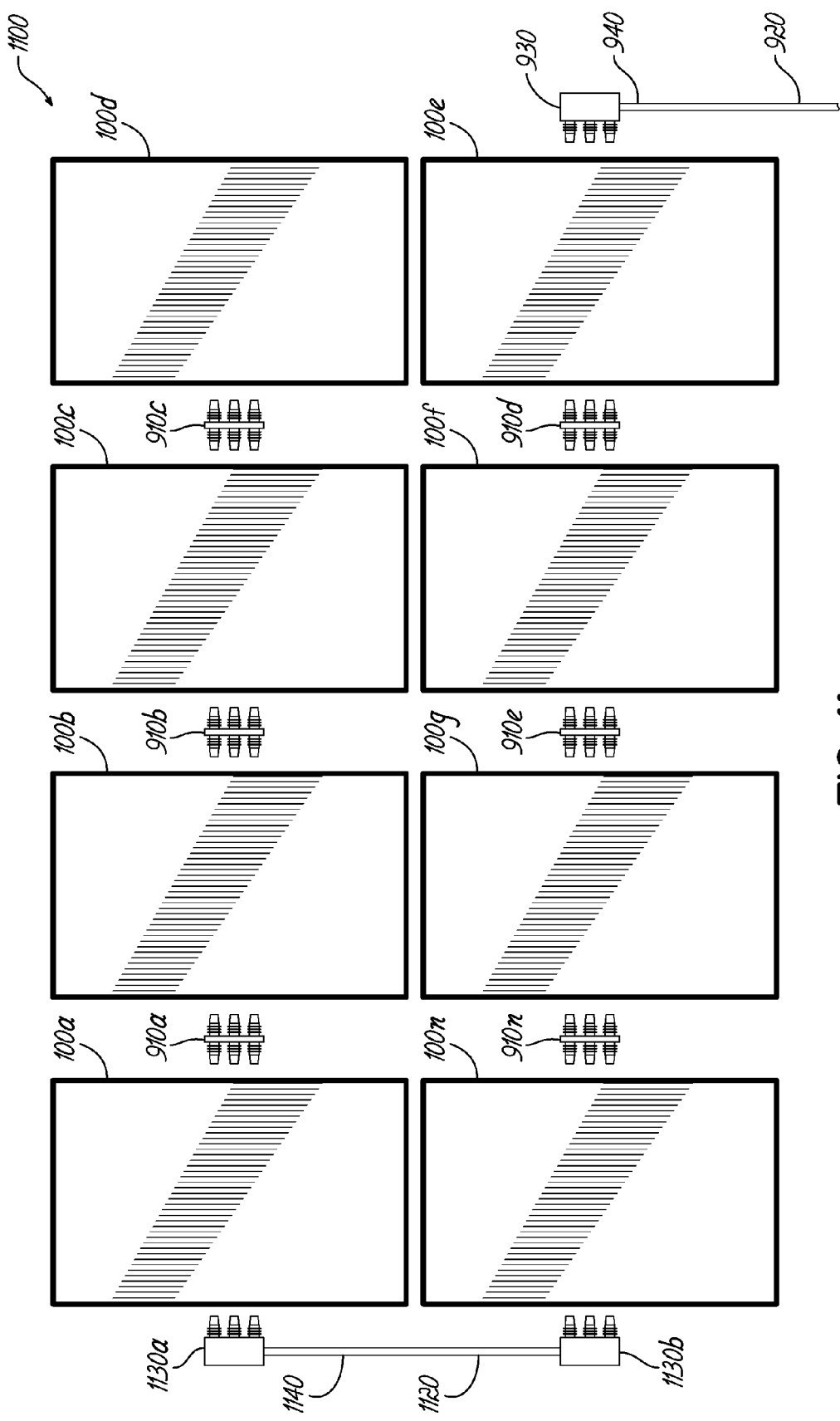
FIG. 11 is a top-elevational view of a solar panel connector configuration according to an exemplary embodiment of the present disclosure.

FIG. 11 illustrates a top-elevational view of a solar panel connector configuration according to an exemplary embodiment of the present disclosure. The solar panel connector configuration 1100 represents a solar panel connector configuration that includes the plurality of solar panels 100(a-n) that may be daisy chained together in a plurality of rows to form the solar panel connector configuration 1100, where n is an integer greater than or equal to two. The solar panels 100(a-d) are configured in a first row and the solar panels 100(e-n) are configured in a second row. A connect bridge 1120 daisy chains the first row of solar panels 100(a-d) to the second row of solar panels 100(e-n). As a result, the connect bridge 1120 may be used to daisy chain any two rows of solar panels and multiple connect bridges may be used to daisy chain multiple rows together. As discussed in detail above, the output AC or DC power generated by each solar panel 100(a-n) may be daisy chained in parallel down the line until the output AC or DC power in the last solar panel 100(e) of the solar panel connector configuration 1100 is outputted. An end cable 920 receives the output AC or DC power from the final solar panel 100n in the solar panel connector configuration 1100.

FIG. 11 is an example implementation of using the connect bridge 1120 in an application where the solar panels 100(a-n) are arranged in multiple rows such as when the solar panels 100(a-n) are positioned on the roof of a house. In daisy chaining the solar panels 100(a-n) in multiple rows, the connect bridge 1120 provides the transition of output AC or DC power between each row of solar panels 100(a-n).

For example, the solar panel 100d receives input AC power and becomes the master in the solar panel connector configuration 1100. The AC power is then paralleled down the first row of solar panels 100(a-d) via solar panel connectors 910(a-c). However, after the output AC power is generated by the solar panel 100a, the solar panel connector 1130a that is coupled to the output of the solar panel 100a and the cable 1140 of the connect bridge 1120 transfers the output AC power to the solar panel connector 1130b. The solar panel connector 1130b is coupled to the cable 1140 of the connect bridge 1120 and the input of the solar panel 100n. The solar panel connector 1130b then transfers the output AC power of the solar panel 100a to the solar panel 100n so that the output AC power continues to be paralleled through the second row of solar panels 100(e-n). The output AC power generated by the last solar panel 100e in the solar panel connector configuration 1100 is then transferred to the solar panel connector 930 of the end cable 920 and then transferred as discussed in detail above. Further, as discussed in detail above, the connect bridge 1120 may also transfer output DC power when DC power is provided by the master solar panel 100d.

Figure 11A:
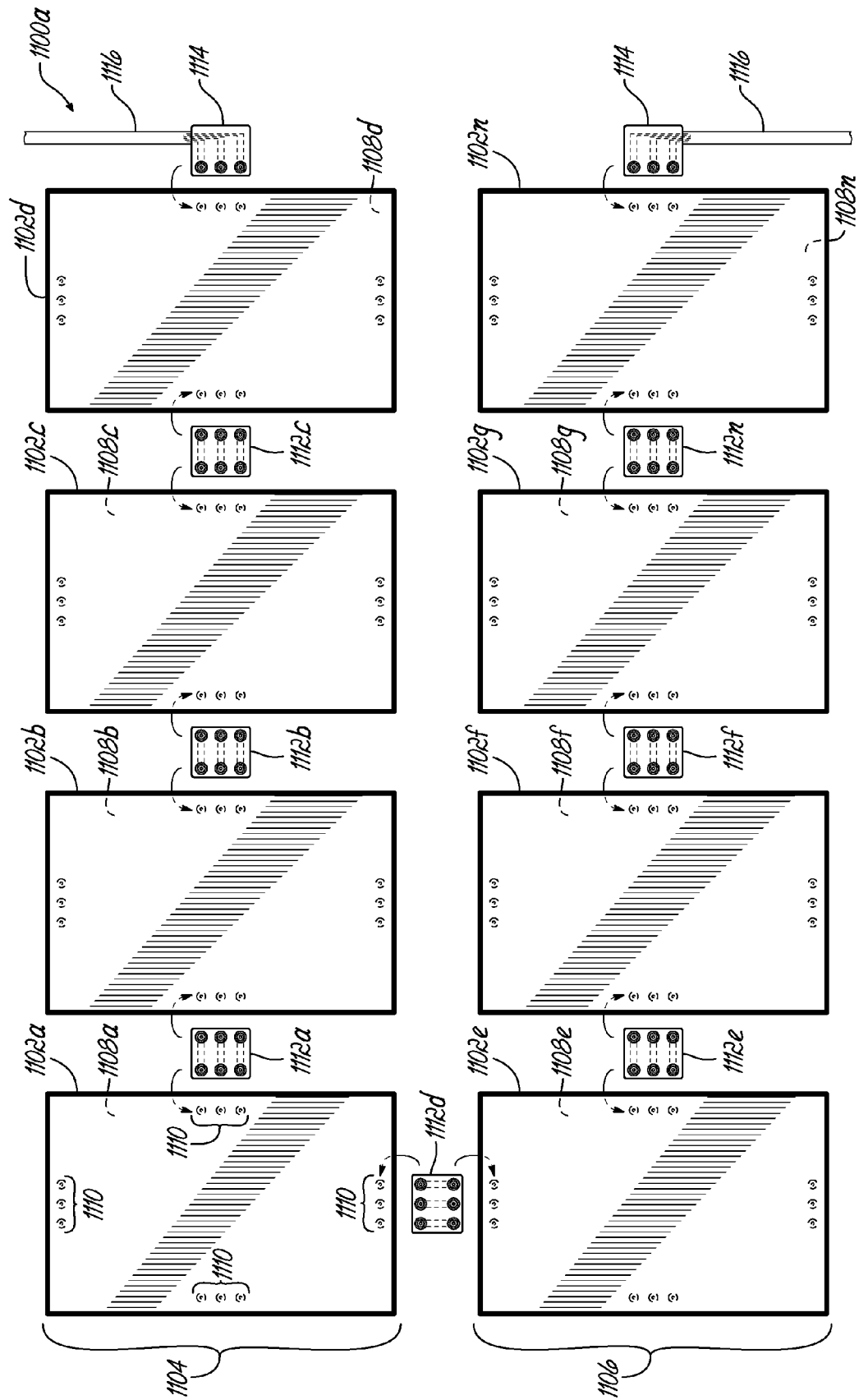
FIG. 11A is a top-elevational view of a solar panel connector configuration according to an exemplary embodiment of the present disclosure.

FIG. 11A illustrates a top-elevational view of another embodiment of a solar panel connector configuration according to the present disclosure. The solar panel connector configuration 1100a represents a solar panel connector configuration that includes a plurality of solar panels 1102(a-n) that may be daisy chained together in a plurality of rows or other arrangements to form the solar panel connector configuration 1100a, where (n) is an integer greater than or equal to 2. As illustrated in this exemplary embodiment, the solar panels 1102(a-n) are configured in a first row 1104 and a second row 1106. Each of the solar panels 1102(a-n) is further configured with a plurality of connector plug receptacles positioned on the bottom or side of the solar panel 1102(a-n) that is opposite the side of a panel that is receiving solar energy 1108(a-n). Additionally, on the backside 1108(a-n) of each of the solar panels 1102(a-n) are positioned a plurality of receptacles for the connectors that are located along each of the sides of the solar panel 1102(a-n) in other words, in a generally rectangular shaped solar panel, there will be a set of at least four connector receptacles 1110 for receiving the solar panel connector 1112(a-n). Each of the solar panel connectors 1112(a-n) are adapted to flush mount the solar panels 1102(a-n) by attaching to the backsides 1108(a-n). However, because the solar panels 1102(a-n) have receptacles 1110 positioned along each of the edges of the panels, the panels can be connected in a variety of fashions. In other words, the panels may be connected in a general longitude fashion, along the long sides of each of the panels or on the short sides of the panels such as might be done when connecting a panel from one row 1104, to another row 1106. As shown, solar panel connector 1112*d* connects the panels together and thus connects the rows together. Additionally, a like solar panel connector bridge 1114 allows the solar panels to be connected to other panels that may not be directly collated to an existing panel such as a panel that might be on the other side of a roof peak as well as provides cognativity to the house or other structure or device requiring electricity through a cable 1116.

Figure 12:
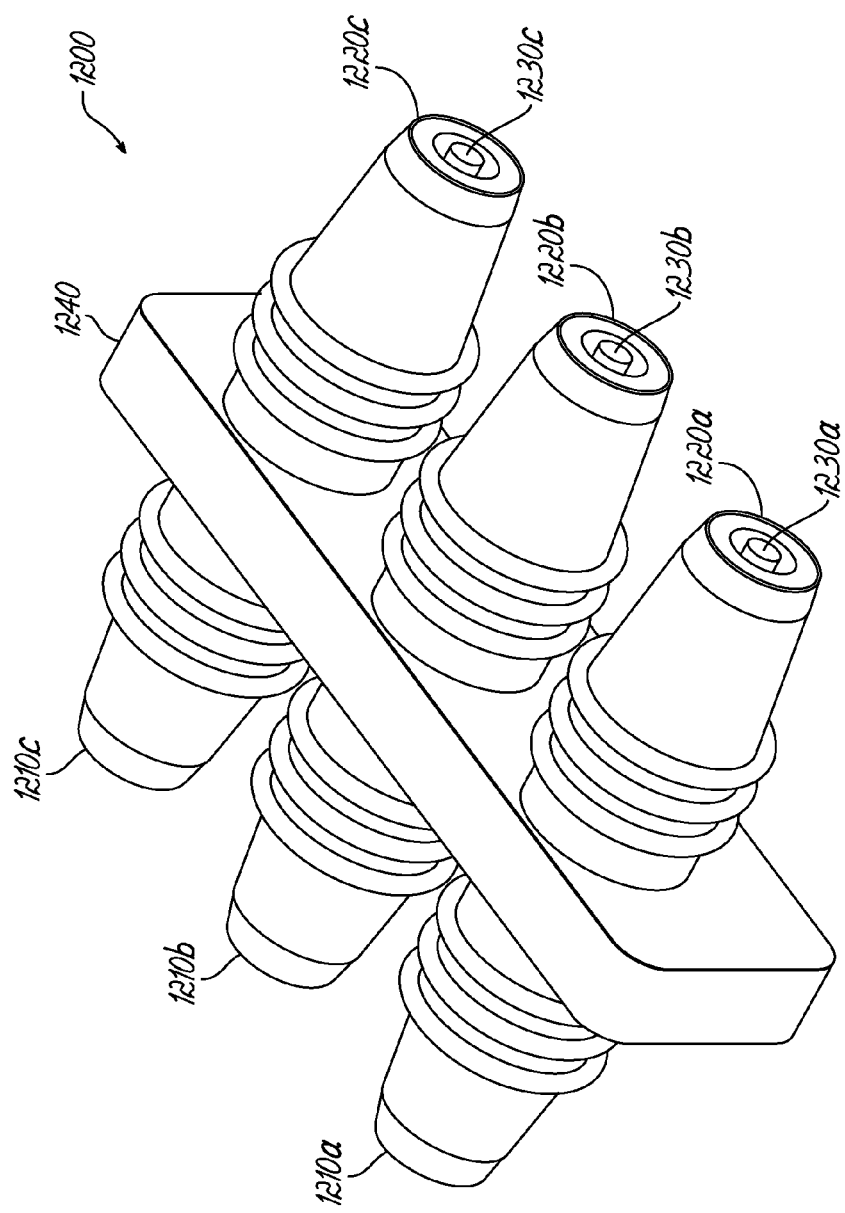
FIG. 12 is a perspective view of an example solar panel connector according to an exemplary embodiment of the present disclosure.

FIG. 12 illustrates an example solar panel connector according to an exemplary embodiment of the present disclosure. The solar panel connector 1200 includes a first conductor enclosure 1210*a*, a second conductor enclosure 1210*b*, and a third conductor enclosure 1210*c*. The solar panel connector 1200 also includes a first conductor enclosure 1220*a*, a second conductor enclosure 1220*b*, and a third conductor enclosure 1220*c*. A first conductor 1230*a* is enclosed by the first conductor enclosures 1210*a* and 1220*a*. A second conductor 1230*b* is enclosed by the second conductor enclosures 1210*b* and 1220*b*. A third conductor 1230*c* is enclosed by the third conductor enclosures 1210*c* and 1220*c*. A center section 1240 couples the first conductor enclosure 1210*a* to the first conductor enclosure 1220*a*, the second conductor enclosure 1210*b* to the second conductor enclosure 1220*b*, and the third conductor enclosure 1210*c* to the third conductor enclosure 1220*c*. The solar panel connector 1200 is an example embodiment of the solar panel connectors 910*a* through 910*n* and shares many similar features discussed in detail above.

As noted above, each of the three conductors 1230(*a-c*) may be configured to act as hot, neutral, and ground when engaged with AC power from a solar panel and also be configured to act as a positive, negative, and ground when engaged with DC power from a solar panel.

For example, each of the first conductor enclosure 1210*a*, the second conductor enclosure 1210*b*, and the third conductor enclosure 1210*c* may be coupled to a solar panel and receives AC power as discussed above from the solar panel. Upon receiving the AC power, the first conductor 1230*a* enclosed in the first conductor enclosure 1210*a* may act as the hot, the second conductor 1230*b* enclosed in the second conductor enclosure 1210*b* may act as the ground, and the third conductor 1230*c* enclosed in the third conductor enclosure 1210*c* may act as the neutral. The first conductor enclosure 1220*a*, the second conductor enclosure 1220*b*, and the third conductor enclosure 1220*c* may also be coupled to a solar panel and transfers AC power as discussed above to the solar panel. Any of the first conductor 1230*a*, the second conductor 1230*b*, and the third conductor 1230*c* may act as the hot, ground, and neutral when transferring AC power based which portion of the AC power is transferred from the output of the solar panel that the solar panel connector 1200 is coupled to that will be apparent to those skilled in the relevant art(s) without departing from the spirit and scope of the disclosure.

In another example, each of the first conductor enclosure 1210*a*, the second conductor enclosure 1210*b*, and the third conductor enclosure 1210*c* may be coupled to a solar panel and receive DC power as discussed above from the solar panel. Upon receiving the DC power, the first conductor 1230*a* enclosed in the first conductor enclosure 1220*a* may act as the positive, the second conductor 1230*b* enclosed in the second conductor enclosure 1220*b* may act as the ground, and the third conductor 1230*c* enclosed in the third conductor enclosure 1220*c* may act as the negative. The first conductor enclosure 1220*a*, the second conductor enclosure 1220*b*, and the third conductor enclosure 1220*c* may also be coupled to a solar panel and transfers DC power as discussed above to the solar panel. Any of the first conductor 1230*a*, the second conductor 1230*b*, and the third conductor 1230*c* may act as the positive, negative, and ground when transferring DC power based which portion of the DC power is transferred from the output of the solar panel that the solar panel connector 1200 is coupled to that will be apparent to those skilled in the relevant art(s) without departing from the spirit and scope of the disclosure.

The center section 1240 may include a flexible material so that the center section 1240 may flex and/or bend. For example, the center section 1240 may flex and/or bend up to 90 degrees. The flexibility and/or bending characteristics of the center section 1240 may enable an installer that is assembling a daisy chain configuration of solar panels, such as the solar panel connector configuration 1100, additional flexibility when assembling the daisy chain configuration.

For example, the installer may not be limited to aligning the input of a first solar panel to an output of a second solar panel on the same plane to couple the two solar panels together with a connector. Rather, the flexibility of the center section 1240 enables the installer to align the input of the first solar panel to the output of the second solar panel at an angle to couple the two solar panels together with the solar panel connector 1200. The flexibility of the center section 1240 enables the solar panel connector 1200 to bend so that the installer does not have to get onto the same plane as the two solar panels to couple the two solar panels together. Rather, the installer has the flexibility to remain standing and couple the two solar panels together at an angle before laying each solar panel onto the same plane.

Figure 12A:
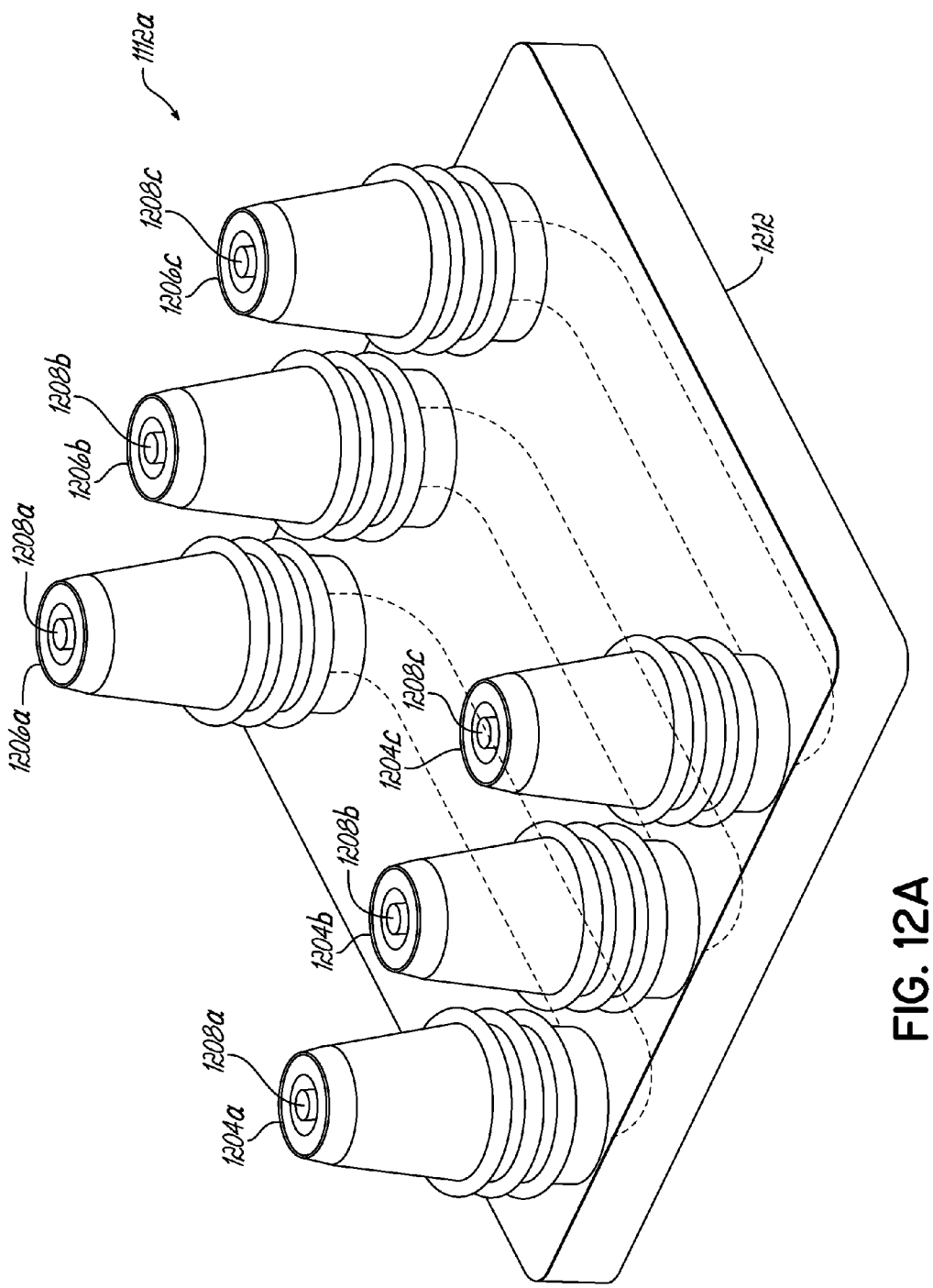
FIG. 12A is a perspective view of another example of a solar panel connector configuration according to an exemplary embodiment of the present disclosure.

FIG. 12A illustrates another example solar panel connector according to an alternative exemplary embodiment of the present disclosure. The solar panel connector 1112(*a-n*) includes a first conductor enclosure 1204*a*, a second conductor enclosure 1204*b*, and a third conductor enclosure 1204*c*. The solar panel connector 1112(*a-n*) also includes a first conductor enclosure 1206*a*, a second conductor enclosure 1206*b*, and a third conductor enclosure 1206*c*. A first conductor 1208*a* is enclosed by the first conductor enclosures 1204*a* and 1206*a*. A second conductor 1208*b* is enclosed by the second conductor enclosures 1204*b* and 1206*b*. A third conductor 1208*c* is enclosed by the third conductor enclosures 1204*c* and 1206*c*. A center section 1212 couples the first conductor enclosure 1204*a* to the first conductor enclosure 1206*a*, the second conductor enclosure 1204*b* to the second conductor enclosure 1206*b*, and the third conductor enclosure 1204*c* to the third conductor enclosure 1206*c*.

As noted above, each of the three conductors 1208(*a-c*) may be configured to act as hot, neutral, and ground when engaged with AC power from a solar panel and also be configured to act as a positive, negative, and ground when engaged with DC power from a solar panel.

For example, each of the first conductor enclosure 1204*a*, the second conductor enclosure 1204*b*, and the third conductor enclosure 1204*c* may be coupled to a solar panel and receives AC power as discussed above from the solar panel. Upon receiving the AC power, the first conductor 1208*a* enclosed in the first conductor enclosure 1204*a* may act as the hot, the second conductor 1208*b* enclosed in the second conductor enclosure 1204*b* may act as the ground, and the third conductor 1208*c* enclosed in the third conductor enclosure 1204*c* may act as the neutral. The first conductor enclosure 1204*a*, the second conductor enclosure 1204*b*, and the third conductor enclosure 1204*c* may also be coupled to a solar panel and transfers AC power as discussed above to the solar panel. Any of the first conductor 1208*a*, the second conductor 1208*b*, and the third conductor 1208*c* may act as the hot, ground, and neutral when transferring AC power based which portion of the AC power is transferred from the output of the solar panel that the solar panel connector 1202 is coupled to that will be apparent to those skilled in the relevant art(s) without departing from the spirit and scope of the disclosure.

In another example, each of the first conductor enclosure 1204*a*, the second conductor enclosure 1204*b*, and the third conductor enclosure 1204*c* may be coupled to a solar panel and receive DC power as discussed above from the solar panel. Upon receiving the DC power, the first conductor 1208*a* enclosed in the first conductor enclosure 1206*a* may act as the positive, the second conductor 1208*b* enclosed in the second conductor enclosure 1206*b* may act as the ground, and the third conductor 1208*c* enclosed in the third conductor enclosure 1206*c* may act as the negative. The first conductor enclosure 1206*a*, the second conductor enclosure 1206*b*, and the third conductor enclosure 1206*c* may also be coupled to a solar panel and transfers DC power as discussed above to the solar panel. Any of the first conductor 1208*a*, the second conductor 1208*b*, and the third conductor 1208*c* may act as the positive, negative, and ground when transferring DC power based which portion of the DC power is transferred from the output of the solar panel that the solar panel connector 1202 is coupled to that will be apparent to those skilled in the relevant art(s) without departing from the spirit and scope of the disclosure.

The center section 1212 may include a flexible material so that the center section 1212 may flex and/or bend. For example, the center section 1212 may flex and/or bend up to allow for installation anomalies. In other words, the flexibility and/or bending characteristics of the center section 1212 may enable an installer that is assembling a daisy chain configuration of solar panels, additional flexibility when assembling the daisy chain configuration.

For example, the installer may not be limited to aligning the input of a first solar panel to an output of a second solar panel on the same plane to couple the two solar panels together with a connector. Rather, the flexibility of the center section 1212 enables the installer to align the input of the first solar panel to the output of the second solar panel at an angle to couple the two solar panels together with the solar panel connector 1200. The flexibility of the center section 1212 enables the solar panel connector 1200 to bend so that the installer does not have to get onto the same plane as the two solar panels to couple the two solar panels together. Rather, the installer has the flexibility to remain standing and couple the two solar panels together at an angle before laying each solar panel onto the same plane.

Figure 12B:
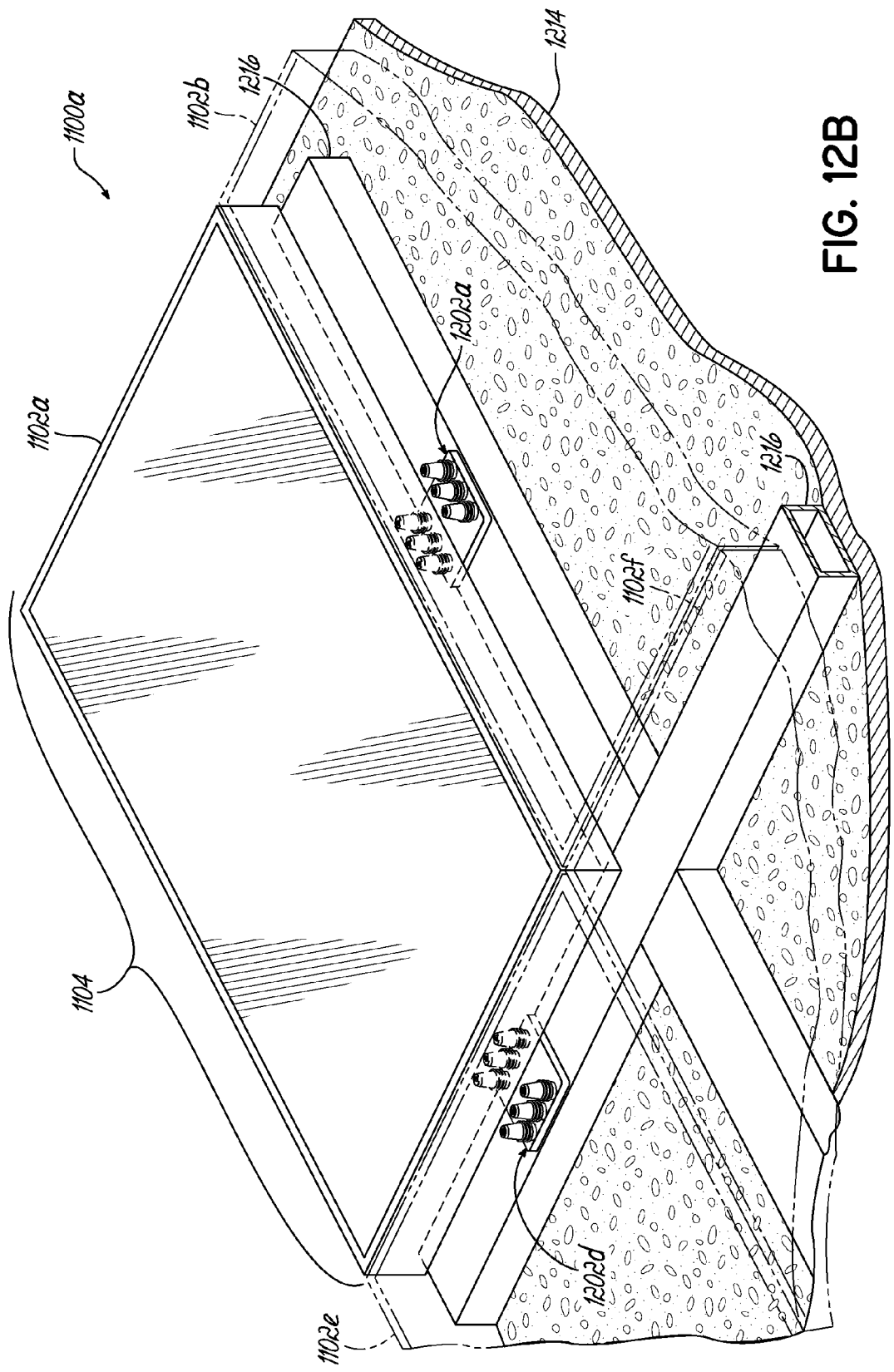
FIG. 12B is a perspective view of an exemplary solar panel connector of the present disclosure connecting a plurality of solar panels.

FIG. 12B is a perspective view showing the insulation of the solar panel connector 1202 in use with a typical solar panel 1102*a*. As shown, the solar panel connectors 1112(*a-n*) may be arranged on multiple sides or as shown in FIG. 12B on orthogonal sides. In addition to providing the above-referenced electrical as well as data communication functionalities, the solar panel connector 1112(*a-n*) may also be configured to provide a mounting and/or bracing function with regard to the insulation of the solar panel 1102(*a-n*) as well. In other words, the solar panel connector 1112(*a-n*) could be sufficiently rigid, at least in the base portion 1212, as well as the connectors 1204(*a-c*) 1206(*a-c*) to provide the means whereby the solar panel 1102(*a-n*) is secured to the structure 1214 either directly, or through some intermediate framing system 1216. It should also be appreciated that these solar panels do not necessarily need to be arranged or orientated in like manner. In other words, because the solar panel 102(*a-n*) has connectors on the distant side of the solar arrays, each of the panels could be positioned adjacent to one another as shown in FIG. 11A, or it could be positioned in more of a "T" fashion where the shorter side of the rectangle is attached to the longer side of an adjacent panel. This provides an installer the flexibility to position the maximum number of solar panels given to a particular roof structure as well as to account for any aesthetic or other roof features that may be of importance to the installer. Again, the solar panel connector 1202(*a-n*) could also be adapted such that the base 1212 allows for the screws, nails, or other means of attaching it to the framing structure 1216 or the roof itself 1214 without damaging or interfering with the cognativity of the connectors 1208(*a-c*) that run through the center portion 1212 of the connector 1202(*a-n*). Again, use of embodiment of a solar panel connector 1202(*a-n*) as shown herein satisfies not only the power transfer component, the data transfer component, but also the framing and insulation component of the solar panel in a single user friendly, multi-function connector component.

Figure 13:
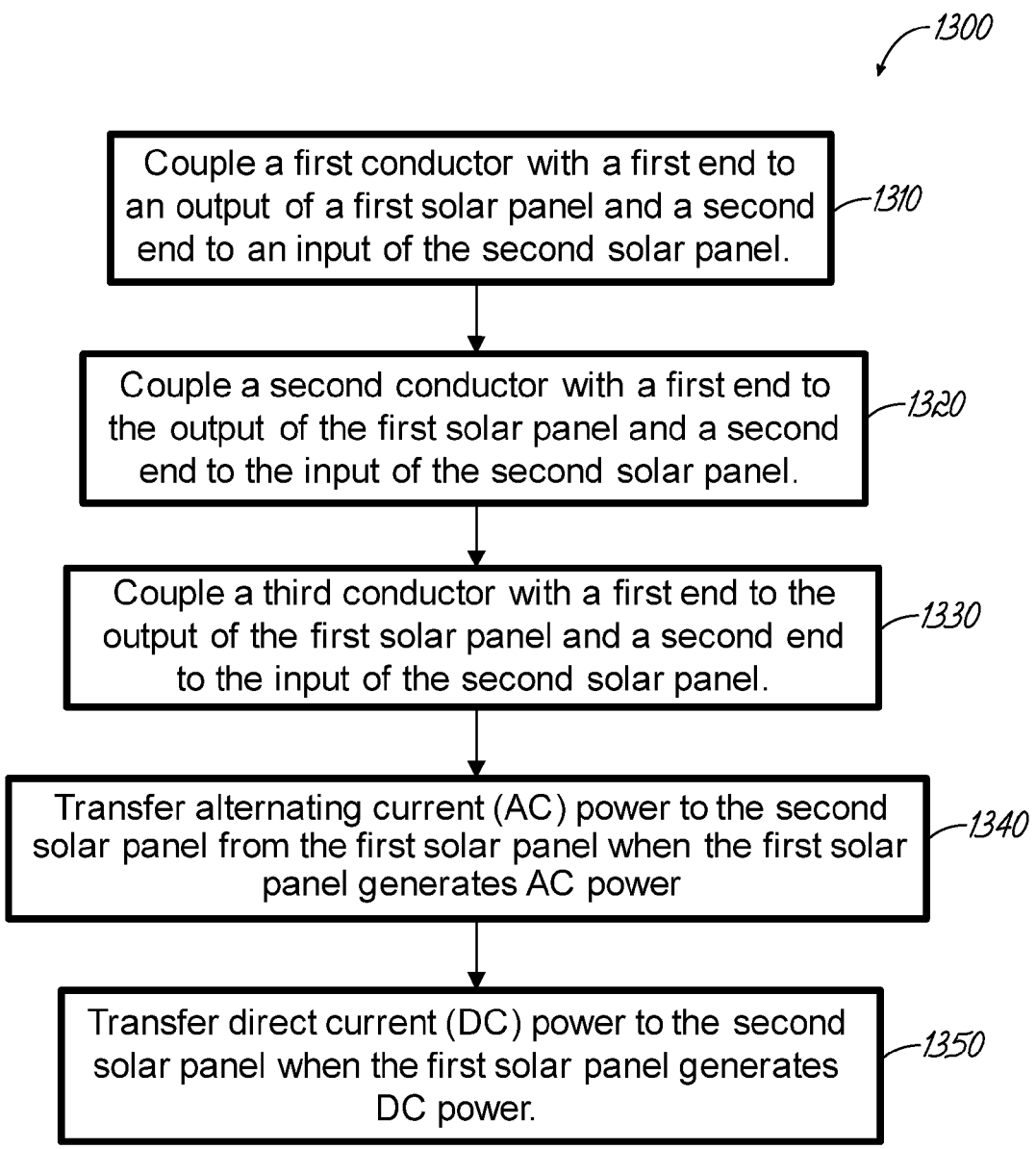
FIG. 13 is a flowchart of exemplary operational steps of the solar panel connector configuration according to an exemplary embodiment of the present disclosure.

FIG. 13 is a flowchart of exemplary operational steps 1300 of the solar panel connector configuration according to an exemplary embodiment of the present disclosure. The present disclosure is not limited to this operational description. Rather, it will be apparent to persons skilled in the relevant art(s) from the teachings herein that other operational control flows are within the scope and spirit of the present disclosure. The following discussion describes the steps in FIG. 13.

At step 1310, a user couples a first conductor 1230*a* with a first end to an output of a first solar panel 100*a* and a second end to an input of the second solar panel 100*b*. The first conductor 1230*a* is enclosed by the first conductor enclosure 1210*a* at one end and by the first conductor enclosure 1220*a* at the other end.

At step 1320, a user couples a second conductor 1230*b* with a first end to the output of the first solar panel 100*a* and a second end to the input of the second solar panel 100*b*. The second conductor 1230*b* is enclosed by the second conductor enclosure 1210*b* at one end and by the second conductor enclosure 1220*b* at the other end.

At step 1330, a user couples a third conductor 1230*c* with a first end to the output of the first solar panel 100*a* and a second end to the input of the second solar panel 100*b*. The third conductor 1230*c* is enclosed by the third conductor enclosure 1210*c* at one end and by the third conductor enclosure 1220*c* at the other end.

At step 1340, AC power 195*a* is transferred to the second solar panel 100*b* from the first solar panel 100*a* when the first solar panel generates AC power 195*a*.

At step 1350, DC power 1050*a* is transferred to the second solar panel 100*b* when the first solar panel 100*a* generates DC power 1050*a*.

Figure 14:
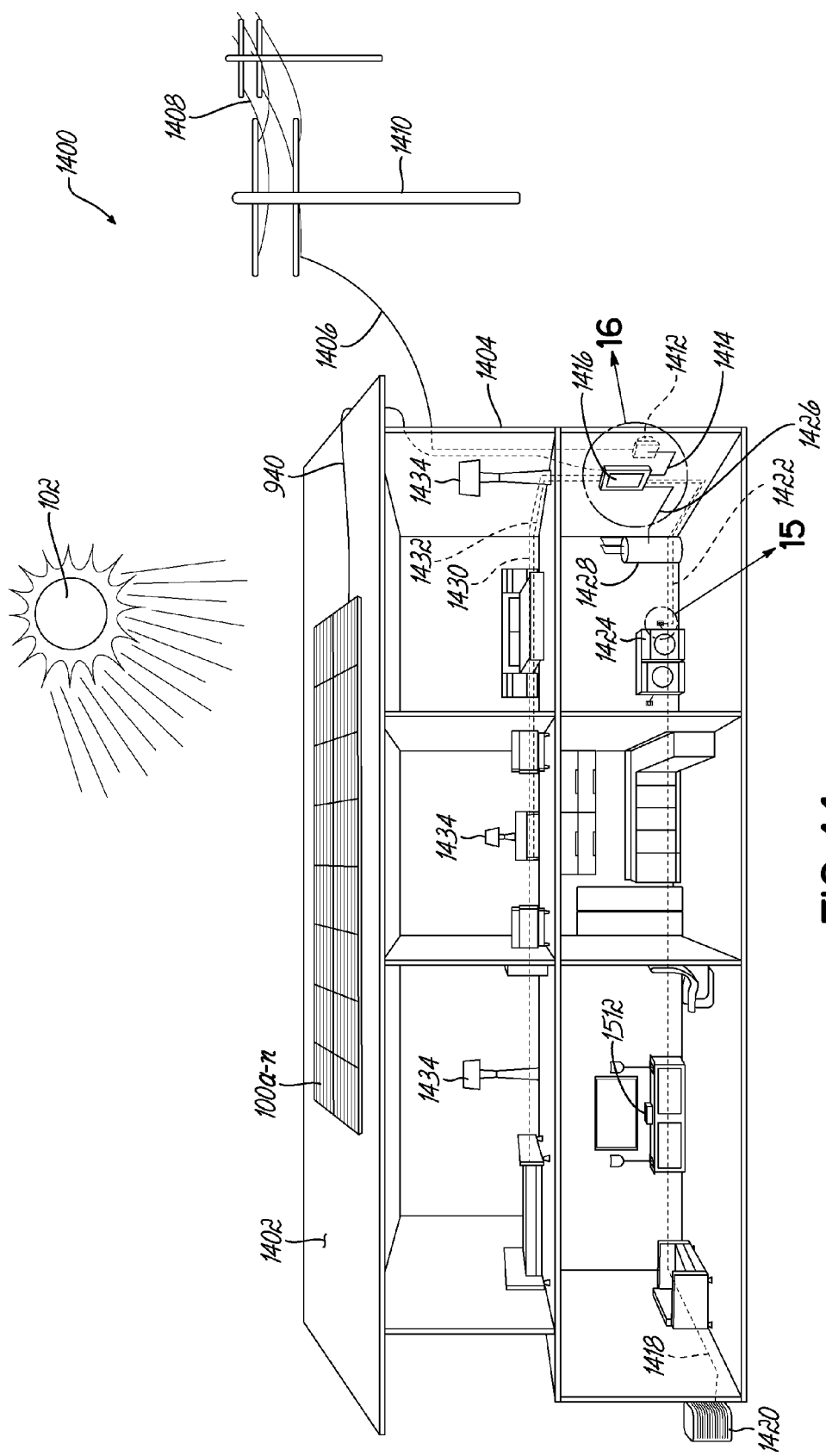
FIG. 14 illustrates an example of an exemplary domestic embodiment of the solar panel of the present disclosure in a single family structure.

FIG. 14 illustrates an embodiment of the present invention in a residential or domestic configuration 1400. Again, a plurality of solar panels 100(*a-n*) are positioned on a rooftop 1402 of a home or other dwelling 1404 in such a way as to receive light or solar energy 102 from the sun or other like source. In alternative embodiments, some or all of the solar panels 100(*a-n*) could also be positioned on another part of the structure 1404, for example, the sides of the structure, or even detached from the structure 1404 all together. For example, the solar panels 100(*a-n*) could be positioned in an array or can be detached from the structure 1404. As further shown, the structure 1404 is connected via a standard power line 1406 to a commercial electric utility grid 1408 via distribution and/or sub-distribution to power lines. While the illustration shows above ground distribution lines, one of skill in the art would appreciate that such connections to the electric utility grid 1408 could also be via an underground power cables either from the home 1404 to the pole 1410, or from the home 1404 to an underground distribution system, or a combination of overhead and underground power cables.

The power line 1406 is connected to the home 1404 at the electrical utility meter 1412. The utility meter 1412 is in turn connected via a wire 1414 to the electrical panel 1416, which may be located inside or outside of the home 1404. The electric meter 1412 keeps track of the amount of power that is being drawn from the electric utility grid 1408 into and used within the structure of 1404.

As further illustrated, the solar panels 100(*a-n*) are connected to the breaker box 1416 via a single wire or cable 940 however, in other embodiments, the cable 940 from the solar panels 100(*a-n*) may directly feed a single device such as a clothes dryer.

As further illustrated in FIG. 14, the electric panel 1416 has a number of circuits that power various aspects of the home, for example, it may have a line or circuit 1418 that is used to power an outside air conditioner unit 1420, another line circuit 1422 to specifically power a home's washer machine 1424, and another circuit 1426 to power an electric hot water heater 1428. A typical home would also have a number of circuits 1430, 1432 which may be used to power various rooms or sections of the home 1404.

Figure 15:
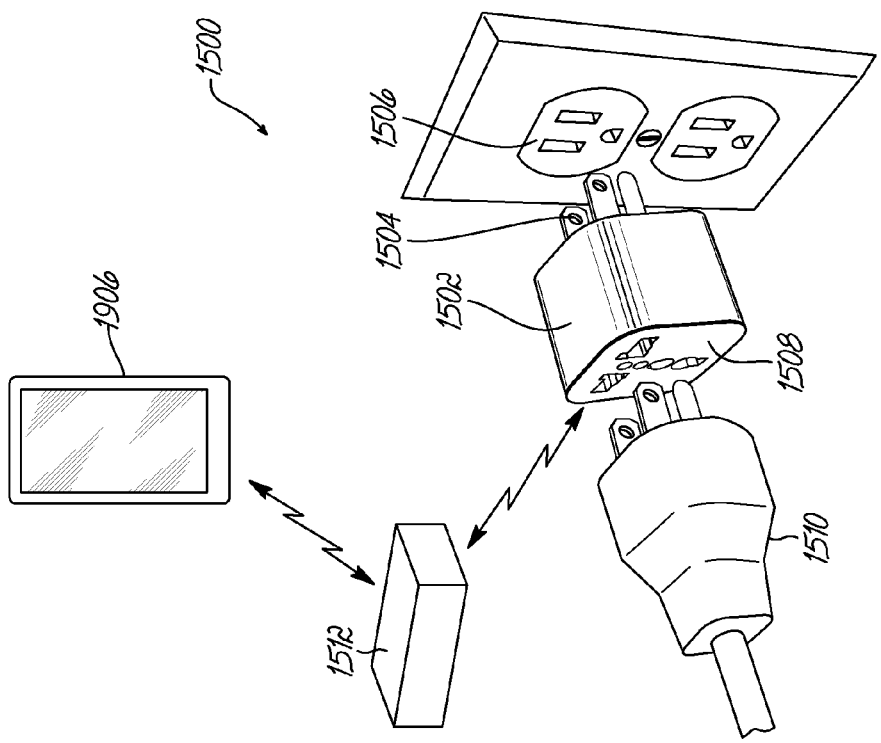
FIG. 15 illustrates an embodiment of a power controller of the present disclosure.

FIG. 15 illustrates an embodiment of a power controller configuration 1500 of the present invention. More specifically, a plug or outlet power controller 1502 consists of a standard three pronged male connection 1504 at one end that is adapted to mate with a standard wall outlet 1506. At the other end 1508, the outlet controller 1502 has a standard multi pronged female receptacle, which is configured to receive a standard electrical appliance power cord 1510 with a male two or three pronged plug assembly 1510. One who is skilled in the art can appreciate that in various circumstances the orientation of the plugs and prongs could be reversed without detracting from the present invention.

The power outlet controller 1502 is further configured with a wireless communication circuitry 1503 to enable it to connect and communicate wirelessly via Wi-Fi, Bluetooth, or other like communication protocols with the solar panel 100. In other embodiments, the outlet power controller 1502 may also wirelessly communicate with a central communication and control center or hub 1512, which in turn may communicate wirelessly with the solar panels 100(*a-n*).

In addition to containing communication circuitry, which allows the central communication hub 1512 to wirelessly communicate with the power controller 1502, it also typically will contain communication circuitry to allow it to communicate wirelessly with the solar panel 100 as well as a users cell phone 1906. This allows a user to remotely control various aspects of power distribution within his or her home even when they may be miles away. Additionally, the central communication hub 1512 may contain motion sensing and/or audio sensing circuitry to allow it to determine automatically when a user may or may not be present in the home. In other words, in one embodiment, if the central communication and control center 1512 senses that there has been no motion in the room where it is located for a particular time, it may automatically power down any electronic devices, for example, lights, TV, audio equipment, and the like in that room. Similarly, it may also power down other aspects of the home by virtue of not hearing any activity in the home through its audio detection circuitry. Conversely, upon sensing, whether via audio indication, or motion indication, that there is activity again within the house or soon to be within the house, for example, sensing a garage door opening, a doorbell ringing, or any other like motion and/or audio inputs, it may power up certain aspects of the home. For example, it may turn on lights in a particular section of the home from which it senses an audio input. A doorbell ringing or a knock on the door may trigger the illumination of that room or other rooms within the home. Obviously this has additional ramifications in addition to power management, such as safety and security of the home and deterrence of burglaries and the like.

Figure 16:
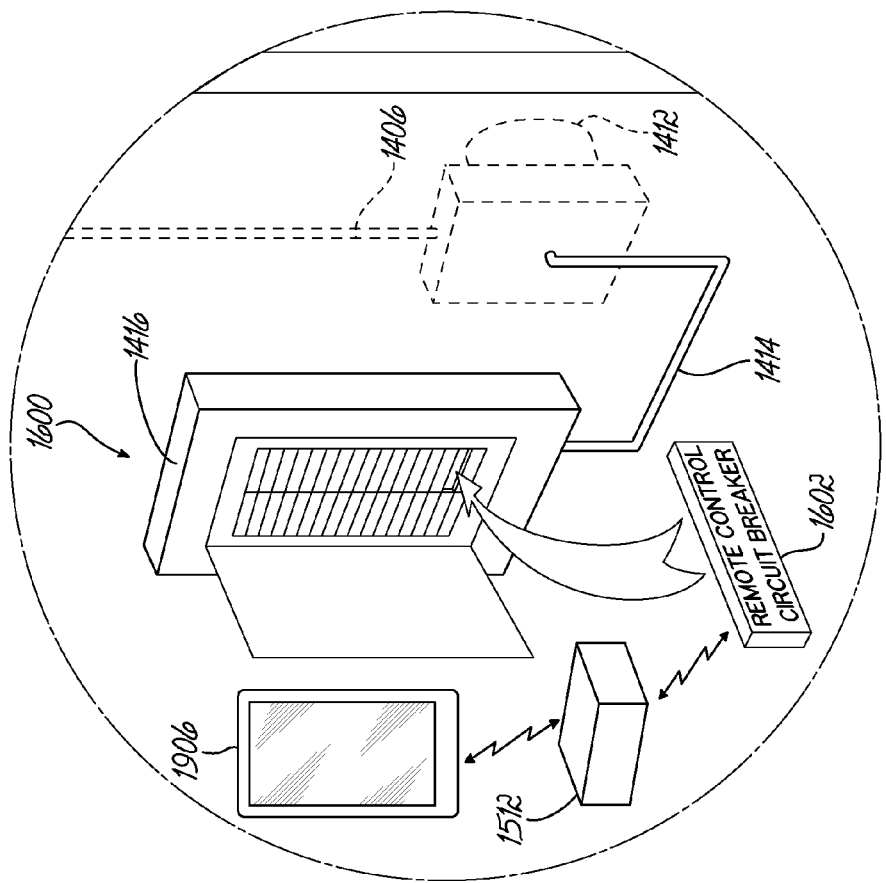
FIG. 16 illustrates another embodiment of a power controller of the present disclosure.

FIG. 16 illustrates another embodiment of a power controller configuration 1600 of the present invention. In this embodiment, the breaker box 1416 has a remote control circuit breaker 1602 which is in operable wireless communication with solar panel 100 by means of Wi-Fi, Bluetooth, or like communication protocols. The remote control circuit breaker 1602 will turn power on or off to a particular single device, or to multiple devices that are connected to that particular circuit. In other words, the remote control circuit breaker 1602 might control power to a signal device such as a hot water heater 1428 or it might control the lights 1434 in one or more rooms such as illustrated by circuits 1430, 1432.

In an operation, the power controllers 1502,1602 sense when a particular electronic device such as a lamp 1434 is turned on and is requiring power. It then wirelessly communicates with the solar panel 100*a*, typically via central communication hub 1512. The solar panel 100*a* can then provide power to the home 1404 in the amount required by the particular device, for example the lamp 1434. A user can also wirelessly communicate with and control the power controllers, for example, via the central communication hub 1512 from a smart phone 1906.

Figure 17:
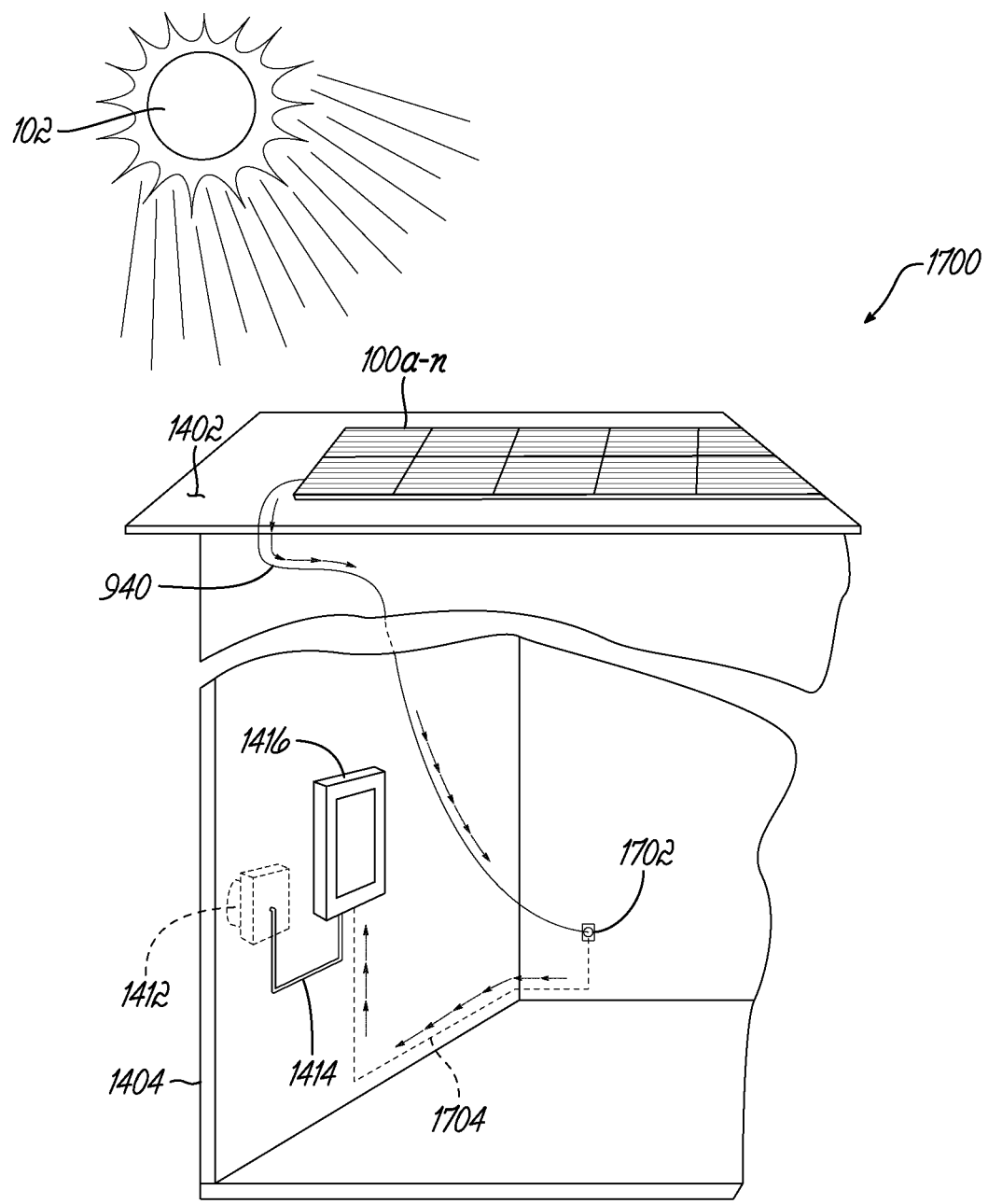
FIG. 17 illustrates an embodiment of a power adapter of the present disclosure.

FIG. 17 illustrates another embodiment of a solar panel configuration 1700 wherein the solar panels 100(*a-n*) directly supply power via a cable 940 to a power adapter 1702. The power adapter 1702 is typically designed for a high voltage appliance such as might be found in a residential clothes dryer operating at 240 volts. In this embodiment, the solar panels 100(*a-n*) supply the power needed directly to the power or outlet adapter 1702 without routing the power through the breaker box 1416. Nevertheless, because the outlet that the power adapter 1702 is itself wired 1704 to the breaker box 1416, power and communication may still be routed through that line 1704. It should also be noted that in various embodiments, some lines 940 from a particular solar panel or panels 100(*a-n*) may be connected directly to a power adapter 1702, while other lines from different solar panels 100(*a-n*) may run directly to the breaker box 1416. In other words, one could have the configuration 1700 shown in FIG. 17 where in the solar panels 100(*a-n*) directly power an outlet or in the configuration 1400, as shown in FIG. 14 where the solar panels 100(*a-n*) directly power a breaker box, or a combination of these arrangements.

Figure 18:
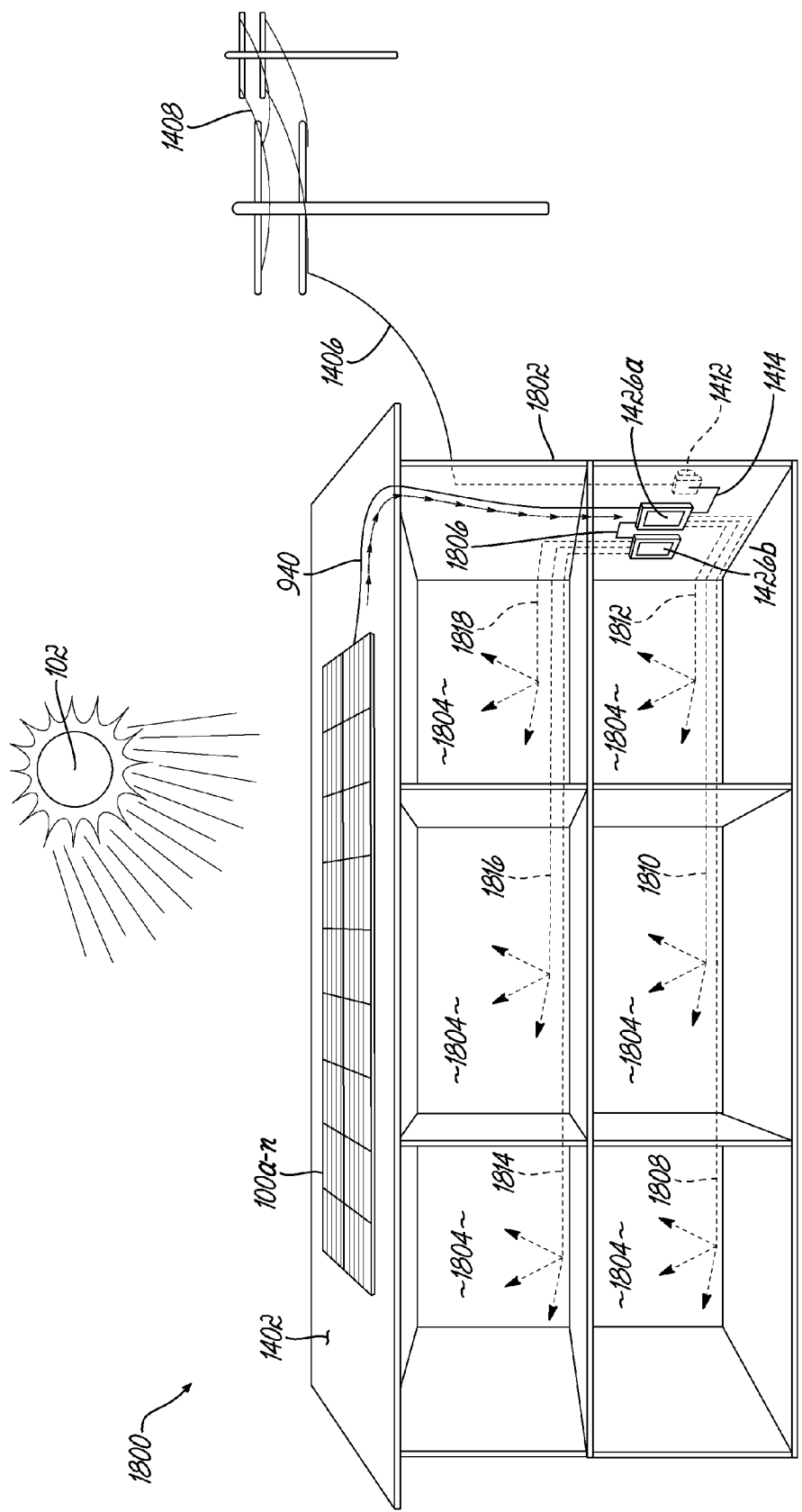
FIG. 18 illustrates an exemplary embodiment of solar panels of the present disclosure in a multi-family structure.

FIG. 18 illustrates a commercial embodiment or configuration 1800 of the present invention where it is used in a structure 1802 that consists of a plurality of apartments or separately powered rooms 1804. As shown, a plurality of solar panels 100(*a-n*) may be arranged to provide power via a single cable 940 to a first breaker box 1426*a* which is then connected via cable 1806 to a second breaker box 1426*b*. The breaker boxes 1426*a*,1426*b* are designed to then have a plurality of circuits 1808, 1810, 1812, 1814, 1816, and 1818 to power various sections of the structure 1802. As illustrated, the first breaker box 1426*a* powers the lower level of the structure 1802 via circuits 1808, 1810, and 1812 whereas the second breaker box 1426*b* powers the second floor of the structure 1802 via circuits 1814, 1816, and 1818. It should further be appreciated that any number of breaker boxes 1426*a*, 1426*b* could be added to the configuration 1800, as well as any number of circuits. In other words, in a six apartment structure 1802 one could have six breaker boxes, and a plurality of circuits running from each of those boxes. In alternative embodiments, a plurality of solar rays could be located on or near a structure such one that could provide power from one apartment building to another. In other words, the same solar panel or multiple solar panels on the rooftops of separate structures could provide power to a single office or apartment within a particular structure, as well as distribute that power to other units as desired by the apartment owner or manager.

Figure 19:
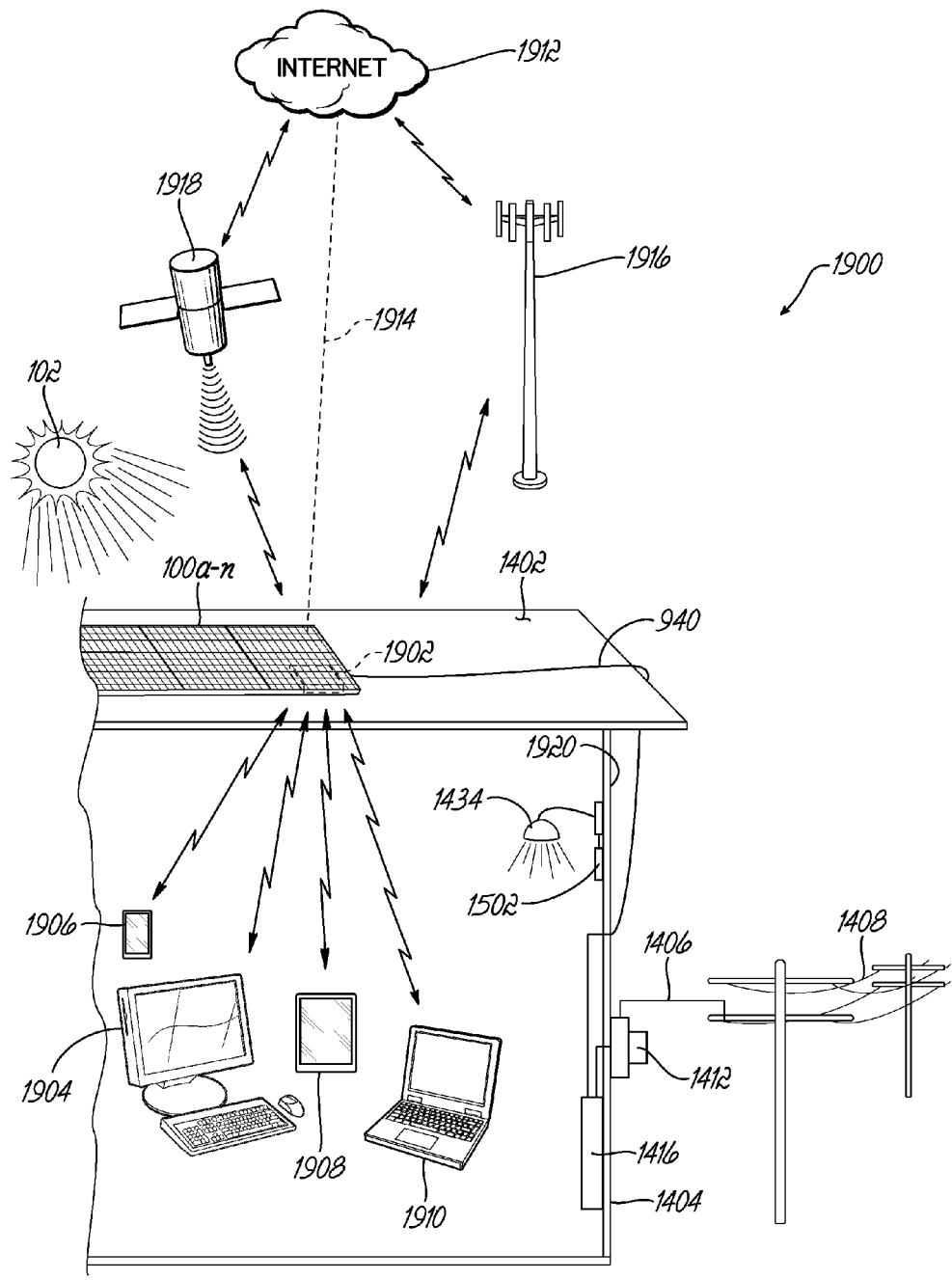
FIG. 19 illustrates an example of the communication and control functions of a roof-top solar panel according to an exemplary embodiment of the present disclosure.

FIG. 19 shows an illustration of a wireless solar panel configuration 1900 of the present invention. The wireless solar panel configuration 1900 further illustrates the communication and control aspects of one embodiment of the present invention. As shown, this particular embodiment can be configured with a single solar panel 100a or a plurality of solar panels 100a,100b. Within one or more of the solar panels is a Wi-Fi hotspot 1902 that is adapted to provide wireless communication to one or more computing devices such as a desktop computer 1904, a cell phone or smart phone 1906, a tablet device 1908, or a laptop or notebook computer 1910. While illustrated as a Wi-Fi hotspot 1902 other relatively local radio communication, Bluetooth, cellular, infrared, optical, or other like communication protocols may be used to communicate from the solar panel 100a to the computing devices shown. Likewise, other types of computing devices particularly those that have a need to connect to the Internet could also be in operable communication with the Wi-Fi hotspot 1902 or like communication circuitry located within the solar panel 100a. For example, a game console, a personal digital assistant ("PDA"), Wii™, data-bracelets, and other like devices, could also connect to the Wi-Fi hotspot 1902 or like communication circuitry.

The Wi-Fi hotspot 1902 located within the panel 100a may, in different embodiments, operably connects to the Internet 1912 in various methods. For example, in one embodiment, a hardwire connection 1914 such as an Ethernet cable or a telephone line with a modem, may be used to provide access to one or more intermediate communication devices with an ultimate connection to the Internet. In another embodiment, the communication circuitry in the solar panel 100a may communicate to the Internet 1912 via a cellular network 1916. In other words, within the communication circuitry of the solar panel 100a is a cellular radio transmitter that allows the panel to connect directly with one or more cell towers 1916. The cell towers in turn provide operable communication to the Internet 1912.

In yet another embodiment, the solar panel 100a is in operable communication with the Internet 1912 via a satellite 1918 network. In other words, within the solar panel 100a is a satellite phone transmitter that provides communication directly from the panel 100a to one or more satellites 1918. The satellites are in turn in operable communication with the Internet 1912.

In still other embodiments, other forms of communication or data transfer protocols, e.g., laser, optical, etc., may be used to connect the panel 100a to the Internet, and within a single panel 100a, a plurality of protocols may be available.

It should also be appreciated that the connection from one solar panel 100a to the Internet 1912 does not need to be via a single interface. For example, one skilled in the art could appreciate that a plurality of methods might be used to ultimately connect one solar panel 100a to the Internet. Hence a combination of satellites, wired connection, and/or cellular towers, or other like communication antennas could be used to provide the ultimate path to get to the Internet 1912. For example, in one embodiment, one solar panel 100a could communicate to another solar panel 100b via Wi-Fi and then that panel 100b, could communicate to the satellite 1918 or a cell tower 1916. In other words, in a single application a plurality of panels 100(a-n) are typically installed on a rooftop 1402, one or more of those solar panels 100(a-n) may be shielded from a direct view of a satellite 1918 by surrounding trees, buildings, or other like obstructions. However, the panel 100(a-n) that does have a clear view of the satellite 1918 may not be ideally positioned for Wi-Fi communication with various hand held computing devices. Hence, for the panel 100a that is interfacing with the mobile computing devices to ultimately communicate to the Internet, it may need to relay its transmissions to other panels 100(a-n) to ultimately gain a clear shot to satellite 1918. This relaying could be done via wireless transmission of information from the Wi-Fi hotspot 1902, the wireless data transmitter and receiver 561, or other like communication circuitry. And communication from the one panel 100a to another panel 100b to another panel 100n may also occur via a wired connection whether through PML technology data communication or other like hardwired connections. In other words, this communication may occur via the solar panel connector configuration 910a or another like wired connection.

It should further be appreciated that the communication from one panel 100a to another panel 100b is not necessarily confined to panels 100(a-n) located on a single rooftop 1402. In other words, the panels may also communicate from one structure to another structure. Hence in a neighborhood or wherever the panels 100(a-n) are located within range of other panels 100(a-n), the panels 100(a-n) themselves may form their own rooftop local area network ("LAN") whereby data may be communicated from one rooftop to another rooftop for use within those particular structures, and/or for the purpose of ultimately hop scotching along to the Internet 1912. In other words, in a particular neighborhood, the location or position of one home, or its placement on a lot, may not allow direct access to the Internet via a satellite 1918 or to a cell tower 1916. However, by linking and communicating from one rooftop to another, a house that might be, for example, in a valley or otherwise inaccessible to satellites 1918 or cell towers 1916, may be linked to the Internet 1912 from one housetop to another up and down hills, etc., until it reaches a house with a roof panel 100a that does have a clear view of the satellite 1918 or a cell tower 1916.

It should further be appreciated that while the positions of the solar panels 100a. 100b has been discussed on the top of a structure, i.e. a rooftop 1402, these panels 100a, 100b could also be positioned elsewhere on, or apart from, a structure. For example, panel 100a could be located on the side 1920 of the structure 1404. In such a configuration, panels 100(a-n) that were installed high up the side 1920 of the structure 1404 would typically have better reception and ability to connect with a satellite 1918 or a cell tower 1916 than panels 100(a-n) positioned lower on the side wall 1920. Additionally, the illumination of each solar panel 100(a-n) from a solar source 102 or other like energy or light source may not necessarily be coextensive with the communication path to either a satellite 1918 or a cell tower 1916. In other words, a panel 100(a-n) might be a good solar collector but a poor communicator or a good communicator but a poor solar collector due to its relative position or location.

The solar panels 100(a-n) may also be positioned apart from the structure 1404 all together. In other words, a remote ranch house 1404 that may be located in a valley, may utilize one or more solar panels 100(a-n) located on top of a nearby ridge line. These panels 100(a-n) may be relatively in a line of sight communication path with panels 100(a-n) on the home 1404 thus allowing for relay communication to the Internet

1912. Hence, while panels 100(*a-n*) located on the ranch house 1404, may be well positioned for power generation from a solar source 102, they will rely on detached and deployed panels 100(*a-n*) for communication. One can further appreciate that if a relay of panels was necessary to provide cognativity ultimately to the ranch house 1404 from the solar panels 100(*a-n*) placed on the ridge, this could also be done via a hardwire connection 940 or a combination of a hardwire connection 940 and wireless transmissions. Hence, one could contemplate a scenario where a hardwire communication 940 might be desirable for communication from one panel 100*a* to another panel 100*b* when line of sight communication is obscured by trees, terrain, other structures, and the like. Conversely, once a particular panel 100(*a-n*) is within line of sight of another panel 100(*a-n*) or is otherwise in communication range, a wireless transmission may be preferable over placing hardwires in the ground or on poles or otherwise connecting the two panels 100(*a-n*).

Similarly, in yet another embodiment, the solar panel 100*a* acts as a communication repeater where its primary purpose is not to provide power to something external to it, but simply for using its own internally generated power to power its communication and circuitry 561. In other words, in a remote location, one panel 100*a* may again be strategically placed on top of a ridge or other like high points in relation to the surrounding terrain whereby it can relay data communication to other panels 100*b* located on other rooftops 1402 in surrounding valleys. Hence the primary purpose of this panel 100*a* would be to provide a communication link to the Internet 1912 by connecting a plurality of solar panels 100(*a-n*) located on a plurality of roofs 1402 throughout a particular geographic area.

In short, the solar panel 100(*a-n*) and the communication circuitry 1902 located therein is able to act as its own network whether located on a particular structures rooftop 1402 or particular structures walls 1920 or in a standalone configuration.

In addition to placing solar panels on either the roof of a structure, the sides of a structure, or even off the structure all together, such as standalone solar panels on a hillside or ridge top, the solar panels 100(*a-n*) of the present invention may also be located on mobile devices such as vehicles, trucks, trailers, boats, and the like. For example, solar panels 100(*a-n*) could be positioned on a commercial tractor trailer for use in providing electrical power to the truck or trailer while in transit, such as might be the case in a refrigerated vehicle that is using electricity to cool its cargo, or other electrical demands in the vehicle itself, and/or in hybrid type vehicles to power the vehicle itself. Additionally, such power generation storage could be useful for when the vehicle stops, such as a tractor trailer stopping at night for a rest stop to then power its air conditioning or other electrical needs within the tractor trailer. This would obviate the need for the tractor trailer to keep a engine going or another type of electric generator going to power such items while it is parked in the rest-stop or other overnight parking areas.

In addition to providing for the electrical needs, the solar panels 100(*a-n*) of the present invention in view of their communication capabilities could also provide a mobile data network as the trucks or other vehicles move along a highway. In other words, much like the concept of the solar panels on a rooftop providing its own local area network or path to hopscotch their way to the Internet, trucks on a highway would act as a dynamic mobile network wherein data and communication could be relayed, until one vehicle has access to the Internet or could simply provide that data to any user connected to this mobile network.

FIG. 19 also illustrates the solar panels 100(*a-n*) being in wireless communication with one or more outlet or power controller 1502. The outlet controller 1502 is configured to plug into a standard electrical outlet 1506 and receive a plug 1510 from a standard electrical device, e.g., a lamp 1434. In an alternative embodiment, the power controller 1602 in the form of a remote control circuit breaker 1602 could be used.

It should also be appreciated that in addition to or in lieu of the communication circuitry 1902 being located within a solar panel 100, the communication circuitry to communicate to the internet via a satellite phone connection 1918, cellular connection 1916, or a hardwire connection 1914, could also be located within the central communication hub 1512. In other words, the central communication hub 1512 could communicate directly with the various WiFi computing devices such as cell phone 1906, desktop computer 1904, a cabin 1908, and/or a laptop computer 1910. The central communication hub 1512 could then provide the WiFi hotspot 1902 as well as communicating to the internet 1912 and the solar panels 100(*a-n*). And in yet another alternative embodiment, the central communication hub 1512 provides a WiFi hotspot and it in turn is in operable communication with one or more solar panels 100(*a-n*) which are then in turn in communication with the Internet via a satellite 1918 or a cell tower 1916.

Figure 19A:
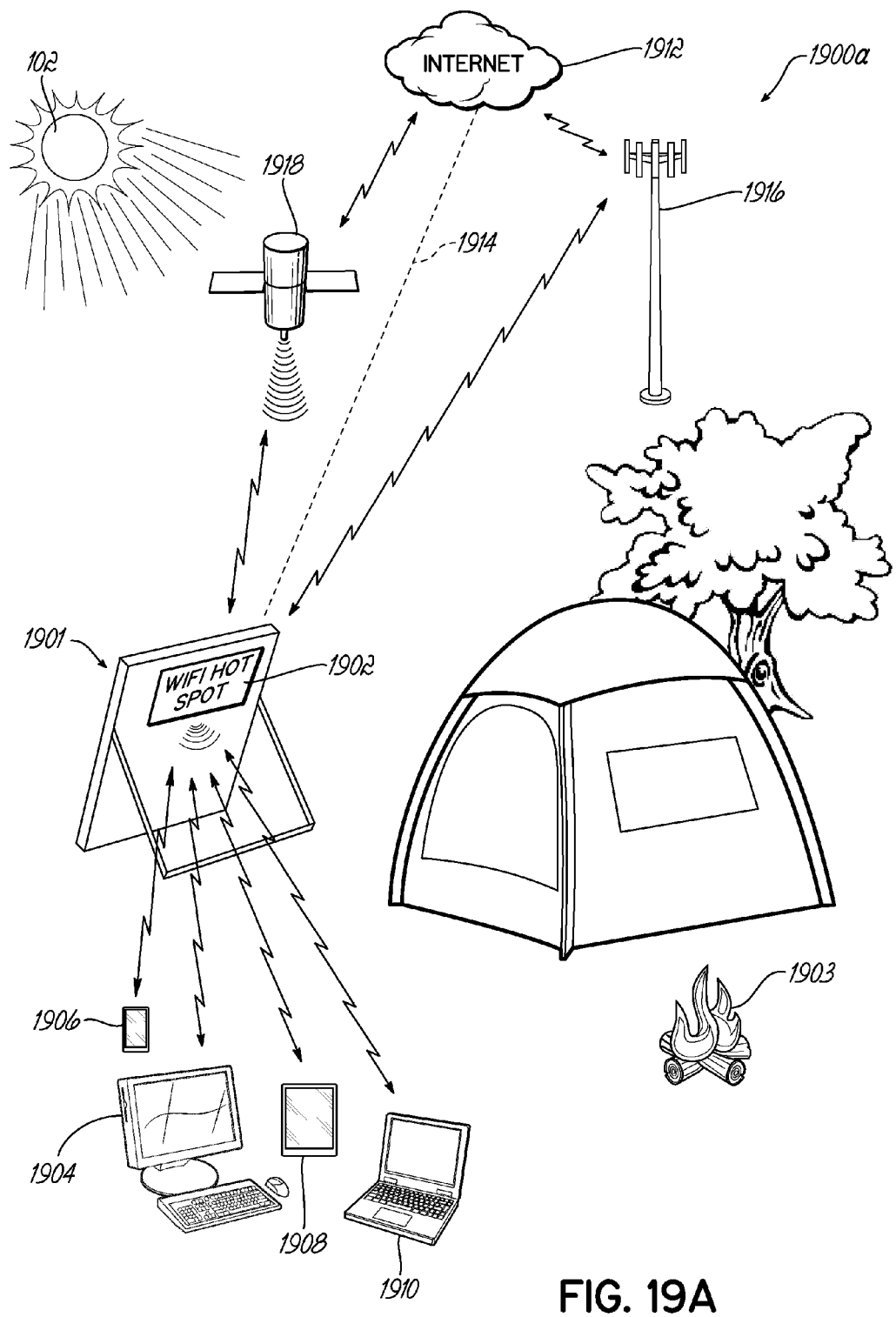
FIG. 19A illustrates an example of a mobile solar panel according to an exemplary embodiment of the present disclosure.

FIG. 19A shows an alternative embodiment of a solar panel configuration 1900*a* of the present invention. As shown in this embodiment, a mobile solar panel 1901 is illustrated as acting as a source of electrical generation from a solar source 102 while at the same time providing an internal WiFi hotspot 1902 for use in providing an access to the Internet 1912 to various digital components such as a cell phone 1906, a desktop computer 1904, a tablet 1908, or a laptop computer 1910. It should be appreciated that the mobile solar panel 1901, as illustrated in this figure, may have unique applicability in a deployed, camping, or other remote location that may not have access to a structure or other infrastructure such as might be available in a traditional domestic or other commercial applications. It should further be appreciated that the solar panel 1901 may be positioned, tilted, or otherwise oriented and moved throughout the day to achieve the best results from the available solar energy 102. This may be done through use of automated tilt or adjustment mechanisms, or may be manually positioned by a user. A solar panel 1901 that is equipped with internal GPS or other position locating circuitry, as well as access to the Internet 1912 via satellite phone or cellular connection, may use this data to optimize its position and time for collecting solar energy. It should further be appreciated that a remote location with solar panel 1901 may further be powered through the light and/or radiation that may admit from a campfire 1903. In other words, the solar panel 1901 is not necessarily confined to generating electricity for use in powering various devices in a remote location and or providing power to its own internal communication circuitry to only times when the sun 102 may be shining.

Figure 20:
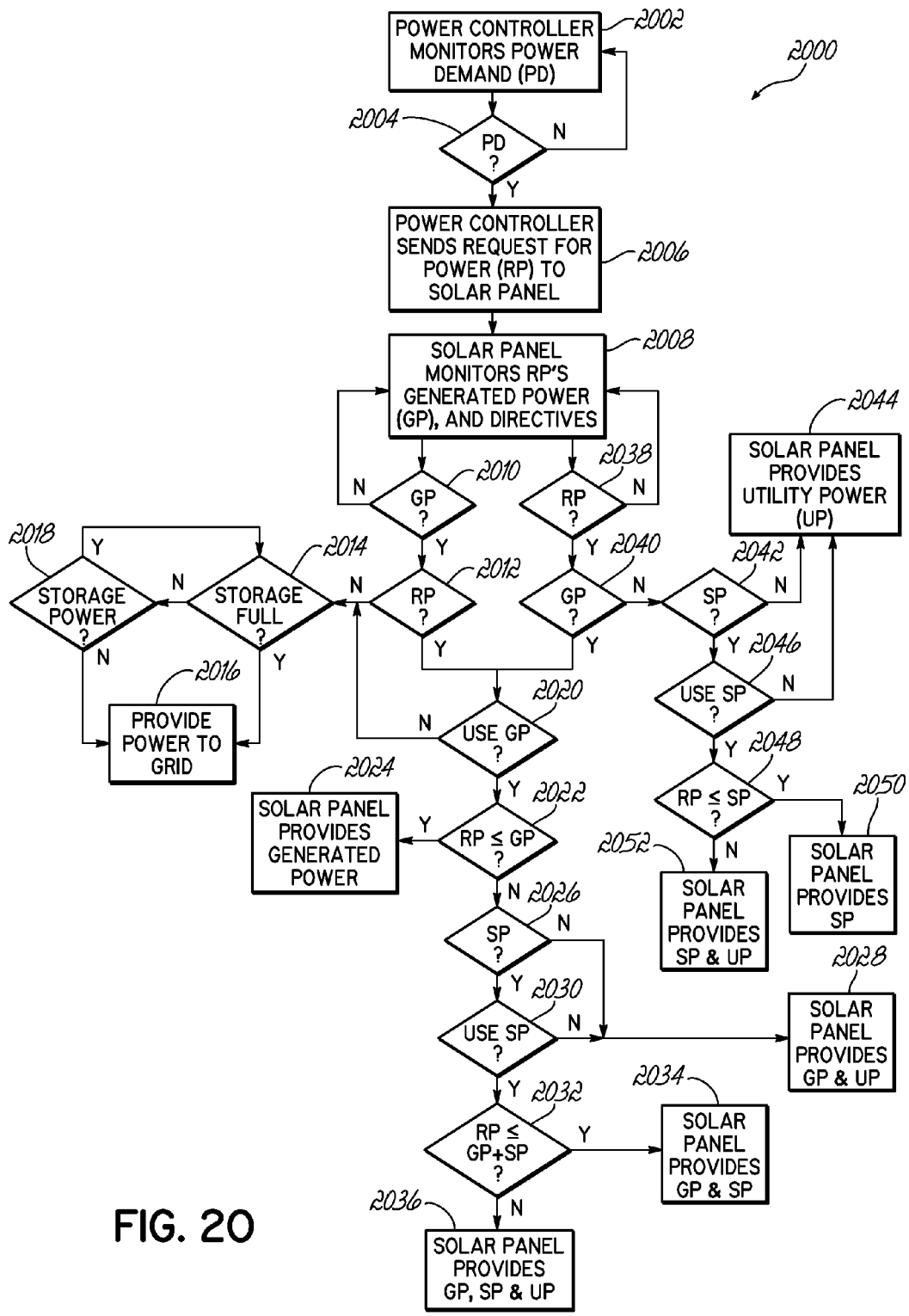
FIG. 20 is a flowchart of exemplary steps of the power allocation functions of the solar panel according to an exemplary embodiment of the present disclosure.

FIG. 20 further illustrates the operational control and power allocation flow chart 2000 by one or more solar panels 100(*a-n*). More specifically the power controllers 1502, 1602 continuously monitor the demand for power from the electrical devices connected to them [2002]. If there is no power demand ("PD"), e.g., the light switch is never turned on, the power controllers 1502, 1602 simply continue to monitor any demand for power. However, if there is a power demand [2004], the power controllers 1502, 1602 will send a message directly to the solar panel 100, or in alternative embodiments to the central hub 1512 [2006].

While the power controllers 1502, 1602 monitor the power demand, the solar panel 100, or in alternative embodiments, the central hub 1512, is also simultaneously monitoring not only whether the power controllers 1502, 1602 are sending any request for power to it [2006], but also, is monitoring whether the solar panel 100 is generating any power as well as any other directives that may be programmed or supplied dynamically by an individual [2008]. If there is no generated power ("GP"), the solar panel 100, or in alternative embodiments, the central hub 1512 will simply continue to monitor the solar arrays or photovoltaic solar power collectors 310 to see if and when any power might be collected and generated [2010]. In order to maximize the efficiency of this processing and monitoring step, the solar panel micro controller central computer 360 may be programmed or set or otherwise directed to, as appropriate, actively monitor solar energy production, passively monitor solar energy production, or all together shut down the monitoring completely. For example, during periods when it is known there will be no solar collections, such as during the night, the micro controller central computer 360 may instruct the solar panel 100 to cease monitoring operations all together until such time as when the sun will rise or another condition will warrant the potential monitoring of energy production. Other factors such as weather, cloud cover, precipitation, solar eclipses, and the like could all effect the likelihood and amount of power that might be generated at any particular time by the solar panel 100.

If however, there is a presence of generated power from the solar panel 100 [2010] then further inquiry is made as to whether there has been a request for power [2012]. If there has been no request for power, in other words, neither the outlet power controller 1502 nor the circuit breaker power controller 1602 has requested any power from the solar panel 100, the solar panel 100, or in alternative embodiments, the central hub 1512, then determines whether its power storage 320 is full [2014]. If the solar panel 100 batteries 320 are completely full, and again there is no need, demand, or request for power, then the solar panel 100 must provide this excess power to the grid 1408 [2016].

Providing power to the grid 1408 could be done in a number of ways. For example, it could be sold back to the local electric utility company grid 1408, or alternatively, it could be provided to a more localized electric grid. In other words, the excess power that is generated from the solar arrays on one home might be provided to another home in the same neighborhood or even in the same housing complex. As previously discussed, the present invention may be utilized not only on residential or domestic single family type units, but also on multifamily or other more commercial establishments. In such cases, one could contemplate that a landlord or building manager might be desirous of having power generated from one unit that is not being used, be provided to another unit for consumption and use on that property, as opposed to selling that excess electricity back to the power grid only to have to purchase power from the power grid to power a different unit.

If however, the battery bank 320 is not full [2014], the next decision that the solar panel 100, or in alternative embodiments, the central hub 1512, must evaluate is whether to store that power [2018]. If it is decided to store the power [2018], the solar panel 100, or central hub 1512, must continue to monitor the power storage capacity [2014]. For if that becomes full [2014], then that power must be provided to the grid 1408 [2016].

The decision on whether to store power 2018 may be determined by evaluating an plurality of factors. For example, even though the battery 320 may not be full, the time of day, i.e. peak rates for power on the market, might dictate that it would be economically advantageous to sell power to the grid at that time. Likewise, even if the battery 320 was not full, but there was no anticipated need for power in the near term, it might also be advantageous to sell power to the grid 1408. In other words, if a particular homeowner was on vacation and had no need to consume any power, even if the battery bank 320 was not full, there would be no reason to store power when it could be sold for peak dollar at particular times. The micro controller central computer 360 might be programmed or otherwise set to resume storing power so that the battery bank 320 would be fully charged upon the return of the homeowner.

Turning back to decision block 2012, if the solar panel 100 determines that there is a request for power the next question that must be determined is whether to use the generated power to meet that need for requested power [2020]. If the decision is not to use the generated power to meet the requested power needed, the next question that the solar panel 100, or central hub 1512, will again evaluate is whether the batter storage 320 is full [2014]. If it is not full, it must then determine whether to store that power [2018].

However, if the decision is to use the generated power [2014], the next question that must be evaluated is whether the requested power is less than or equal to the amount of the generated power [2022]. If the answer here is yes, the solar panel 100 then provides the generated power [2024] to power whatever devices are connected to the power controllers 1502, 1602 that have requested power. Also, to the extent the requested power is less than the generated power, the panel 100, or central hub 1512, will again need to determine whether to store the excess generated power [2018], or provided it to an outside utility or like power grid 1408 [2016]. Again, the questions that will need to be evaluated is whether the storage 320 of the solar panel 100 is full, i.e., whether the batteries 320 have any additional capacity for charging, and whether economic or other factors warrant the sale or otherwise distribution of any excess power.

If however, the requested power is not less than or equal to the generated power, the solar panel 100 or central hub 1512, must then evaluate if there is any stored power [2026]. If that question is answered in the negative, i.e., that the solar panel 100 does not have any stored power, then the solar panel 100 will provide all its generated power as well as supplementing whatever additional power is needed to power the various devices from the power it pulls off the utility grid, otherwise known herein as utility power ("UP") [2028].

If the solar panel 100 does have stored power [2026] the solar panel 100 or central hub 1512, must then determine whether to use that stored power [2030]. If it determines to not use that stored power, then the panel 100 will again provide the amount of power being generated it plus any additional power needed to meet the power demand from the utility grid [2028].

If however, the decision is to use the stored power the solar panel 100 or central hub 1512 must determine whether the requested power is less than or equal to the generated power plus the stored power [2032]. If the requested power is less than or equal to the generated power plus the stored power [2032], the solar panel 100 provides the generated power and the stored power to meet the request for power from the power controllers [2034]. However, if the requested power is greater than the generated power plus the stored power [2032], the solar panel 100 will provide the generated power, the stored power, and whatever additional power is needed to meet the request for power from the commercial utility power grid [2036].

As mentioned, the solar panel 100, or in alternative embodiments, the central hub 1512, continuously monitors the requests for power, the amount of power being generated, and any directives or instructions from a user [2008]. If again there is no request for power [2038], the solar panel 100 simply continues to monitor any messages from the power controllers 1502, 1602. If however, there is a request for power [2038], the solar panel 100 or central hub 1512 again asks whether there is any generated power present [2040]. If there is no generated power present, the solar panel 100 or central hub 1512 evaluates whether there is any stored power present [2042]. If there is no stored power present then the solar panel 100 provides power from the utility to meet the request for power needs from the power controllers [2044].

However, if there is stored power present [2044], the solar panel 100 or central hub 1512 then evaluates whether it should use that stored power [2046]. If the decision is made to not use the stored power [2046], the solar panel 100 provides utility power to meet the needs of the electrical devices connected to the power controllers 1502, 1602 [2044].

However, if the decision is made to use the stored power [2046], the solar panel 100 or central hub 1512 then evaluates whether the request for power is less than or equal to the stored power [2048]. If that question is answered in the affirmative, the solar panel 100 provides the stored power to power the devices connected to the power controllers 1502, 1602 to meet the request for power [2050]. If however, the request for power is greater than the stored power then the solar panel provides the stored power and whatever extra power from the utility to meet the request for power grid [2052]. Of course, if the request for power is less than the stored power, the balance of the stored power will simply remain stored in the battery bank 320 or like storage devices and only be used as needed by future requests for power.

As mentioned, the micro controller central computer 360 of a particular solar panel 100 and/or in alternative embodiments, the central communication and control hub 1512 continuously monitors requests for power from the power controllers 1502, 1602, the amount of power that is being generated from the photovoltaic solar power collectors, as well as any other directives or instructions [2008]. Those directives and instructions, can be preprogrammed, into the software and/or hardware configuration of the micro controller central computer 360, and/or may be dynamically provided by a user via a wireless communications protocol as discussed above. In other words, a user from a smart phone, can dynamically give instructions to use power from the solar panel 100 to power certain circuits. For example, an individual who is away on vacation may elect to completely power off his or her hot water heater 1428, but upon returning to home, may elect to instruct the solar panel 100 or central hub 1512 to now provide power to his or her water heater 1428 from generated solar power. The user can use an application on his or her smart phone or from an Internet website interface to monitor the amount of power that is being generated, the amount of power that is being consumed or requested, and allocate power accordingly. Hence, a user can optimize his power usage by determining when to sell power to the grid 1408, when to store power, what devices in his home or other structure is using power and from what source to power those devices, i.e., whether from the utility grid 1408, stored power, or power that is being contemporaneously generated by the solar panels 100(a-n).

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made without departing from the spirit and scope of the present disclosure. Thus the present disclosure should not be limited by any of the above-described exemplary embodiments, but should be defined only in accordance with the following claims and their equivalents.

What is claimed is:

1. A solar panel, comprising:
  a housing;
  an electric power generator positioned within the housing, the generator configured to collect energy from a light source and to convert the energy into direct current (DC) power;
  a current amplifier positioned within the housing and configured to amplify the DC power;
  a battery positioned within the housing and configured to store the amplified DC power;
  an alternating current (AC) inlet receptacle configured to receive input AC power generated from an AC power source external to the solar panel;
  a power signal sensor configured to detect when the input AC power is coupled to the AC inlet receptacle;
  a controller configured to automatically generate standalone output AC power for the solar panel when the input AC power is coupled to the AC inlet receptacle, wherein the standalone output AC power is output AC power generated from the DC power stored in the battery that is in parallel to the input AC power;
  an AC outlet receptacle configured to provide the standalone output AC power to systems external to the solar panel; and
  communication circuitry positioned within the housing for communication between:
    the solar panel and the Internet,
    the solar panel and a plurality of computing devices,
    the solar panel and a plurality of power controllers, and the
    solar panel and a second solar panel.

2. The solar panel of claim 1, wherein the communication circuitry provides for wireless communication.

3. The solar panel of claim 2, wherein the communication circuitry comprises a Wi-Fi hot spot.

4. The solar panel of claim 3, wherein the communication between the panel and the Internet is via a cellular phone network.

5. The solar panel of claim 4, wherein the communication between the panel and the Internet is via a satellite phone network.

6. A power distribution and communication system comprising:
  a plurality of solar panels having
    a housing, an electric power generator positioned within the housing, the generator configured to collect energy from a light source and to convert the energy into direct current (DC) power, a current amplifier positioned within the housing and configured to amplify the DC power, a battery positioned within the housing and configured to store the amplified DC power, an alternating current (AC) inlet receptacle configured to receive input AC power generated from an AC power source external to the solar panel, a power signal sensor configured to detect when the input AC power is coupled to the AC inlet receptacle, a controller configured to automatically generate standalone output AC power for the solar panel when the input AC power is coupled to the AC inlet receptacle, wherein the standalone output AC power is output AC power generated from the DC power stored in the battery that is in parallel to the input AC power, an AC outlet receptacle configured to provide the standalone output AC power to systems external to the solar panel, and communication circuitry positioned within the housing for communication between the plurality of solar panels;

wherein each solar panel is positioned within wireless communication range of at least one other solar panel such that the panels form a communication network.

7. The system of claim 6, wherein the communication network is a local area network.

8. The system of claim 7, wherein the communication network is connected to the Internet.

9. The system of claim 8, wherein the communication network is connected to the Internet via a cellular phone network.

10. The system of claim 9, wherein the communication network is connected to the Internet via a satellite phone network.

11. The system of claim 10, wherein the communication network provides for a plurality of Wi-Fi hot spots.

12. The system of claim 11 wherein power is allocated and distributed among the plurality of panels.

13. The system of claim 12 wherein power is distributed to an electric utility power grid.

14. A method of allocating power comprising:

providing a power controller adapted to provide an interface between an electric device and a source of electricity;

the power controller sensing the amount of power needed by the electric device;

providing a solar panel adapted to provide electricity;

the power controller communicating with the solar panel the amount of power needed by the electric device;

the solar panel providing the amount of power needed by the electric device to the electric device via the power controller;

wherein the power controller and the solar panel communicate wirelessly;

generating electrical power by the solar panel from a light source;

acquiring electrical power from an electric utility power grid; and storing electrical power in a battery housed in the solar panel.

15. The method of claim 14 further comprising the step of determining the amount of power being generated by the solar panel.

16. The method of claim 14 further comprising the step of determining the amount of power stored in the solar panel.

17. The method of claim 16 further comprising the step of determining how much power from the electric utility grid will be provided to the electric device.

18. The method of claim 14 wherein there is a plurality of electric devices and a plurality of power controllers.

19. The method of claim 18 wherein there is a plurality of solar panels.

* * * * *